United States Patent
Maehashi et al.

(10) Patent No.: US 9,438,234 B2
(45) Date of Patent: Sep. 6, 2016

(54) LOGIC CIRCUIT AND SEMICONDUCTOR DEVICE INCLUDING LOGIC CIRCUIT

(71) Applicant: Semiconductor Energy Laboratory Co., Ltd., Atsugi-shi, Kanagawa-ken (JP)

(72) Inventors: Yukio Maehashi, Kanagawa (JP); Wataru Uesugi, Kanagawa (JP)

(73) Assignee: Semiconductor Energy Laboratory Co., LTD., Kanagawa-ken (JP)

( * ) Notice: Subject to any disclaimer, the term of this patent is extended or adjusted under 35 U.S.C. 154(b) by 0 days.

(21) Appl. No.: 14/944,262

(22) Filed: Nov. 18, 2015

(65) Prior Publication Data
US 2016/0149573 A1    May 26, 2016

(30) Foreign Application Priority Data
Nov. 21, 2014  (JP) .................... 2014-236763

(51) Int. Cl.
*H03K 19/00*  (2006.01)
*H03K 3/356*  (2006.01)
(Continued)

(52) U.S. Cl.
CPC ........... *H03K 19/0013* (2013.01); *G11C 11/24* (2013.01); *G11C 11/34* (2013.01); *G11C 19/184* (2013.01); *G11C 19/28* (2013.01);
(Continued)

(58) Field of Classification Search
CPC ............. H03K 19/173; H03K 19/177; H03K 19/0013; H03K 3/356156; H03K 3/356104; H03K 19/01855; H03K 3/35625; H03K 5/2445; H03K 5/2454; G11C 19/28; G11C 19/184; G11C 11/24; G11C 11/34; H01L 29/7869
See application file for complete search history.

(56) References Cited

U.S. PATENT DOCUMENTS 4,653,027 A * 3/1987 Baba .................... G11C 7/1006
                                                        365/189.05
5,731,856 A   3/1998 Kim et al.
(Continued)

FOREIGN PATENT DOCUMENTS

EP    1737044 A   12/2006
EP    2226847 A   9/2010
(Continued)

OTHER PUBLICATIONS

Teh, Chen Kong, et al. "A 77% energy-saving 22-transistor single-phase-clocking D-flip-flop with adaptive-coupling configuration in 40nm CMOS." Solid-State Circuits Conference Digest of Technical Papers (ISSCC), 2011 IEEE International. IEEE, 2011, pp. 338-340.
(Continued)

*Primary Examiner* — Vibol Tan
(74) *Attorney, Agent, or Firm* — Nixon Peabody LLP; Jeffrey L. Costellia

(57) ABSTRACT

A logic circuit that can retain a state even without power supply is provided. The logic circuit includes a first circuit, a pair of retention circuits, and a second circuit. The pair of retention circuits includes two switches electrically connected to each other in series and a capacitor electrically connected to a connection portion of the two switches. Each of the two switches is formed using an oxide semiconductor transistor. The first circuit has a function of generating complementary data from a piece of input data. The pair of retention circuits retains the complementary data. The second circuit has a function of amplifying the complementary data retained in the pair of retention circuits.

20 Claims, 24 Drawing Sheets

(51) Int. Cl.

| | | |
|---|---|---|
| *H03K 19/173* | (2006.01) | |
| *H03K 19/177* | (2006.01) | |
| *H03K 19/0185* | (2006.01) | |
| *H03K 3/3562* | (2006.01) | |
| *G11C 19/28* | (2006.01) | |
| *G11C 19/18* | (2006.01) | |
| *G11C 11/24* | (2006.01) | |
| *G11C 11/34* | (2006.01) | |

(52) U.S. Cl.
CPC .... *H03K3/35625* (2013.01); *H03K 3/356104* (2013.01); *H03K 3/356156* (2013.01); *H03K 19/01855* (2013.01); *H03K 19/173* (2013.01); *H03K 19/177* (2013.01)

(56) References Cited

U.S. PATENT DOCUMENTS

| | | | |
|---|---|---|---|
| 5,744,864 A | 4/1998 | Cillessen et al. | |
| 6,294,274 B1 | 9/2001 | Kawazoe et al. | |
| 6,469,546 B2* | 10/2002 | Matano | G11C 7/065 327/51 |
| 6,563,174 B2 | 5/2003 | Kawasaki et al. | |
| 6,727,522 B1 | 4/2004 | Kawasaki et al. | |
| 6,781,915 B2* | 8/2004 | Arimoto | G11C 7/18 257/E27.084 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,102,935 B2* | 9/2006 | Miki | G11C 11/4074 365/189.05 |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,859,138 B2* | 12/2010 | Iwabuchi | H02M 7/538 307/412 |
| 8,705,267 B2* | 4/2014 | Endo | H03K 3/356008 365/149 |
| 8,824,193 B2* | 9/2014 | Yoneda | G11C 19/184 365/149 |
| 8,836,401 B2* | 9/2014 | Kim | H03K 3/012 327/208 |
| 8,891,286 B2* | 11/2014 | Endo | H03K 3/356008 365/149 |
| 8,981,827 B2* | 3/2015 | Kim | H03K 3/012 327/206 |
| 9,041,449 B2* | 5/2015 | Yoneda | H03K 3/356008 327/208 |
| 9,130,555 B2* | 9/2015 | Tanabe | H03K 3/012 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2013/0141157 A1 | 6/2013 | Takemura | |
| 2014/0266367 A1 | 9/2014 | Uesugi | |
| 2015/0061742 A1 | 3/2015 | Maehashi et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |

(56) References Cited

FOREIGN PATENT DOCUMENTS

| | | |
|---|---|---|
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Tamura, Hikaru, et al. "Embedded SRAM and Cortex-M0 core with backup circuits using a 60-nm crystalline oxide semiconductor for power gating." COOL Chips XVII, 2014 IEEE. IEEE, 2014.

Khanna, Saarthak, et al. "An FRAM-Based Nonvolatile Logic MCU SoC Exhibiting 100% Digital State Retention at 0 V Achieving Zero Leakage With 400-ns Wakeup Time for ULP Applications." Solid-State Circuits, IEEE Journal of 49.1 (2014): 95-106.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YBFe2O4, and YB2Fe3O7 Types of Structures for Compounds in the In2O3 and Sc2O3-A2O3—BO Systems [A; Fe, Ga, or Al; B: Mg, Mn, Fe, Ni, Cu, or Zn] at Temperatures over 1000° C", Journal of Solid State Chemistry, 1985, vol. 60, pp. 382-384.

Nakamura.M et al., "The phase relations in the In2O3-Ga2ZnO4—ZnO system at 1350° C", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 991-916.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above—Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letter), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg—Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of Interntional Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED ", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 1722.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In-Ga-Zn-Oxide TFTS", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID Internaional Symposium Digest of Technical Papers, May 31, 2009, pp. 191-193.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest ': SID International Symposium Digest of Technical Papers, May 31, 2009, pp. 184-187.

(56) References Cited

OTHER PUBLICATIONS

Ohara.H et al., "21.3:4.0 In. QVGA AMOLED Display Using In—Ga—Zn—Oxide TFTS With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Techical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letter), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium—Gallium—Zinc Oxide Semiconductor upon exposure to water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letter) , Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

\* cited by examiner

11

12

13

LOGIC CIRCUIT AND SEMICONDUCTOR DEVICE INCLUDING LOGIC CIRCUIT

BACKGROUND OF THE INVENTION

1. Field of the Invention

The specification, the drawings, and the claims of the present invention (hereinafter referred to as "this specification and the like") disclose a logic circuit, a retention circuit, a storage circuit, a processing unit, another semiconductor device, a driving method thereof, a manufacturing method thereof, and the like. The technical field of one embodiment of the present invention is not limited to the above technical field. For example, one embodiment of the present invention relates to an imaging device, a display device, a light-emitting device, an electric storage device, a driving method thereof, or a manufacturing method thereof.

2. Description of the Related Art

The reduction in power consumption of electronic devices has been highly required. Thus, the reduction in power consumption of integrated circuits (IC) such as CPUs is a major challenge in circuit design. The power consumption of ICs is broadly classified into operating power consumption (dynamic power) and non-operating (standby) power consumption (static power). Dynamic power increases when operating frequency increases for high performance. Static power is power consumed mostly by the leakage current of transistors. Examples of leakage current include subthreshold leakage current, gate tunnel leakage current, gate-induced drain leakage (GIDL) current, and junction tunnel leakage current. These leakage currents increase in accordance with scaling down of transistors. The increase in demand for reduction in power consumption of ICs is a large barrier to high performance and high integration. Thus, a technique for achieving both the reduction in power consumption and high performance or high integration has been considered.

In order to reduce the power consumption of a semiconductor device, circuits that do not need to operate are stopped by power gating or clock gating. A flip-flop (FF) is a logic circuit included a lot in a semiconductor device that stores data temporarily. Thus, the reduction in power consumption of the FF leads to the reduction in power consumption of a semiconductor device including the FF. When a general FF is powered off, data retained therein is lost.

For example, Non-Patent Document 1 discloses an FF with a smaller number of transistors operated by input of clock signals. Dynamic power that is consumed by input of clock signals is reduced. For example, in Non-Patent Document 2, a ferroelectric memory-based nonvolatile logic circuit for data backup of the FF is provided to perform power gating. Standby leakage current can be made almost zero when power supply is stopped by power gating.

By taking advantage of extremely low off-state current of a transistor whose active layer is formed using an oxide semiconductor (hereinafter, such a transistor may be referred to as an oxide semiconductor transistor or an OS transistor), a retention circuit capable of retaining data even when powered off has been proposed. Non-Patent Document 3 discloses power gating of a processor by using a retention circuit that includes an OS transistor for each of an FF and an SRAM, for example.

REFERENCES

Non-Patent Documents

Non-Patent Document 1: C. K. Teh et al., "A 77% Energy-Saving 22-Transistor Single-Phase-Clocking D-Flip-Flop with Adaptive-Coupling Configuration in 40 nm CMOS," ISSCC Dig. Tech. Papers, February 2011, pp. 338-340.

Non-Patent Document 2: S. Khanna et al., "An FRAM-Based Nonvolatile Logic MCU SoC Exhibiting 100% Digital State Retention at VDD=0V Achieving Zero Leakage With 400-ns Wakeup Time for ULP Applications," IEEE Journal of Solid-State Circuits, vol. 49, no. 1, January 2014, pp. 95-106.

Non-Patent Document 3: H. Tamura et al., "Embedded SRAM and Cortex-M0 Core with Backup Circuits Using a 60-nm Crystalline Oxide Semiconductor for Power Gating," IEEE COOL Chips XVII, April 2014.

SUMMARY OF THE INVENTION

An object of one embodiment of the present invention is to provide a novel semiconductor device or a novel method for driving the semiconductor device. Another object of one embodiment of the present invention is, for example, to perform power gating, to perform data retention even without power supply, to reduce power consumption, to reduce the number of elements, to reduce size, to stop power supply without performing data backup operation, or to return from a power-off state to a normal operating state without performing data restore operation.

The description of a plurality of objects does not disturb the existence of each object. One embodiment of the present invention does not necessarily achieve all the objects described above and only needs to achieve at least one of the objects. Other objects will be apparent from the description of this specification and the like, and such objects could be objects of one embodiment of the present invention.

A first embodiment of the present invention is a logic circuit that includes a first circuit, a pair of retention circuits, and a second circuit. The pair of retention circuits includes two switches electrically connected to each other in series and a capacitor electrically connected to a connection portion of the two switches. Each of the two switches is formed using a transistor whose active layer includes an oxide semiconductor. The first circuit has a function of generating complementary data from a piece of input data. The pair of retention circuits retains the complementary data. The complementary data retained in the pair of retention circuits is amplified by the second circuit.

A second embodiment of the present invention is a logic circuit that includes a first circuit, a pair of first retention circuits, and a second circuit. The first circuit includes a first input node, a first output node, and a second output node. The pair of first retention circuits includes a first transistor, a second transistor, a first capacitor, a first node, a second input node, and a third output node. The second circuit includes a third input node, a fourth input node, a fourth output node, and a fifth output node. The first circuit has a function of generating first complementary data from input data of the first input node. A piece of the first complementary data whose logic is the same as logic of the first input node is output from the first output node. The other piece of the first complementary data is output from the second output node. In the pair of retention circuits, the first capacitor is electrically connected to the first node. An active layer of each of the first transistor and the second transistor includes an oxide semiconductor. The first transistor has a function of controlling conduction between the first node and the second input node. The second transistor has a function of controlling conduction between the first node and the third output node. A first clock signal is input to a gate of the first transistor. A second clock signal is input to a gate of the second transistor. Logic of the first clock signal is opposite to logic of the second clock signal. The second input node of one first retention circuit is electrically connected to the first output node. The third output node of the one first retention circuit is electrically connected to the third input node. The second input node of the other first retention circuit is electrically connected to the second output node. The third output node of the other first retention circuit is electrically connected to the fourth input node. The second circuit has a function of amplifying voltage between the third input node and the fourth input node and generating second complementary data. A piece of the second complementary data is output from the fourth output node. The other piece of the second complementary data is output from the fifth output node.

In the second embodiment, the second circuit may further include a first n-channel transistor, a second n-channel transistor, a first p-channel transistor, and a second p-channel transistor. A drain of the first n-channel transistor and a drain of the first p-channel transistor are electrically connected to each other. A drain of the second n-channel transistor and a drain of the second p-channel transistor are electrically connected to each other. A first potential is input to a source of the first n-channel transistor and a source of the second n-channel transistor. A second potential is input to a source of the first p-channel transistor and a source of the second p-channel transistor. The third input node is electrically connected to a gate of the first n-channel transistor. The fourth input node is electrically connected to a gate of the second n-channel transistor. The fourth output node is electrically connected to a gate of the first p-channel transistor and the drain of the second p-channel transistor. The fifth output node is electrically connected to a gate of the second p-channel transistor and the drain of the first p-channel transistor.

One embodiment of the present invention can provide a novel semiconductor device or a novel method for operating the semiconductor device. Alternatively, one embodiment of the present invention enables power gating, enables data retention even without power supply, can reduce power consumption, can reduce the number of elements, can reduce the size of a semiconductor device, can stop power supply without performing data backup operation, or can return from a power-off state to a normal operating state without performing data restore operation.

The description of the plurality of effects does not disturb the existence of other effects. In one embodiment of the present invention, there is no need to obtain all the effects described above. In one embodiment of the present invention, other objects, effects, and novel features will be apparent from the description of the specification and the drawings.

DETAILED DESCRIPTION OF THE INVENTION

Figure 1:
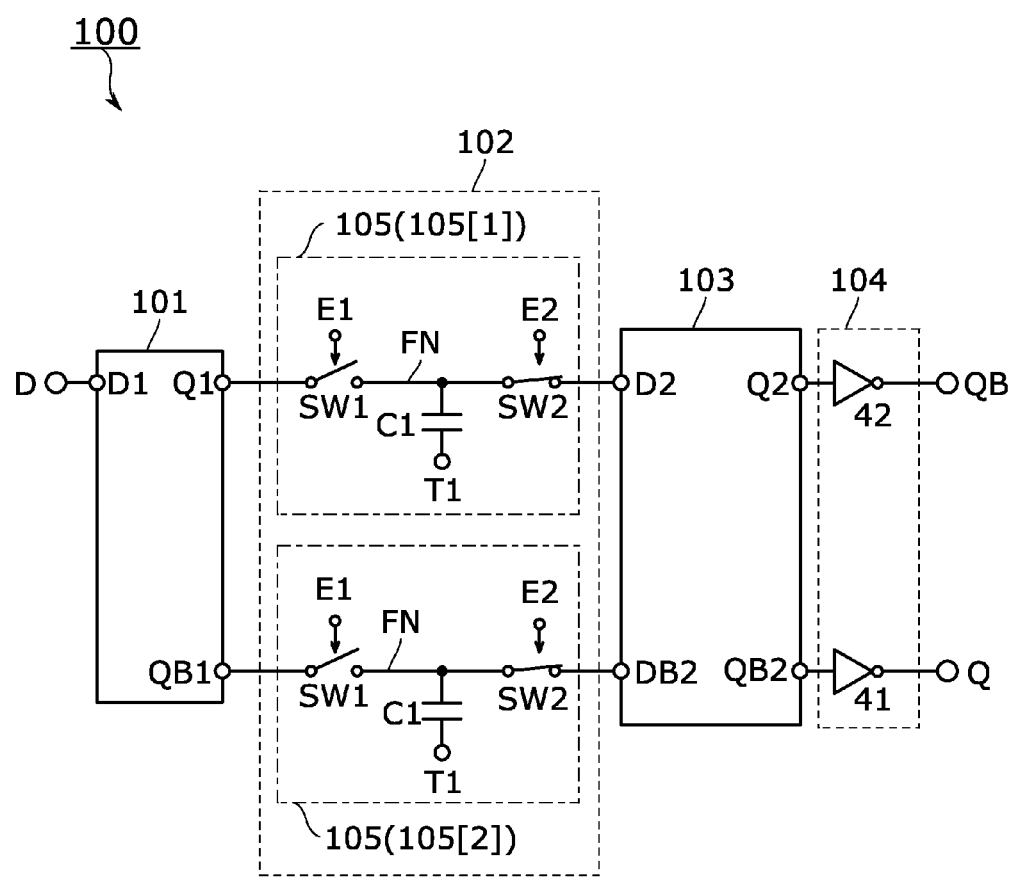
FIG. 1 is a circuit diagram illustrating a structure example of a logic circuit.

In this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit, a chip including an integrated circuit, and an electronic component including a chip in a package are examples of semiconductor devices. Moreover, a storage device, a display device, a light-emitting device, a lighting device, an electronic device, and the like themselves might be semiconductor devices, or might each include a semiconductor device.

In this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts. Each of X and Y denotes an object (e.g., a device, an element, a circuit, a wiring, an electrode, a terminal, a conductive film, or a layer).

A transistor is an element having three terminals: a gate, a source, and a drain. The gate functions as a control node for controlling conduction of the transistor. Depending on the type of the transistor or levels of potentials applied to the terminals, one of two input/output terminals functions as a source and the other functions as a drain. Therefore, the terms "source" and "drain" can be interchanged with each other in this specification and the like. In this specification and the like, two terminals except a gate are referred to as a first terminal and a second terminal in some cases.

A node can be referred to as a terminal, a wiring, an electrode, a conductive layer, a conductor, an impurity region, or the like depending on a circuit structure, a device structure, and the like. Furthermore, a terminal, a wiring, or the like can be referred to as a node.

Note that voltage refers to a potential difference between a given potential and a reference potential (e.g., a ground potential (GND) or a source potential) in many cases. Voltage can be referred to as a potential. Note that a potential has a relative value. Accordingly, a ground potential does not necessarily mean 0 V.

In this specification and the like, the terms "film" and "layer" can be interchanged with each other depending on circumstances or conditions. For example, the term "conductive layer" can be changed into the term "conductive film" in some cases. The term "insulating film" can be changed into the term "insulating layer" in some cases, for example.

In this specification and the like, ordinal numbers such as "first," "second," and "third" are used to show the order in some cases. Alternatively, ordinal numbers such as "first," "second," and "third" are used to avoid confusion among components in some cases, and do not limit the number of components or do not limit the order. For example, it is possible to replace the term "first" with the term "second" or "third" in describing one embodiment of the present invention.

In this specification and the like, a clock signal CLK is abbreviated to "a signal CLK," "CLK," or the like in some cases. The same applies to other components (e.g., signals, voltages, potentials, circuits, elements, electrodes, and wirings).

In the drawings, the size, the layer thickness, or the region is exaggerated for clarity in some cases. Thus, embodiments of the present invention are not limited to such scales. Note that the drawings are schematic views showing ideal examples, and embodiments of the present invention are not limited to shapes or values shown in the drawings. For example, the following can be included: variation in signal, voltage, or current due to noise or difference in timing.

In this specification, terms for describing arrangement, such as "over" and "under," are used for convenience for describing the positional relationship between components with reference to drawings in some cases. Furthermore, the positional relationship between components is changed as appropriate in accordance with a direction in which each component is described. Thus, there is no limitation on terms used in this specification, and description can be made appropriately depending on the situation.

The positional relationship of circuit blocks in a block diagram is specified for description. Even in the case where a block diagram shows that different functions are achieved by different circuit blocks, one circuit block might be actually configured to achieve different functions. The functions of circuit blocks are specified for description. Even in the case where one circuit block is illustrated, blocks might be provided in an actual circuit block so that processing performed by one circuit block is performed by a plurality of circuit blocks.

Embodiments of the present invention will be described below. Note that any of the embodiments can be combined as appropriate. In addition, in the case where a plurality of structure examples (including operation examples and manufacturing method examples) are given in one embodiment, any of the structure examples can be combined as appropriate. The present invention can be implemented in various different modes, and it will be readily appreciated by those skilled in the art that modes and details of the present invention can be modified in various ways without departing from the spirit and scope of the present invention. The present invention therefore should not be construed as being limited to the following description of the embodiments.

(Embodiment 1)

<<Logic Circuit>>

FIG. 1 illustrates a structure example of a logic circuit. A logic circuit 100 in FIG. 1 includes a node D, a node Q, a node QB, a circuit 101, a circuit 102, a circuit 103, and a circuit 104.

The logic circuit 100 is a semiconductor device capable of retaining data (state). Depending on a circuit structure or the like, the logic circuit 100 can also be referred to as a sequential circuit. The logic circuit 100 has a function of generating complementary data from input data of the node D. The complementary data is output from the nodes Q and QB. The node Q is an output node for outputting data whose logic is the same as that of the node D. The node QB is an inversion output node for outputting data whose logic is inverted from that of the node D. The logic circuit 100 may include only one of the nodes Q and QB. Note that the complementary data is constituted of data whose logic is "1" and data whose logic is "0." In addition, the complementary data may be read as a complementary signal. The complementary signal is constituted of a high-level potential ("H") signal and a low-level potential ("L") signal.

<Circuit 101>

The circuit 101 includes nodes D1, Q1, and QB1. The circuit 101 is an input stage of the logic circuit 100, and the node D1 is electrically connected to the node D. The circuit 101 is a logic circuit that has a function of generating complementary data from data input from the node D1. The node Q1 is a terminal for outputting data whose logic is the same as that of the node D1. The node QB1 is an inversion output terminal for outputting data whose logic is inverted from that of the node D1.

<Circuit 102>

The circuit 102 has a function of retaining complementary data output from the circuit 101. The circuit 102 includes a pair of retention circuits 105 (105[1] and 105[2]). The retention circuit 105[1] is electrically connected to the node Q1, and the retention circuit 105[2] is electrically connected to the node QB1. Data output from the node Q1 is retained in the retention circuit 105[1], and data output from the node QB1 is retained in the retention circuit 105[2].

The retention circuit 105 includes a switch SW1, a switch SW2, a capacitor C1, a node FN, and a node T1. Signals E1 and E2 are input to the retention circuit 105. The node FN is a data retention node of the retention circuit 105 that can be set in an electrically floating state. The capacitor C1 is electrically connected to the node FN and the node T1. The capacitor C1 is a storage capacitor that holds the potential of the node FN. A signal or a fixed potential can be input to the node T1. For example, a low power supply potential of the logic circuit 100 can be input to the node T1. The switches SW1 and SW2 are electrically connected to each other in series. The switch SW1 controls conduction between an input terminal of the retention circuit 105 and the node FN. The switch SW2 controls conduction between the node FN and an output terminal of the retention circuit 105. The signal E1 is a control signal of the switch SW1, and the signal E2 is a control signal of the switch SW2.

In a standby state, the circuit 102 functions as a backup circuit for retaining data (state) of the logic circuit 100. In the standby state, the switches SW1 and SW2 are off and the node FN is in an electrically floating state. The standby state refers to a state in which the supply of a clock signal or the supply of power is stopped. In other words, the standby state refers to a state in which a semiconductor device is in a power-saving or power-off state so that normal operation cannot be performed.

In a normal operating state, the circuit 102 functions as a latch circuit that stores complementary data generated in the circuit 101. For example, the switches SW1 and SW2 are turned on and off by the signals E1 and E2 in a complementary manner. In other words, the switch SW2 is turned off when the switch SW1 is on, and the switch SW2 is turned on when the switch SW1 is off. Alternatively, the switch SW2 may be always on without switching operation, and the switch SW1 may be turned on and off.

The retention circuit 105 may have retention characteristics such that data can be retained during a standby period. To retain data in the retention circuit 105 for a long time, a potential change (in particular, a potential drop) of the electrically floating node FN is preferably reduced as much as possible. A means for achieving this is to use a transistor with extremely low drain current in an off state (off-state current) as each of the switches SW1 and SW2.

To reduce off-state current of a transistor, a semiconductor region (active layer) contains a semiconductor with a wide energy gap, for example. The energy gap of the semiconductor is preferably greater than or equal to 2.5 eV, greater than or equal to 2.7 eV, or greater than or equal to 3 eV. An example of such a semiconductor is an oxide semiconductor. The switches SW1 and SW2 are each a transistor (OS transistor) whose semiconductor region contains an oxide semiconductor, for example. The leakage current of an OS transistor normalized by channel width can be, for example, lower than or equal to $10 \times 10^{-21}$ A/μm (10 zA/μm) with a source-drain voltage of 10 V at room temperature (approximately 25° C.). It is preferable that the leakage current of the OS transistor used as each of the switches SW1 and SW2 be lower than or equal to $1 \times 10^{-18}$ A, lower than or equal to $1 \times 10^{-21}$ A, or lower than or equal to $1 \times 10^{-24}$ A at room temperature (approximately 25° C.). Alternatively, the leakage current is preferably lower than or equal to $1 \times 10^{-15}$ A, lower than or equal to $1 \times 10^{-18}$ A, or lower than or equal to $1 \times 10^{-21}$ A at 85° C.

Avalanche breakdown or the like is less likely to occur in some cases in an OS transistor than in a general transistor including silicon or the like because an oxide semiconductor has a wide energy gap and thus electrons are less likely to be excited, and the effective mass of a hole is large. Since hot-carrier degradation or the like due to the avalanche breakdown is inhibited, the OS transistor has high drain withstand voltage and can be driven at high drain voltage. Accordingly, the use of the OS transistor in the retention circuit 105 can leave a wide margin for driving conditions such as the potential level of a signal and input timing. The retention circuit 105 can be driven such that the potential of the node FN is high when data is retained, for example.

The active layer of the OS transistor preferably includes an oxide containing one or more elements selected from In, Ga, Sn, and Zn as a constituent element. As such an oxide, an In—Sn—Ga—Zn oxide, an In—Ga—Zn oxide, an In—Sn—Zn oxide, an In—Al—Zn oxide, a Sn—Ga—Zn oxide, an Al—Ga—Zn oxide, a Sn—Al—Zn oxide, an In—Zn oxide, a Sn—Zn oxide, an Al—Zn oxide, a Zn—Mg oxide, a Sn—Mg oxide, an In—Mg oxide, an In—Ga oxide, an In oxide, a Sn oxide, a Zn oxide, or the like can be used. In addition, the oxide may contain an element or a compound other than the constituent elements of the oxide, for example, an oxide semiconductor containing $SiO_2$.

Furthermore, a short-channel effect is not likely to be caused because the active layer of the OS transistor includes an oxide semiconductor, which has a wide bandgap. Furthermore, the OS transistor can have excellent off-state current characteristics and subthreshold characteristics even with a thick gate insulating layer with an equivalent oxide thickness of, for example, greater than or equal to 11 nm and less than or equal to 15 nm, and a short channel length of, for example, greater than or equal to 20 nm and less than or equal to 60 nm. Since a gate insulating layer in the OS transistor can be thicker than that in a Si transistor generally used in a logic circuit, leakage current through the gate insulating layer can be reduced and variation in electrical characteristics due to variation in the thickness of the gate insulating layer can be suppressed. The details of the OS transistor will be described in Embodiment 4.

There is no particular limitation on transistors included in the circuits 101, 103, and 104, and general transistors can be used. For example, a transistor whose active layer contains a Group 14 element (Si, Ge, or C) can be used. A typical example of the transistors is a transistor (Si transistor) whose active layer contains silicon. For the purpose of improving the mobility of the Si transistor or for other purposes, a distortion transistor where Ge is added to an active layer containing Si may be used. In the circuits 101, 103, and 104, high-voltage transistors may be used as transistors to which a high potential is applied. When the transistors are n-channel transistors, the transistors may be OS transistors.

<Circuit 103>

The circuit 103 includes a node D2, a node DB2, a node Q2, and a node QB2. The circuit 103 has a function of amplifying complementary data output from the circuit 102. Alternatively, the circuit 103 has a function of retaining complementary data output from the circuit 102. Alternatively, the circuit 103 has a function of outputting data whose logic is the same as that of the node D2 from the node Q2 and outputting data whose logic is the same as that of the node DB2 from the node QB2. In the logic circuit 100, the circuits 102 and 103 each have a data (state) retention function.

<Circuit 104>

The circuit 104 is an output stage of the logic circuit 100. The circuit 104 has a function of shaping the waveform of output data of the circuit 103. The circuit 104 includes inverters (INV) 41 and 42. An input node of the INV 41 is electrically connected to the node QB2, and an output node of the INV 41 is electrically connected to the node Q. An input node of the INV 42 is electrically connected to the node Q2, and an output node of the INV 42 is electrically connected to the node QB.

In order to secure complementarity of data output from the nodes Q2 and QB2, the circuit 104 preferably has a circuit structure in which the load on the node Q2 is equal to the load on the node QB2. Thus, in the case where the logic circuit 100 does not include the node QB, it is preferable to electrically connect a load equivalent to the load on the INV 42 to the node Q2. Furthermore, in the case where the logic circuit 100 does not include the circuit 104, the node Q2 is electrically connected to the node Q, and the node QB2 is electrically connected to the node QB.

The logic circuit 100 is a circuit capable of clock gating and power gating. The circuits 101, 103, and 104 are powered off by power gating. During a period of clock gating and power gating, the circuit 102 retains the state of the logic circuit 100.

For example, the logic circuit 100 can be mounted as a flip-flop (FF) on a semiconductor device. When the logic circuit 100 is provided in a register of a processor such as a central processing unit (CPU) or a graphics processing unit (GPU), the processor can be power gated. Even when power supply is stopped, the processor can retain a state immediately before power-off. The state of the processor can be returned immediately after power-on.

Examples of a specific circuit structure and driving method of the logic circuit 100 are described below with reference to FIG. 2, FIGS. 3A to 3C, FIGS. 4A and 4B, FIG. 5, FIG. 6, FIG. 7, FIG. 8, FIG. 9, FIGS. 10A and 10B, FIG. 11, FIG. 12, FIG. 13, FIG. 14, and FIG. 15.

<<Logic Circuit 110>>

Figure 2:
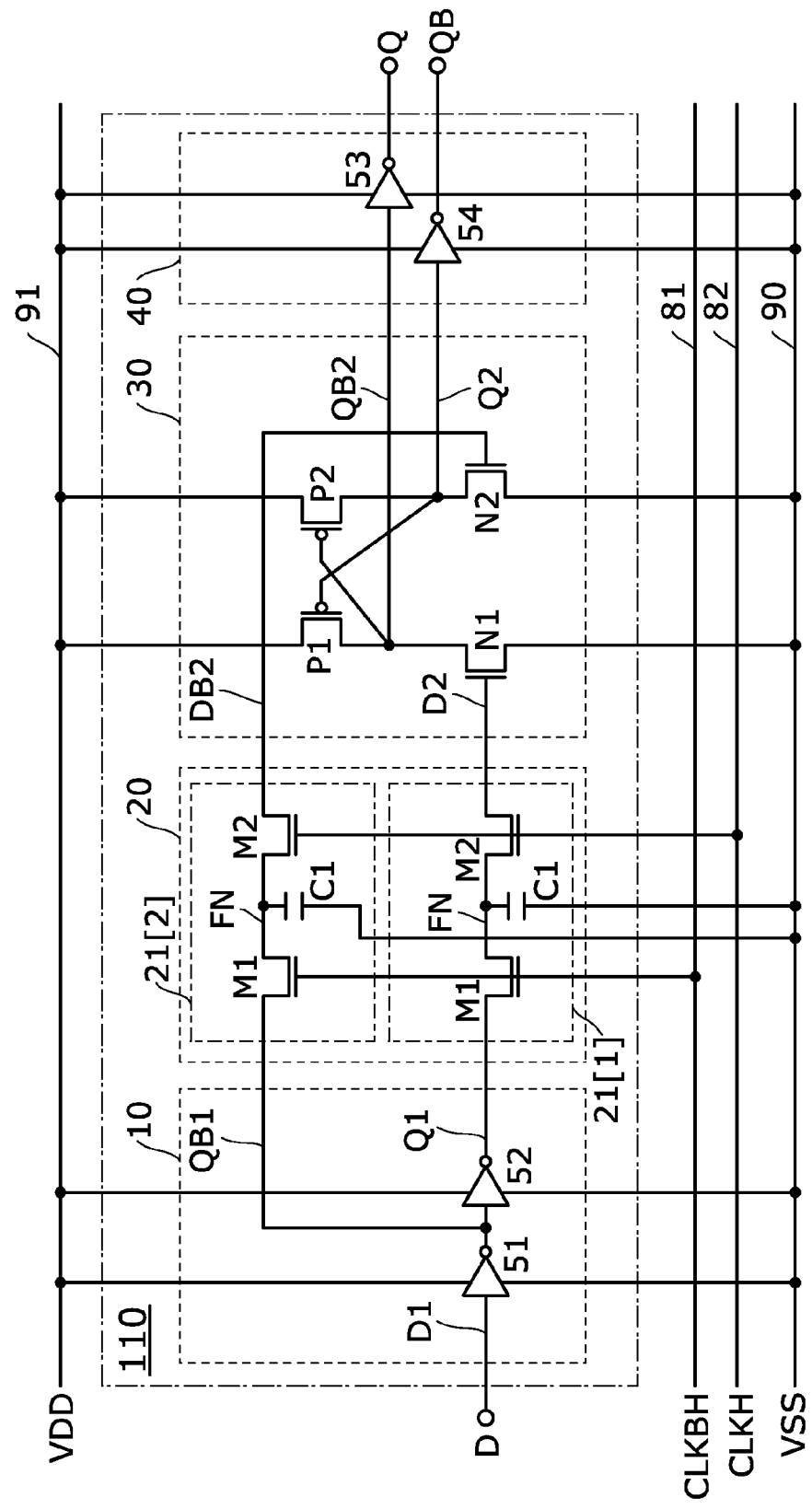
FIG. 2 is a circuit diagram illustrating a structure example of a logic circuit.

A logic circuit 110 in FIG. 2 includes the node D, the node Q, the node QB, a circuit 10, a circuit 20, a circuit 30, and a circuit 40. The circuits 10, 20, 30, and 40 correspond to the circuits 101, 102, 103, and 104 (FIG. 1), respectively. The logic circuit 110 is electrically connected to wirings 81, 82, 90, and 91.

CLKBH is input to the wiring 81, and CLKH is input to the wiring 82. CLKH and CLKBH are control signals (e.g., clock signals), and CLKBH is an inverted signal of CLKH. The wiring 90 is a power supply line to which VSS is input, and the wiring 91 is a power supply line to which VDD is input. VDD is a high power supply potential and VSS is a low power supply potential, where VDD>VSS. In the following description, the wiring 90 is referred to as a VSS line, and the wiring 91 is referred to as a VDD line.

<Circuit 10>

The circuit 10 is an input stage of the logic circuit 110. The circuit 10 includes INVs 51 and 52. The INVs 51 and 52 are electrically connected to each other in series and are also electrically connected to the VDD line and the VSS line. An input node of the INV 51 is electrically connected to the node D1, and an output node of the INV 51 is electrically connected to the node DB1. An output node of the INV 52 is electrically connected to the node Q1.

Figure 3A:
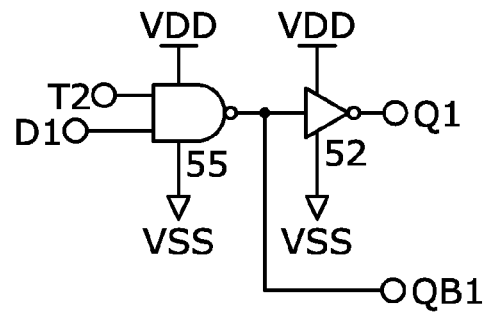
FIGS. 3A to 3C are circuit diagrams each illustrating a structure example of a circuit.
Figure 3B:
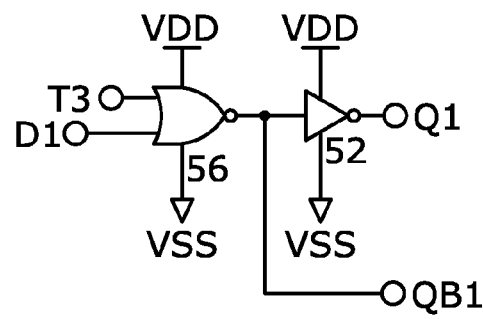
Figure 3C:
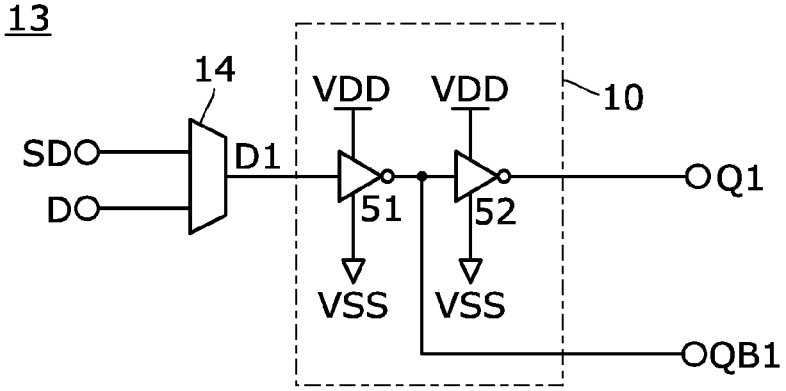

FIGS. 3A to 3C illustrate other structure examples of an input stage. A circuit 11 in FIG. 3A includes the INV 52 and a NAND circuit (NAND) 55. A circuit 12 in FIG. 3B includes the INV 52 and a NOR circuit (NOR) 56. A circuit 13 in FIG. 3C includes a selection circuit 14 and the circuit 10.

A set signal or a reset signal may be input to a node T2 of the NAND 55, for example. When the node T2 is set to "0," the node Q1 can be set to "0" and the node QB1 can be set to "1" regardless of the logic of the node D1. When the node T2 is set to "1," the logic of the nodes Q1 and QB1 is changed in accordance with the logic of the node D1.

A set signal or a reset signal may be input to a node T3 of the NOR 56, for example. When the node T3 is set to "1," the node Q1 can be set to "1" and the node QB1 can be set to "0" regardless of the logic of the node D1. When the node T3 is set to "0," the logic of the nodes Q1 and QB1 is changed in accordance with the logic of the node D1.

In order to reduce the dynamic power of the logic circuit 110, the number of transistors in the input stage is preferably reduced. Accordingly, as in the circuits 10 to 12, the input stage is preferably formed using two basic logic gate circuits. In the case where the circuits 10 to 12 are formed using CMOS transistors, the number of transistors in the circuit 10 is 4, and the number of transistors in each of the circuits 11 and 12 is 6. Furthermore, the circuits 10 to 12 are logic circuits to which clock signals are not input, so that the dynamic power of the logic circuit 110 can be reduced.

The circuit 13 in FIG. 3C may be provided in the input stage of the logic circuit 110. The selection circuit 14 has a function of selecting one of the node D and a node SD and outputting input data of the selected node to the node D1. With the circuit 13, the logic circuit 110 can function as a scan flip-flop. In that case, the node SD of the selection circuit 14 is used as an input node of test data for a scan test.

<Circuit 20>

The circuit 20 includes a pair of retention circuits (RC) 21. The RC 21 includes a transistor M1, a transistor M2, the capacitor C1, and the node FN. The RC 21 is a circuit in which the switches SW1 and SW2 in the retention circuit 105 (FIG. 1) are n-channel transistors. Here, one RC 21 that is electrically connected to the node Q1 is referred to as an RC 21[1], and the other RC 21 is referred to as an RC 21[2]. In addition, in order to distinguish components of the RC 21[1] and the RC 21[2] from each other, reference numerals with [1] and [2] are used. Specifically, the node FN of the RC 21[1] is referred to as a node FN[1].

A gate of the transistor M1 is electrically connected to the wiring 81, and a gate of the transistor M2 is electrically connected to the wiring 82. The transistors M1 and M2 are electrically connected to each other in series. A connection portion of the transistors M1 and M2 is the node FN. When the transistors M1 and M2 are turned off, the node FN can be set in an electrically floating state. A first terminal and a second terminal of the capacitor C1 are electrically connected to the node FN and the VSS line, respectively.

The transistors M1 and M2 are OS transistors. Since the transistors M1 and M2 have extremely low off-state current, fluctuation in the potential of the electrically floating node FN can be reduced. Therefore, the RC 21 can retain data for a long time and can be used as a nonvolatile memory circuit.

Note that in a period during which the node FN is in an electrically floating state, a potential that completely turns off the transistors M1 and M2 might be continuously supplied to the gates of the transistors M1 and M2. Alternatively, in the case where the transistors M1 and M2 include back gates, a potential that makes the transistors M1 and M2 normally-off might be continuously supplied to the back gates. In such a case, the potential is supplied to the RC 21. However, the RC 21 consumes little power because almost no current flows. Because the RC 21 consumes little power even when a potential is supplied to the RC 21, the RC 21 can be regarded as a nonvolatile memory circuit.

Figure 4A:
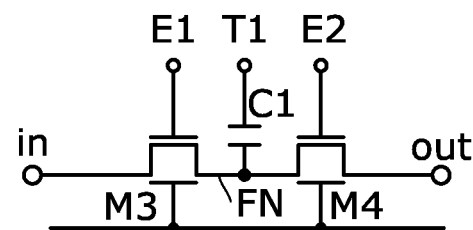
FIGS. 4A and 4B are circuit diagrams each illustrating a structure example of a circuit.
Figure 4B:
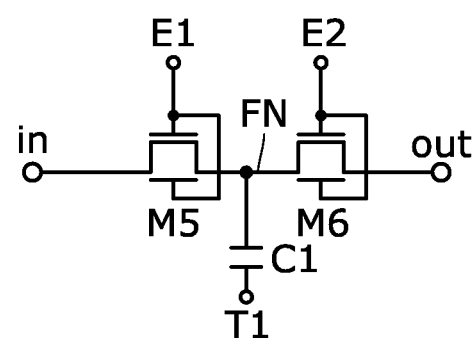

FIGS. 4A and 4B illustrate other structure examples of a retention circuit. In retention circuits in FIGS. 4A and 4B, the switches SW1 and SW2 are formed using OS transistors including back gates.

In an RC 22 in FIG. 4A, back gates of transistors M3 and M4 are electrically connected to a wiring 80. The threshold voltages of the transistors M3 and M4 can be adjusted using the potential of the wiring 80, for example. A capacitor may be connected to the back gates of the transistors M3 and M4. This capacitor may be charged so that the potentials of the back gates of the transistors M3 and M4 can be held. In addition, one of the transistors M3 and M4 does not necessarily include the back gate.

In an RC 23 in FIG. 4B, gates of transistors M5 and M6 are electrically connected to back gates of the transistors M5 and M6. Such a device structure can improve on-state current characteristics of the transistors M5 and M6. One of the transistors M5 and M6 does not necessarily include the back gate, or the back gate of one of the transistors M5 and M6 may be electrically connected to the wiring 80.

<Circuit 30>

The circuit 30 is a CMOS circuit. The circuit 30 includes transistors N1, N2, P1, and P2. Sources of the transistors N1 and N2 are electrically connected to the VSS line, and sources of the transistors P1 and P2 are electrically connected to the VDD line. A gate of the transistor N1 is electrically connected to the node D2, and a gate of the transistor N2 is electrically connected to the node DB2. A gate of the transistor P1 and drains of the transistors N2 and P2 are electrically connected to the node Q2. A gate of the transistor P2 and drains of the transistors N1 and P1 are electrically connected to the node QB2.

The transistors N1 and N2 can be turned on and off in a complementary manner. The transistors P1 and P2 can also be turned on and off in a complementary manner. The circuit 30 has a level shift function. Specifically, the circuit 30 has a function of shifting the potential of an "H" signal to VDD and shifting the potential of an "L" signal to VSS of input complementary signals. The complementary signals whose levels are shifted are output from two output nodes of the circuit 30. In other words, the circuit 30 has a function of amplifying voltage between the nodes D2 and DB2 to (VDD−VSS).

When the potential of the node D2 is "H" and the potential of the node DB2 is "L," the transistor N1 is turned on and the transistor N2 is turned off. Thus, the potential of the node QB2 becomes VSS. The potential of the gate of the transistor P2 becomes VSS and the potential of the source of the transistor P2 is VDD; thus, the transistor P2 is turned on and the potential of the node Q2 becomes VDD. At this time, the potentials of the gate and the source of the transistor P1 are VDD, and the transistor P1 is off. That is, when the potential of the node D2 is "H" and the potential of the node DB2 is "L," the potential of the node Q2 becomes VDD and the potential of the node QB2 becomes VSS. In the case where the potential levels of the nodes D2 and DB2 are opposite, the potential of the node Q2 becomes VSS and the potential of the node QB2 becomes VDD.

<Circuit 40>

The circuit 40 has a structure similar to that of the circuit 104 and includes INVs 53 and 54. The potentials of the nodes QB2 and Q2 are output from the nodes Q and QB through the INVs 53 and 54. The INVs 53 and 54 have a function of driving large loads on the nodes Q and QB.

<<Operation Example of Logic Circuit 110>>

An operation example when the logic circuit 110 is transferred from a normal operating state to a standby state and an operation example when the logic circuit 110 is transferred from the standby state to the normal operating state are described with reference to FIG. 5. Here, the high-level potential of input data of the node D is VDD, and the low-level potential of input data of the node D is VSS.

Figure 5:
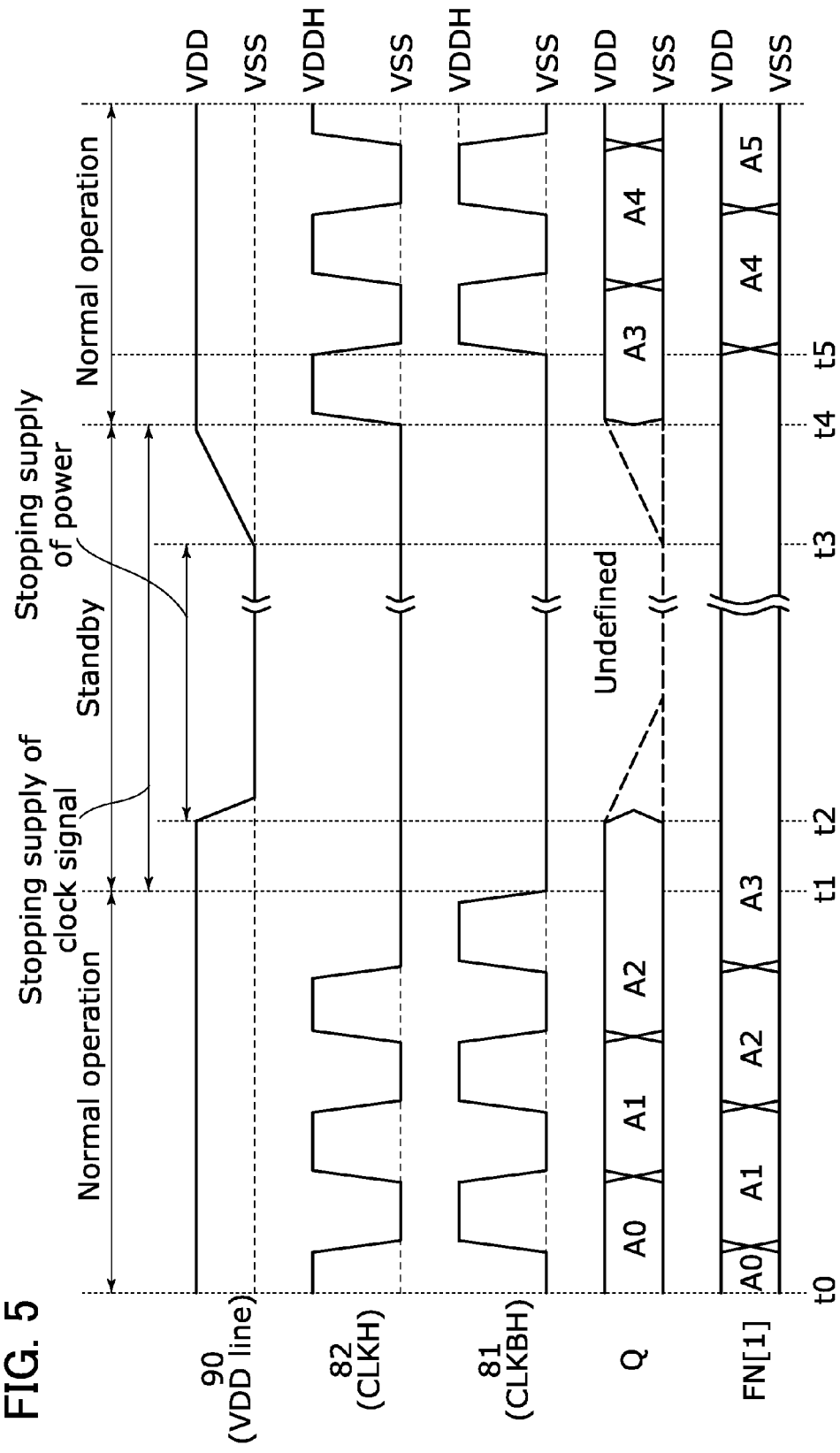
FIG. 5 is a timing chart illustrating an operation example of the logic circuit in FIG. 2.

FIG. 5 is a timing chart illustrating an operation example of the logic circuit 110. FIG. 5 shows waveforms of the potentials of the VDD line (the wiring 90), the wiring 81, the wiring 82, the node Q, and the node FN[1]. The high-level potentials of the wirings 81 and 82 are VDDH, where VDDH>VDD. In addition, t0, t1, and the like each represent time. Furthermore, A0, A1, and the like each represent data, which has logic of "1" or "0."

<Normal Operating State: t0 to t1>

The operation mode of the logic circuit 110 in a period from t0 to t1 is normal operation. VDD and VSS are supplied to the logic circuit 110, and CLKH and CLKBH are input to the logic circuit 110. In a period during which CLKBH is "H," complementary data is transferred from the circuit 10 to the circuit 20, and data of the nodes FN[1] and FN[2] is rewritten. In a period during which CLKBH is "L," the circuit 20 retains the data of the nodes FN[1] and FN[2]. Therefore, in the circuit 20, complementary data is written to the nodes FN[1] and FN[2] in a period during which CLKBH is active, and the nodes FN[1] and FN[2] retain the complementary data until CLKBH becomes "H" again.

The circuit 30 has a function of amplifying complementary data retained in the circuit 20 and retaining the amplified complementary data. In normal operation, the circuit 30 functions as an amplifier for amplifying complementary data and outputting the amplified complementary data. In a period during which CLKH is "H," the circuit 20 reads the retained complementary data to the circuit 30. In the circuit 30, the data of the node FN[1] is written to the node D2 and the data of the node FN[2] is written to the node DB2. In a period during which CLKH is "L," data of the nodes D2 and DB2 is retained. Therefore, in the circuit 30, the retained complementary data is written at the time of rising of CLKH, and the complementary data is retained until CLKH becomes "H" again.

In the case where the node FN[1] has A0, A1, or A2 in synchronization with rising of CLKBH, as illustrated in FIG. 5, A0, A1, or A2 is output from the node Q at the time of rising of CKLH. In this manner, the logic circuit 110 can operate as a flip-flop in synchronization with CLKH.

Note that the high-level potentials of CLKH and CLKBH are made higher than VDD so that the current drive capability of the transistors M1 and M2 in the RC 21 can be improved. Since the transistors M1 and M2 are OS transistors, the threshold voltages of the transistors M1 and M2 might be higher than those of transistors driven by VDD of the circuits 10, 30, and 40. Thus, the potential VDDH higher than VDD is input to the gates of the transistors M1 and M2 so that the transistors M1 and M2 are properly turned on and high on-state current flows.

<Standby State: t1 to t4>

In a period from t1 to t4, the logic circuit 110 is in a standby state and a power-saving state. At t1, clock gating is started and the supply of a clock signal is stopped. When CLKH and CLKBH become "L," the nodes FN[1] and FN[2] are set in an electrically floating state, the node FN[1] retains A3, and the node FN[2] retains inverted data of A3. That is, when the supply of a clock signal is stopped, the logic circuit 110 is set in a data retention state. The logic circuit 110 can be transferred from the normal state to the standby state in a short time.

At t2, the supply of power to the logic circuit 110 is stopped by power gating. For example, a power switch breaks electrical connection between a power supply circuit and the VDD line. The VDD line gradually discharges and the potential of the VDD line decreases to VSS. Accordingly, a potential difference between the VDD line and the VSS line becomes 0 V. Making the potential difference between the VDD line and the VSS line 0 V is called power-off. Since the circuits 30 and 40 stop their operations, the logic of the nodes Q and QB is undefined in a period from t2 to t4. Note that the supply of power may be stopped when the supply of a clock signal is stopped (at t1).

In a period from t3 to t4, operation for transferring the logic circuit 110 from the standby state to the normal operating state is executed. The logic circuit 110 can be transferred to the normal operating state by restart of power supply and clock signal input.

At t3, the supply of VDD is restarted. The power switch electrically connects the power supply circuit to the VDD line. The VDD line is charged so that the potential of the VDD line becomes VDD. After the potential of the VDD line becomes VDD, the logic circuit 110 is transferred to the normal operating state by restart of the clock signal input at t4.

<Normal Operating State: at and After t4>

At t4, first, CLKH is set in an active state. When CLKH becomes "H," the node FN[1] is electrically connected to the node D2, and the node FN[2] is electrically connected to the node DB2. At this time, the node FN[1] has A3 and the node FN[2] has the inverted data of A3; thus, A3 is output from the node Q and the inverted data of A3 is output from the node QB.

Note that at t4, the logic circuit 110 restarts operation at the time of start of clock gating (at t1) because A3 is output from the node Q at t1 if the supply of CLKH is not stopped. After the potential of the VDD line becomes VDD, CLKBH is first set in an active state at t5, so that complementary data of the circuit 20 is rewritten. Input data A4 of the node D is written to the node FN[1]. When CLKH is set in an active state, A4 is output from the node Q. When CLKBH is set in an active state again, input data A5 of the node D is written to the node FN[1].

The circuit 30 has a function of reproducing attenuated complementary data of the circuit 20. This function is described by taking the case where A3 is data of "1" as an example. Even when transistors M1[1] and M2[1] are OS transistors, leakage of electric charge from the node FN[1] cannot be prevented completely. Thus, in the standby period, the potential of the node FN[1] attenuates and becomes lower than VDD. When the potentials of the nodes FN[1] and FN[2] are input to the nodes D2 and DB2 in the circuit 30 at t4, the circuit 30 is operated by a potential difference between the nodes D2 and DB2, the potentials of the nodes FN[1] and FN[2] are amplified, VDD is output from the node Q2, and VSS is output from the node QB2. The circuit 30 performs differential amplification in this manner, so that the attenuated potential level of "1" becomes VDD at the time of transfer to the normal operating state.

The circuit 20 operates as a data backup circuit; thus, the logic circuit 110 does not need a separate data backup circuit. Therefore, a semiconductor device including the logic circuit 110 can be made small. In addition, in order that the logic circuit 110 be transferred from the normal operating state to the standby state as illustrated in FIG. 5, clock gating and power gating are performed, and special operation for data backup of the logic circuit 110 is not needed. Furthermore, in order that the logic circuit 110 be transferred from the standby state to the normal operating state, clock gating and power gating are terminated, and special operation for data restore of the logic circuit 110 is not performed. In other words, the logic circuit 110 can provide a nonvolatile logic circuit that does not need data backup and restore but has a long state retention function.

In the case where the INVs 51 to 54 are formed using CMOS transistors, the logic circuit 110 includes 16 transistors and 2 capacitors. The number of transistors driven by clock signals is as small as 4. In contrast, a general flip-flop, for example, a TGFF disclosed in FIG. 19.4.1 in Non-Patent Document 1 includes 20 transistors (excluding 2 INVs for clock signal waveform shaping), and the number of transistors driven by clock signals is 8. In other words, the area and dynamic power of the logic circuit 110 are reduced. In addition, the static power of the logic circuit 110 is reduced because power gating is possible.

Figure 6:
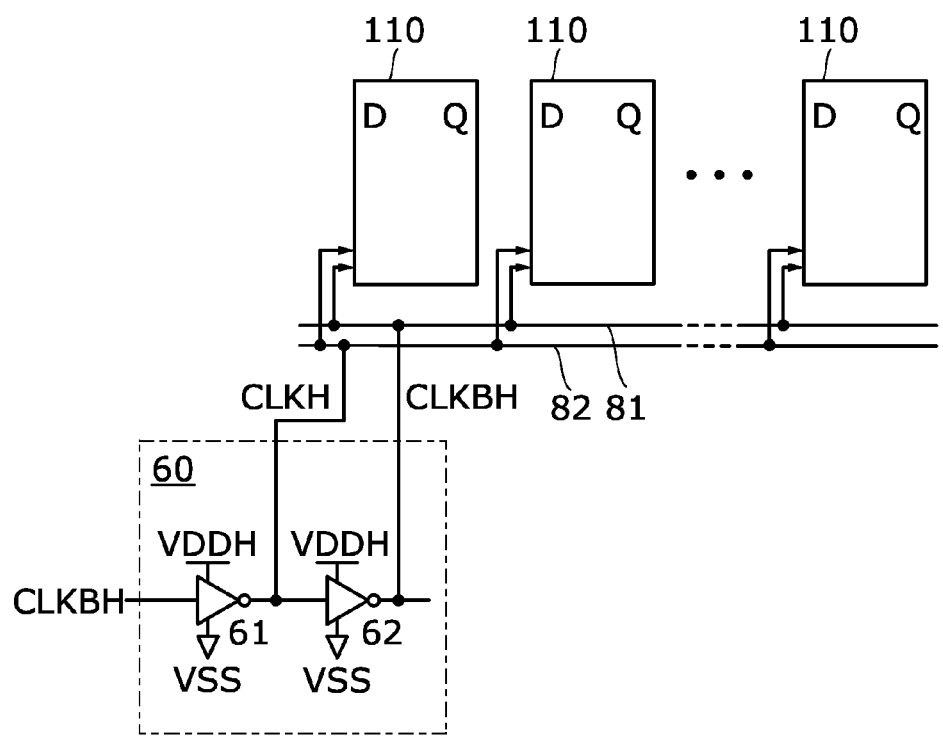
FIG. 6 is a circuit diagram illustrating a structure example of a clock signal waveform shaping circuit.

A margin for delay or overlap of CLKH and CLKBH in the logic circuit 110 is higher than that in the general flip-flop; thus, it is not necessary to provide a clock signal waveform shaping circuit in each logic circuit 110. As illustrated in FIG. 6, one clock signal waveform shaping circuit 60 may be provided for a plurality of logic circuits 110 (e.g., 128 or 256 logic circuits 110). The circuit 60 includes INVs 61 and 62 connected to each other in series. High power supply potentials of the INVs 61 and 62 are VDDH, and low power supply potentials of the INVs 61 and 62 are VSS. An output node of the INV 61 is electrically connected to the wiring 82, and an output node of the INV 62 is electrically connected to the wiring 81. Transistors of the INVs 61 and 62 preferably have high threshold voltages. The circuit structure in FIG. 6 can reduce the number of inverters in the semiconductor device including the logic circuit 110. Accordingly, dynamic voltage and static voltage can be reduced, and the semiconductor device can be made small.

<<Logic Circuit 111>>

Figure 7:
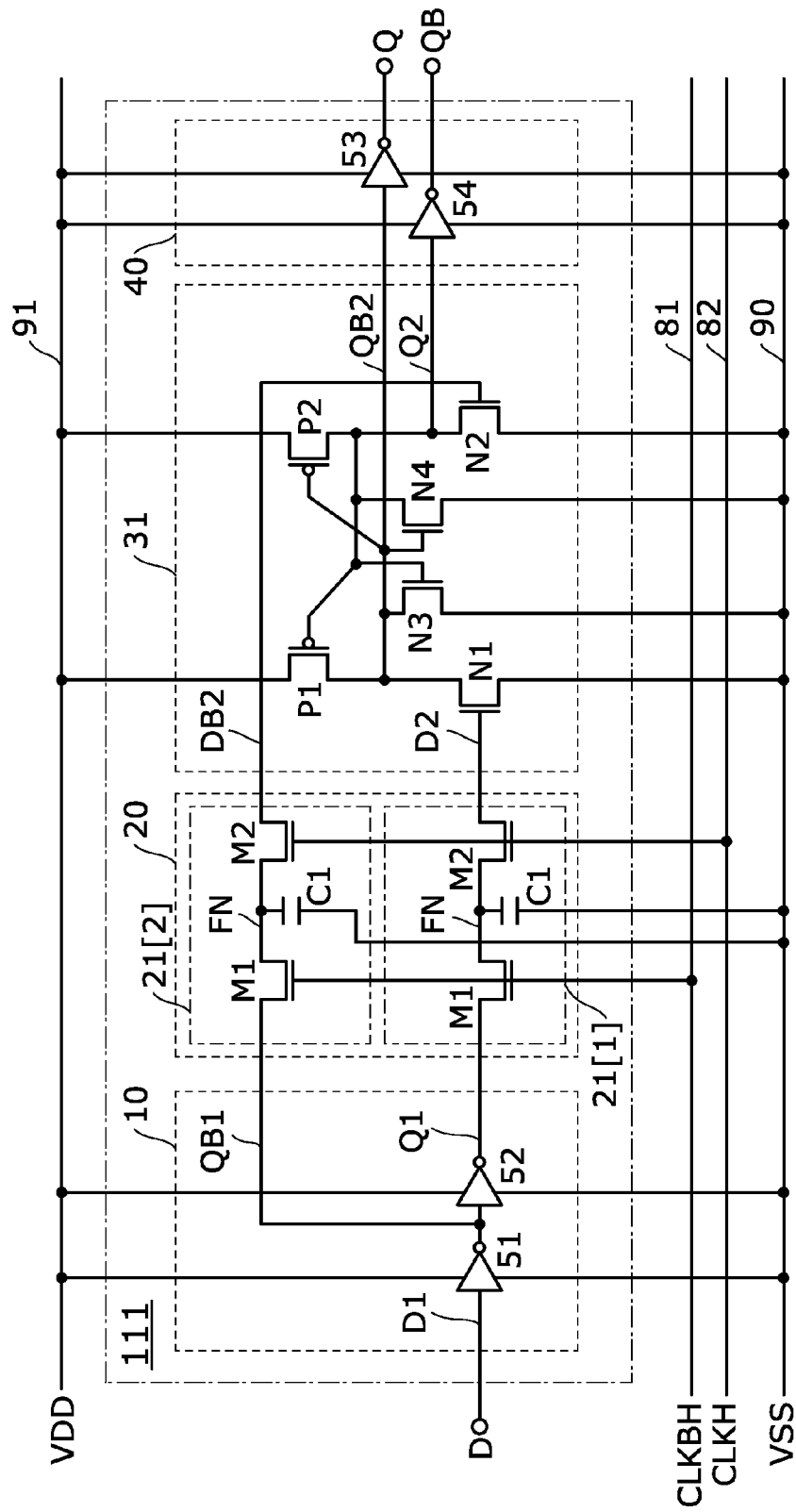
FIG. 7 is a circuit diagram illustrating a structure example of a logic circuit.

A logic circuit 111 in FIG. 7 is a modification example of the logic circuit 110, which includes a circuit 31 instead of the circuit 30. The circuit 31 is obtained by addition of two transistors N3 and N4 to the circuit 30. A gate of the transistor N3 is electrically connected to the gate of the transistor P1. A source of the transistor N3 is electrically connected to the VSS line. A drain of the transistor N3 is electrically connected to the node QB2. A gate of the transistor N4 is electrically connected to the gate of the transistor P2. A source of the transistor N4 is electrically connected to the VSS line. A drain of the transistor N4 is electrically connected to the node Q2. The circuit 31 operates in a manner similar to that of the circuit 30. Thus, the logic circuit 111 can operate in a manner similar to that of the logic circuit 110.

In the case where gate leakage current of the transistors N1 and N2 is high, the data retention time of the circuit 30 might be shorter than one cycle of CLKH. In such a case, the circuit 31 is preferably used instead of the circuit 30. The switching speed of the transistors N1 and N2 is preferably higher than that of the transistors N3, N4, P1, and P2.

By extending the data retention time of the circuit 31, the logic circuit 111 can perform normal operation even at low operating frequency. Depending on processing executed by the semiconductor device including the logic circuit 111, the dynamic power of the semiconductor device can be reduced by lowering the frequency of clock signals.

<<Logic Circuit 112>>

Figure 8:
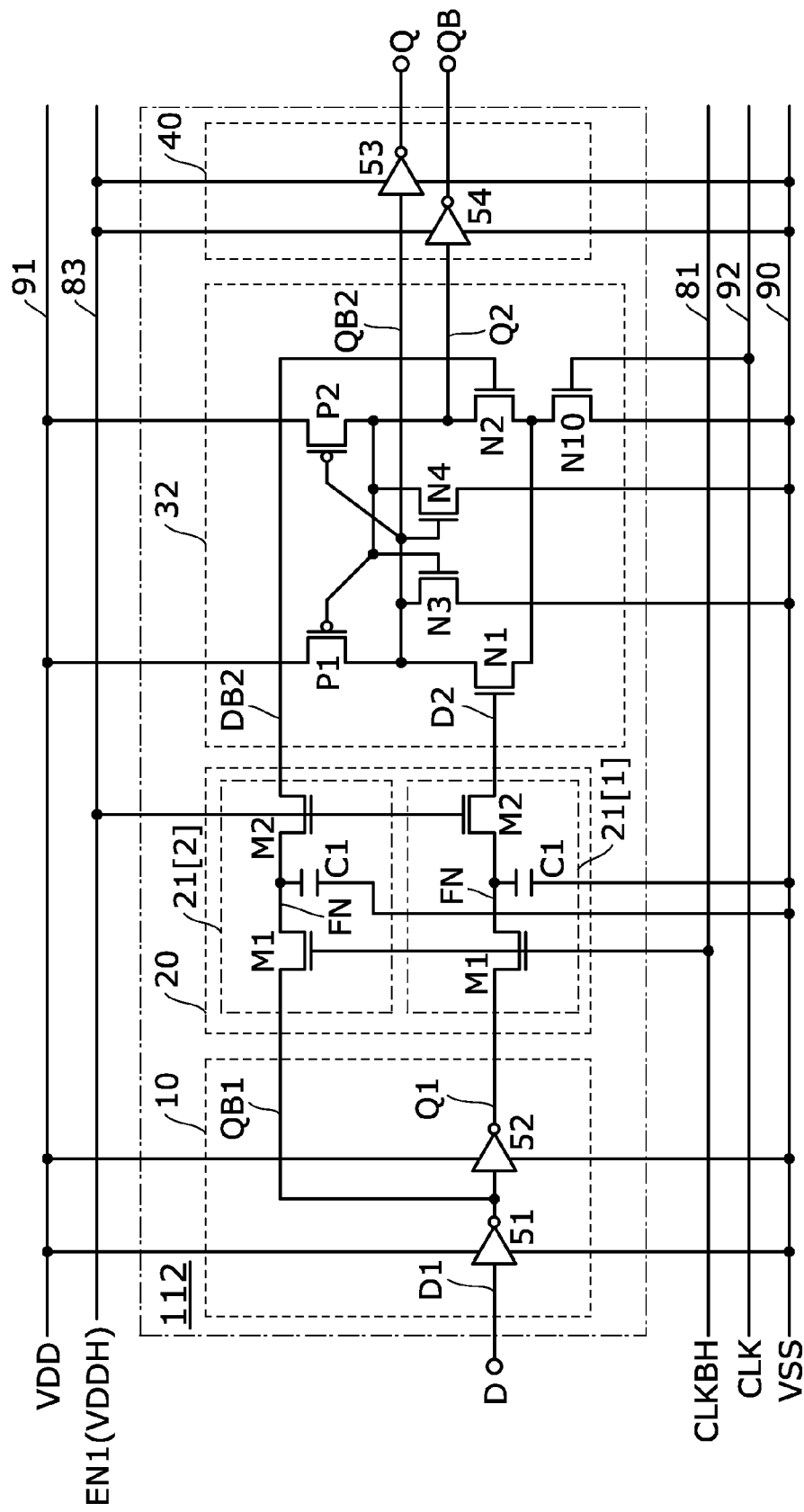
FIG. 8 is a circuit diagram illustrating a structure example of a logic circuit.

A logic circuit 112 in FIG. 8 is a modification example of the logic circuit 111, which includes a circuit 32 instead of the circuit 31. The logic circuit 112 is electrically connected to the VSS line, the VDD line, the wiring 81, a wiring 83, and a wiring 92. The wirings 81 and 92 are clock signal wirings. CLKBH is input to the wiring 81, and CLK is input to the wiring 92. CLK and CLKBH are clock signals whose logic is inverted. CLK and CLKBH have the same frequency but different high-level potentials. The high-level potential of CLK is VDD, and the high-level potential of CLKBH is VDDH. A signal EN1 is input to the wiring 83. The high-level potential of the signal EN1 is VDDH. The signal EN1 is a signal for controlling conduction between the circuit 20 and the circuit 32.

The circuit 32 is obtained by addition of a transistor N10 to the circuit 31. The circuit 32 can operate as an amplifier for amplifying input complementary data like the circuits 30 and 31. A gate of the transistor N10 is electrically connected to the wiring 92. A source of the transistor N10 is electrically connected to the VSS line. A drain of the transistor N10 is electrically connected to the sources of the transistors N1 and N2. The switching speed of the transistors N1, N2, and N10 is preferably higher than that of the transistors N3, N4, P1, and P2. In other words, the drive capability of the transistors N1, N2, and N10 is preferably higher than that of the transistors N3, N4, P1, and P2.

The transistors M1 and N10 are turned on and off in a complementary manner. The transistor N10 is turned off when the transistor M1 is on, and the transistor N10 is turned on when the transistor M1 is off. In a normal operating period, the transistor M2 is always on. In the circuit 20, only write operation of complementary data is controlled by such an operation method. Read operation of complementary data from the circuit 20 to the circuit 32 is controlled by the transistor N10. Consequently, read speed of complementary data from the circuit 20 depends on the switching speed of the transistor N10 in the logic circuit 112, whereas the read speed of complementary data from the circuit 20 depends on the switching speed of the transistor M2 in the logic circuit 111.

The transistor M2 is an OS transistor and might have lower switching speed than a Si transistor. Therefore, when the transistor N10 is formed using a transistor (e.g., a Si transistor) that has higher switching speed than the transistor M2, the read speed of complementary data from the circuit 20 can be increased.

The write speed of complementary data to the circuit 20 depends on the switching speed of the transistor M1 and the capacitance of the capacitor C1. When the capacitance of the capacitor C1 is made small, the write speed can be increased. However, in the logic circuit 111, the capacitance of the capacitor C1 cannot be made smaller than stray capacitance connected to the gates of the transistors N1 and N2. In the logic circuit 112, it is possible to lift restrictions on the capacitance of the capacitor C1. Accordingly, the operating frequency of the logic circuit 112 can be made higher than that of the logic circuit 111.

<<Operation Example of Logic Circuit 112>>

Figure 9:
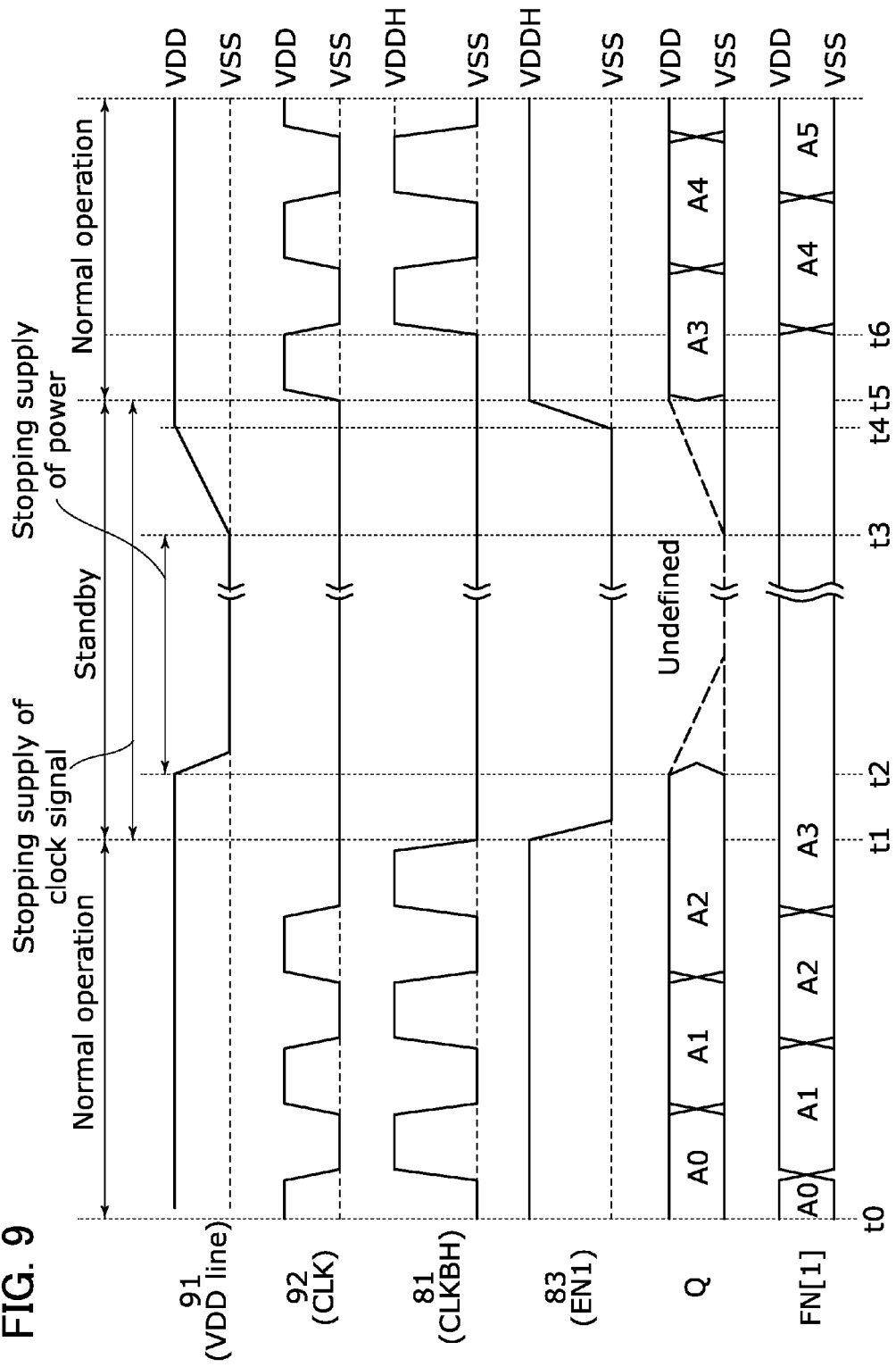
FIG. 9 is a timing chart illustrating an operation example of the logic circuit in FIG. 8.

FIG. 9 is a timing chart illustrating an operation example of the logic circuit 112. FIG. 9 shows waveforms of the potentials of the wiring 81, the wiring 83, the wiring 91 (the VDD line), the wiring 92, the node Q, and the node FN[1]. In addition, t0 to t5 each represent time. Furthermore, A0 to A5 each represent data, which has logic of "1" or "0."

<Normal Operating State: t0 to t1>

The operation mode of the logic circuit 112 in a period from t0 to t1 is a normal operation mode. VDD and VSS are supplied to the logic circuit 112, and CLK, CLKBH, and EN1 are input to the logic circuit 112. In a period during which CLKBH is "H," complementary data is transferred from the circuit 10 to the circuit 20, and data of the nodes FN[1] and FN[2] is rewritten. In a period during which CLKBH is "L," the circuit 20 retains the data of the nodes FN[1] and FN[2]. Therefore, in the circuit 20, complementary data is written to the nodes FN[1] and FN[2] in a period during which CLKBH is active, and the nodes FN[1] and FN[2] retains the complementary data until CLKBH is set in an active state ("H") again.

In a period during which CLK is "H," the circuit 32 operates in accordance with complementary data from the circuit 20. When the transistor N10 is turned on, the potentials of the sources of the transistors N1 and N2 become VSS, and the circuit 32 performs differential amplification using a potential difference between the nodes D2 and DB2. The potential levels of the nodes D2 and DB2 are shifted and the potentials of the nodes D2 and DB2 are output to the nodes Q2 and QB2. In a period during which CLK is "L," the circuit 32 retains the complementary data written in the period during which CLK is "H." The circuit 32 operates in a manner similar to that of the circuit 30. Thus, the normal operation of the logic circuit 112 is similar to that of the logic circuit 110.

<Standby State: t1 to t5>

In a period from t1 to t5, the logic circuit 112 is in a standby state and a power-saving state. At t1, clock gating is started and the input of a clock signal is stopped. At the same time as the start of clock gating, the supply of VDDH to the wiring 83 is stopped. Specifically, CLK, CLKBH, and EN1 are set to "L." The circuit 20 is set in a data retention state, the node FN[1] retains A3, and the node FN[2] retains the inverted data of A3. The circuit 32 is also set in a data retention state; thus, data rewriting of the nodes Q and QB is stopped, and the states of the nodes Q and QB are maintained.

At t2, the supply of power to the logic circuit 112 is stopped by power gating. The VDD line discharges and the potential of the VDD line decreases to VSS. The circuit 20 retains A3 and the inverted data of A3 even in a power-off state. The logic of the nodes Q and QB is undefined in a period from t2 to t5. Note that the supply of power may be stopped when the input of a clock signal is stopped (at t1).

In a period from t3 to t5, operation for transferring the logic circuit 112 from the standby state to the normal operating state is executed. The power supply is restarted, and then, the signals EN1, CLK, and CLKBH are set in an active state in that order. At t3, the supply of VDD to the VDD line is restarted. After the potential of the VDD line becomes VDD, EN1 is set in an active state at t4. After the wiring 83 is charged to VDDH, the input of a clock signal is restarted. In order to update complementary data of the circuit 32, CLK is first set in an active state at t5.

<Normal Operating State: at and After t5>

At and after t5, normal operation is performed. CLK is set in an active state, so that the circuit 32 reads A3 retained in the circuit 20 and the inverted data of A3. The logic of the node Q is defined as A3, and the logic of the node QB is defined as the inverted data of A3. In other words, at t5, the logic circuit 112 restarts normal operation in stopping the supply of a clock signal (at t1). When CLKBH is set in an active state at t6, the input data A4 of the node D is written to the node FN[1]. When CLKBH is set in an active state again, the input data A5 of the node D is written to the node FN[1].

As illustrated in FIG. 9, like the logic circuit 110, the logic circuit 112 does not need data backup operation for transfer to the standby state and data restore operation for transfer to the normal operating state. In addition, the logic circuit 112 does not need a data backup circuit. Accordingly, the logic circuit 112 can provide a nonvolatile logic circuit that does not need data backup and restore operations but has a state retention function.

Figure 10A:
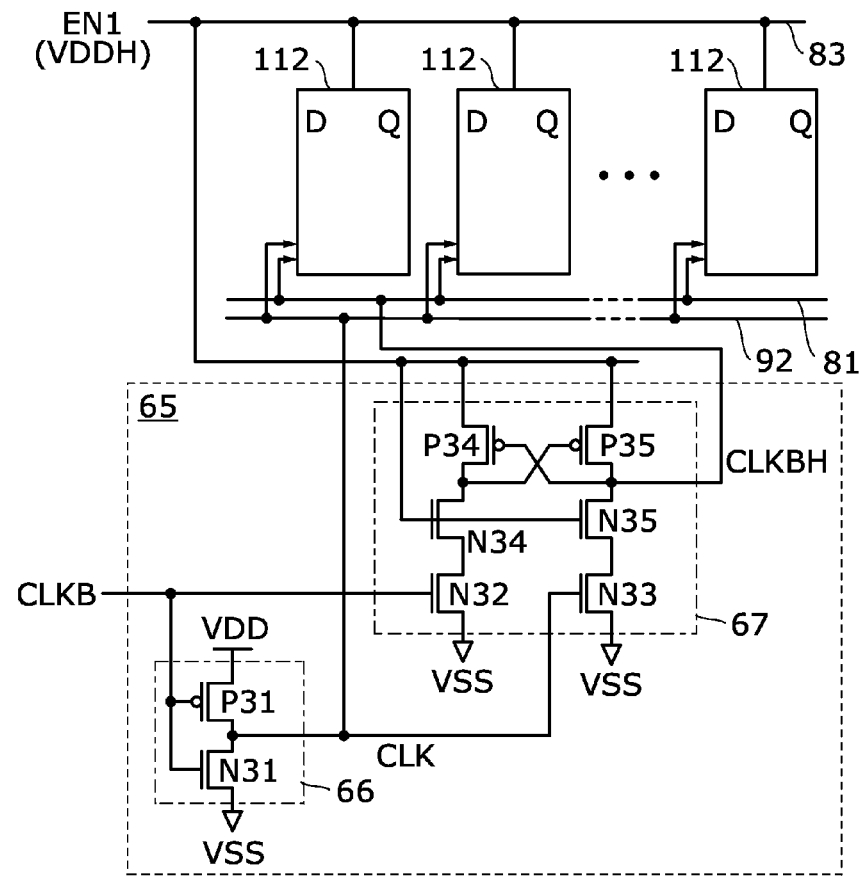
FIGS. 10A and 10B are circuit diagrams each illustrating a structure example of a clock signal waveform shaping circuit.

Like the logic circuit 110, a margin for delay or overlap of CLKH and CLKBH in the logic circuit 112 is higher than that in the general flip-flop; thus, it is not necessary to provide a clock signal waveform shaping circuit in each logic circuit 112. For example, as illustrated in FIG. 10A, one circuit 65 may be provided for a plurality of logic circuits 112 (e.g., 128 or 256 logic circuits 112).

The circuit 65 includes an INV 66 and a level shifter 67. The circuit 65 has a function of generating CLK and CLKBH from CLKB. An output node of the INV 66 is electrically connected to the wiring 92. A first output node of the level shifter 67 (a drain of a transistor P35) is electrically connected to the wiring 81. Transistors N31, N32, N33, and P31 have low threshold voltages. Transistors N34, N35, P34, and P35 preferably have higher threshold voltages than the transistors N31, N32, N33, and P31. The signal EN1 is input to a power supply line for a high power supply potential of the level shifter 67. The circuit 65 can generate gated clock signals. In order to set the logic circuit 112 in the standby state, even when the potential level of CLKBH is fixed to "H," CLKBH can be set to "L" when the signal EN1 is set to "L." Thus, with the circuit 65, the logic circuit 112 can be set in a clock gating state (standby state), and the logic circuit 112 can be returned from the clock gating state (standby state).

Figure 10B:
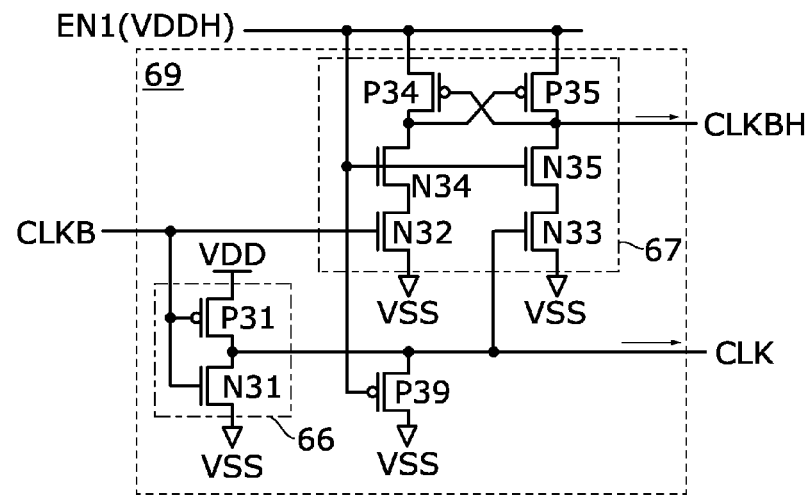

A circuit 69 in FIG. 10B is a modification example of the circuit 65, which has a function similar to that of the circuit 65. The circuit 69 is obtained by addition of a transistor P39 to the circuit 65. The signal EN1 is input to a gate of the transistor P39. VSS is input to a drain of the transistor P39. A source of the transistor P39 is electrically connected to the output node of the INV 66. When the signal EN1 is set to "L," CLKBH and CLK whose potential levels are "L" are output from the circuit 69.

The circuits 65 and 69 can be used as logic circuits 113 to 115 described later. The circuits 65 and 69 can also be used as the logic circuit 110. In that case, the first output node of the level shifter 67 may be electrically connected to the wiring 81, and a second output node (a drain of the transistor P34) of the level shifter 67 may be electrically connected to the wiring 82.

<<Logic Circuit 113>>

Figure 11:
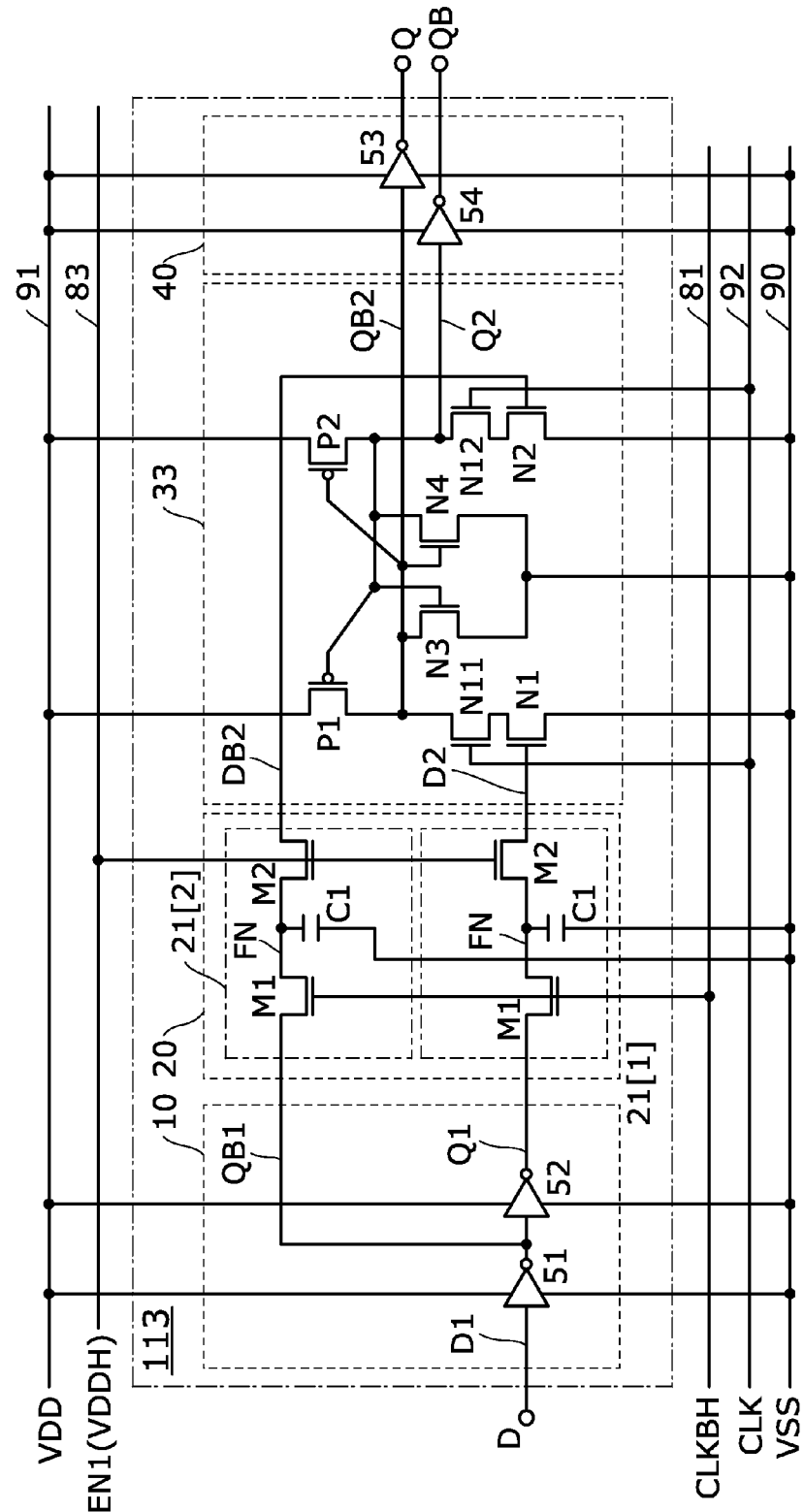
FIG. 11 is a circuit diagram illustrating a structure example of a logic circuit.

The logic circuit 113 in FIG. 11 is a modification example of the logic circuit 112, which includes a circuit 33 instead of the circuit 32. The circuit 33 is a modification example of the circuit 32, which includes transistors N11 and N12 instead of the transistor N10. A gate of the transistor N11 is electrically connected to the wiring 92. A source of the transistor N11 is electrically connected to the drain of the transistor N1. A drain of the transistor N11 is electrically connected to the drain of the transistor P1. A gate of the transistor N12 is electrically connected to the wiring 92. A source of the transistor N12 is electrically connected to the drain of the transistor N2. A drain of the transistor N12 is electrically connected to the drain of the transistor P2.

The logic circuit 113 can operate in a manner similar to that of the logic circuit 112. For example, the logic circuit 113 can operate in accordance with the timing chart in FIG. 9. The number of transistors in the circuit 33 is one more than the number of transistors in the circuit 32; however, the circuit 33 can perform more stable operation than the circuit 32 because the circuit 33 includes the transistors N11 and N12.

<<Logic Circuit 114>>

Figure 12:
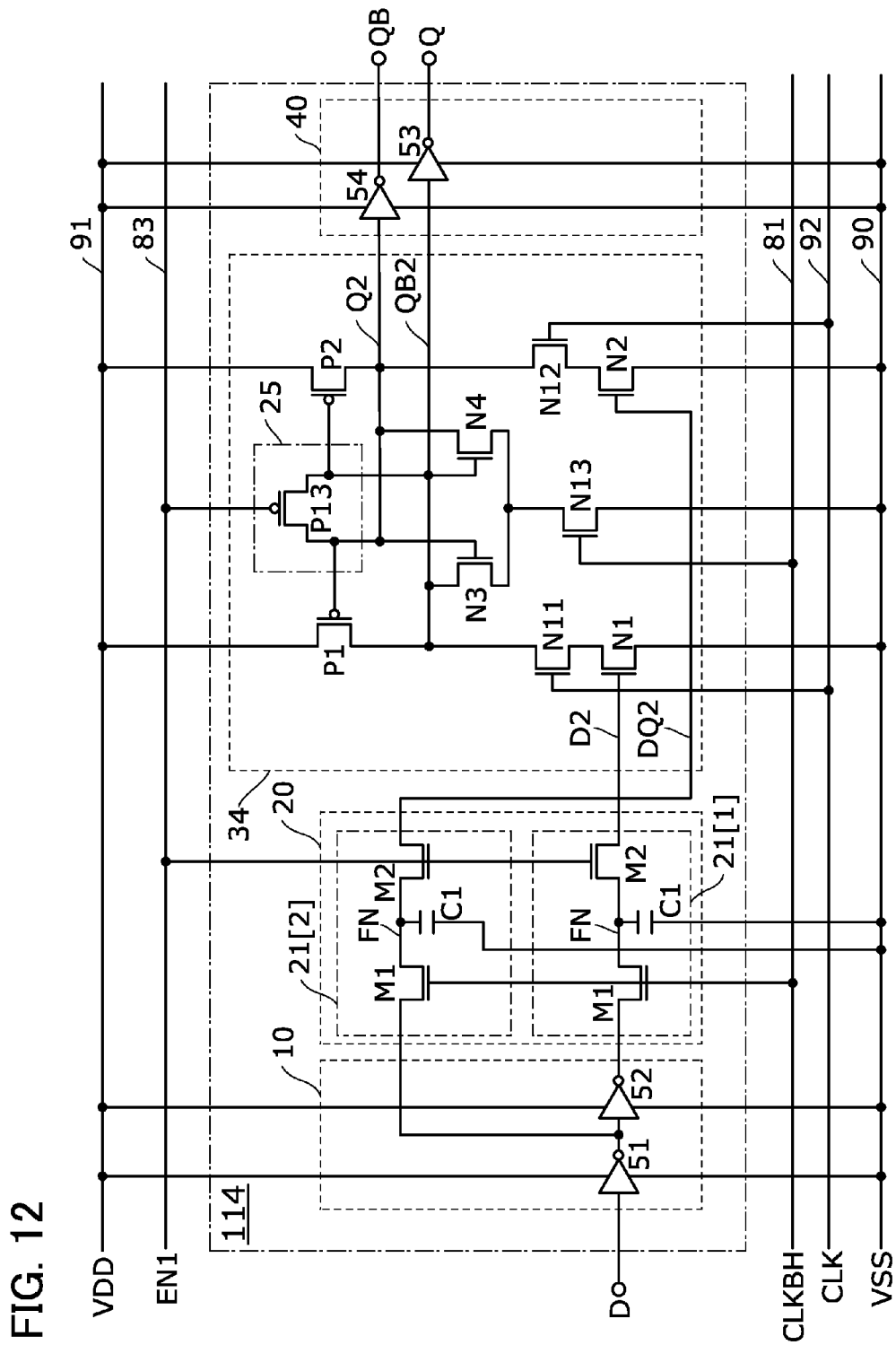
FIG. 12 is a circuit diagram illustrating a structure example of a logic circuit.

In the circuits 30 to 33, the logic of the nodes Q2 and QB2 is undefined when the supply of VDD is restarted. Thus, in these circuits, at the time of transfer to normal operation, the restore performance of complementary data is decreased. FIG. 12 illustrates a structure example of a logic circuit capable of solving such a problem.

The logic circuit 114 in FIG. 12 is a modification example of the logic circuit 113, which includes a circuit 34 instead of the circuit 33. The circuit 34 is a modification example of the circuit 33, which includes an equalizer circuit (EQC) 25 and a transistor N13.

The EQC 25 has a function of equalizing (averaging) the potentials of the nodes Q2 and QB2. The EQC 25 includes a transistor P13. A gate of the transistor P13 is electrically connected to the wiring 83. One of a source and a drain of the transistor P13 is electrically connected to the node Q2. The other of the source and the drain of the transistor P13 is electrically connected to the node QB2. When the transistor P13 is on, the EQC 25 is active.

A gate of the transistor N13 is electrically connected to the wiring 81. A source of the transistor N13 is electrically connected to the wiring 90. A drain of the transistor N13 is electrically connected to the sources of the transistors N3 and N4. The transistor N13 has a function of stabilizing the operation of the EQC 25. By turning off the transistor N13 when the EQC 25 is active, the VSS line and the nodes Q2 and QB2 can be brought out of conduction. The transistor N13 preferably has high threshold voltage because the high power supply potential (VDDH) is input to the gate of the transistor N13. For example, like the transistors M1 and M2, the transistor N13 may be an OS transistor. When the transistor N13 is an OS transistor, the transistor N13 can be stacked over a Si transistor in the circuit 34; thus, the area of the circuit 34 can be reduced.

<<Operation Example of Logic Circuit 114>>

Figure 13:
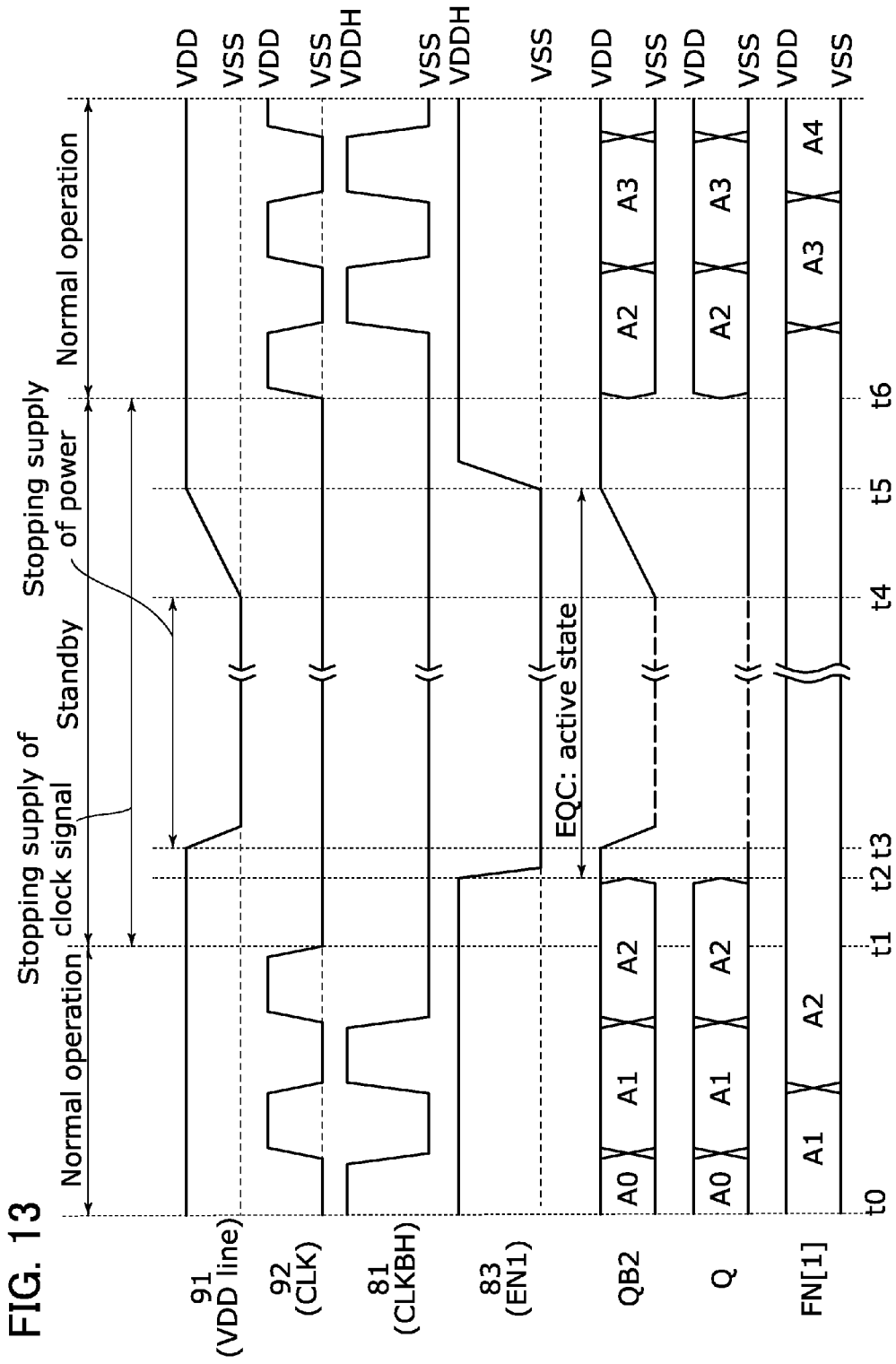
FIG. 13 is a timing chart illustrating an operation example of the logic circuit in FIG. 12.

FIG. 13 is a timing chart illustrating an operation example of the logic circuit 114. FIG. 13 shows waveforms of the potentials of the VDD line, the wiring 81, the wiring 83, the wiring 92, the node FN[1], the node QB2, and the node Q. The logic circuit 114 can operate in a manner similar to that of the logic circuit 113. The biggest difference from the operation of the logic circuit 113 is that the EQC 25 is set in an active state in a standby period.

<Normal Operating State: t0 to t1>

VDD and VSS are supplied to the logic circuit 114, and CLK, CLKBH, and the signal EN1 are input to the logic circuit 114. In a normal operating period, the transistor N13 is turned on in synchronization with the timing of setting CLKBH in the active state and the EQC 25 is always non-active (the transistor P13 is off); thus, the operation of the logic circuit 114 is similar to that of the logic circuit 113.

<<Standby State: t1 to t6>>

At t1, the supply of a clock signal is stopped. In FIG. 13, the supply of a clock signal is stopped when both the nodes FN[1] and QB2 have A2. At t2, the supply of VDDH to the wiring 83 is stopped so that the signal EN1 is set to "L." In a period from t2 to t5, the EQC 25 is active. When the signal EN1 is set to "L," the transistor P13 is turned on. The potentials of the nodes Q2 and QB2 are equalized to VDD by the EQC 25. At t3, the power supply is stopped. When the VDD line is discharged, the nodes Q2 and QB2 are also discharged; thus, the logic of the nodes Q2 and QB2 is undefined until the power supply is restarted.

At t4, the power supply is restarted. Since the EQC 25 is active, the logic of the nodes Q and QB is defined as "0." The potentials of the nodes Q2 and QB2 are increased as the potential of the VDD line is increased. At t5, the signal EN1 is set to "H" and the EQC 25 is set in a non-active state. At t6, when the input of a clock signal is restarted, the logic circuit 114 restarts normal operation.

<Normal Operating State: at and After t6>

At t6, first, CLK is set in an active state, and the transistors N11 and N12 are turned on. The circuit 34 performs differential amplification using the complementary data retained in the circuit 20. Even when read complementary data is attenuated, the circuit 34 can restore the read complementary data to complementary data having the VSS and VDD potentials.

The transistors N11 and N12 may be OS transistors. In that case, CLKH is input to the wiring 92.

As illustrated in FIG. 13, like the logic circuit 110, the logic circuit 114 does not need data backup operation for transfer to the standby state and data restore operation for transfer to the normal operating state. In addition, the logic circuit 114 does not need a data backup circuit. Accordingly, the logic circuit 114 can provide a nonvolatile logic circuit that does not need data backup and restore operations but has a state retention function.

<<Logic Circuit 115>>

For example, in the logic circuit 114, when the capacitance of the capacitor C1 for data retention is made small, write speed and read speed can be increased. On the other hand, in order to retain data for a long time in a power-off state, the capacitance of the capacitor C1 needs to be large. When the capacitance is made large, the write speed and read speed are decreased. Therefore, in a structure example of FIG. 14, it is possible to determine data retention performance and write/read performance separately by addition of a circuit that can retain data of the nodes Q2 and QB2.

Figure 14:
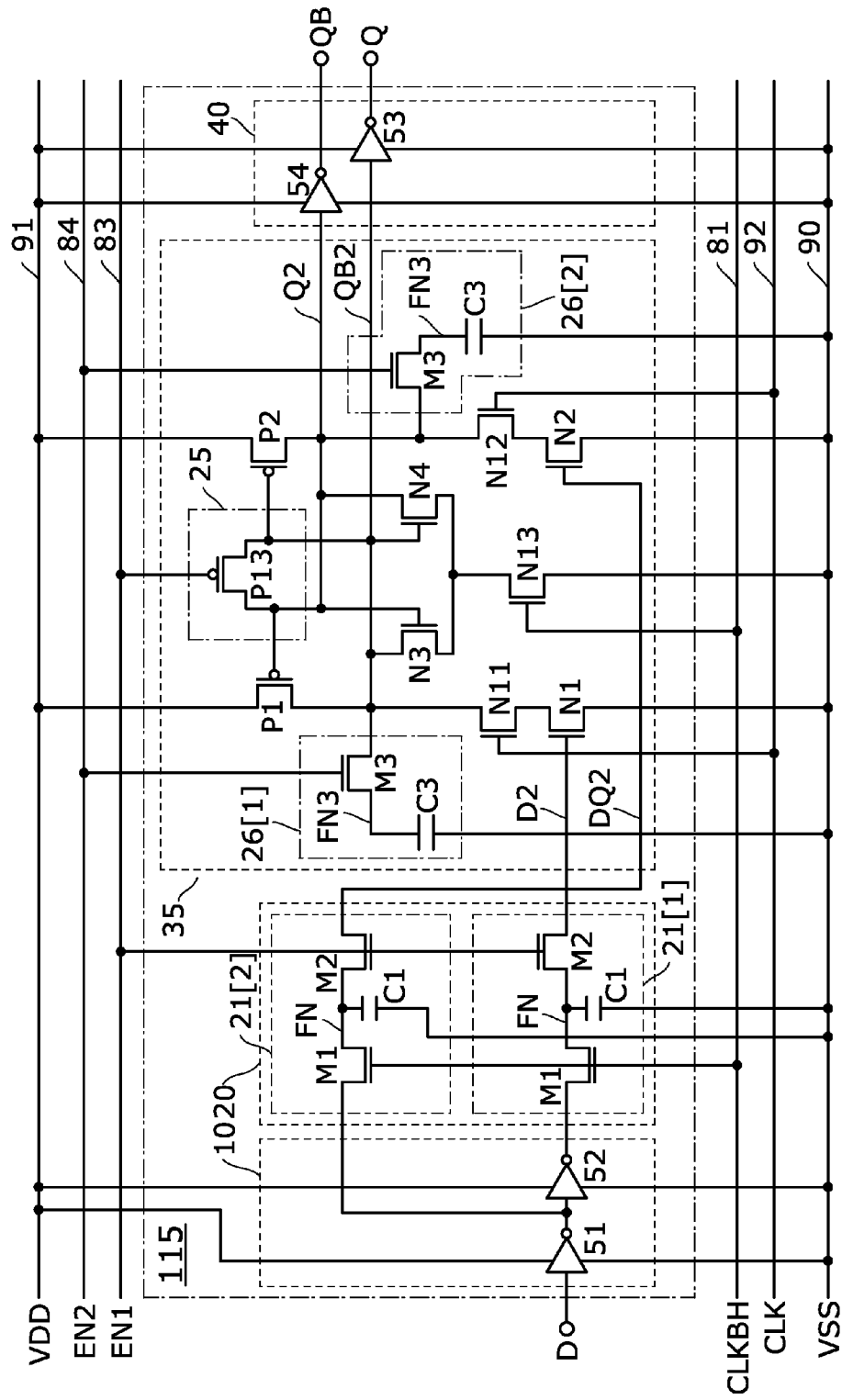
FIG. 14 is a circuit diagram illustrating a structure example of a logic circuit.

The logic circuit 115 in FIG. 14 is a modification example of the logic circuit 114, which includes a circuit 35 instead of the circuit 34. The circuit 35 is obtained by addition of a pair of RCs 26 to the circuit 34.

The pair of RCs 26 is electrically connected to a wiring 84. A signal EN2 is input to the wiring 84. Here, one RC 26 whose input/output node is electrically connected to the node QB2 is referred to as an RC 26[1], and the other RC 26 whose input/output node is electrically connected to the node Q2 is referred to as an RC 26[2].

The RC 26 includes the transistor M3, a capacitor C3, and a node FN3. The node FN3 is a data retention node. The transistor M3 is a pass transistor that can control conduction between the node FN3 and the input/output node of the RC 26. The signal EN2 is input to a gate of the transistor M3. The transistor M3 is an OS transistor, and the RC 26 can function as a nonvolatile analog memory. For example, the pair of RCs 26 can retain the internal state of the logic circuit 115 in a power-off state.

When the circuits 20 and 35 each include a nonvolatile retention circuit, data retention performance in a power-off state and operation speed can be improved. The capacitance of the capacitor C3 is made larger than the capacitance of the capacitor C1. When the capacitance of the capacitor C3 is made large, the data retention performance of the logic circuit 115 in a power-off state can be improved. When the capacitance of the capacitor C1 is made small, the write speed and read speed of the circuit 20 and the operating frequency of the logic circuit 115 can be increased.

<<Operation Example of Logic Circuit 115>>

Figure 15:
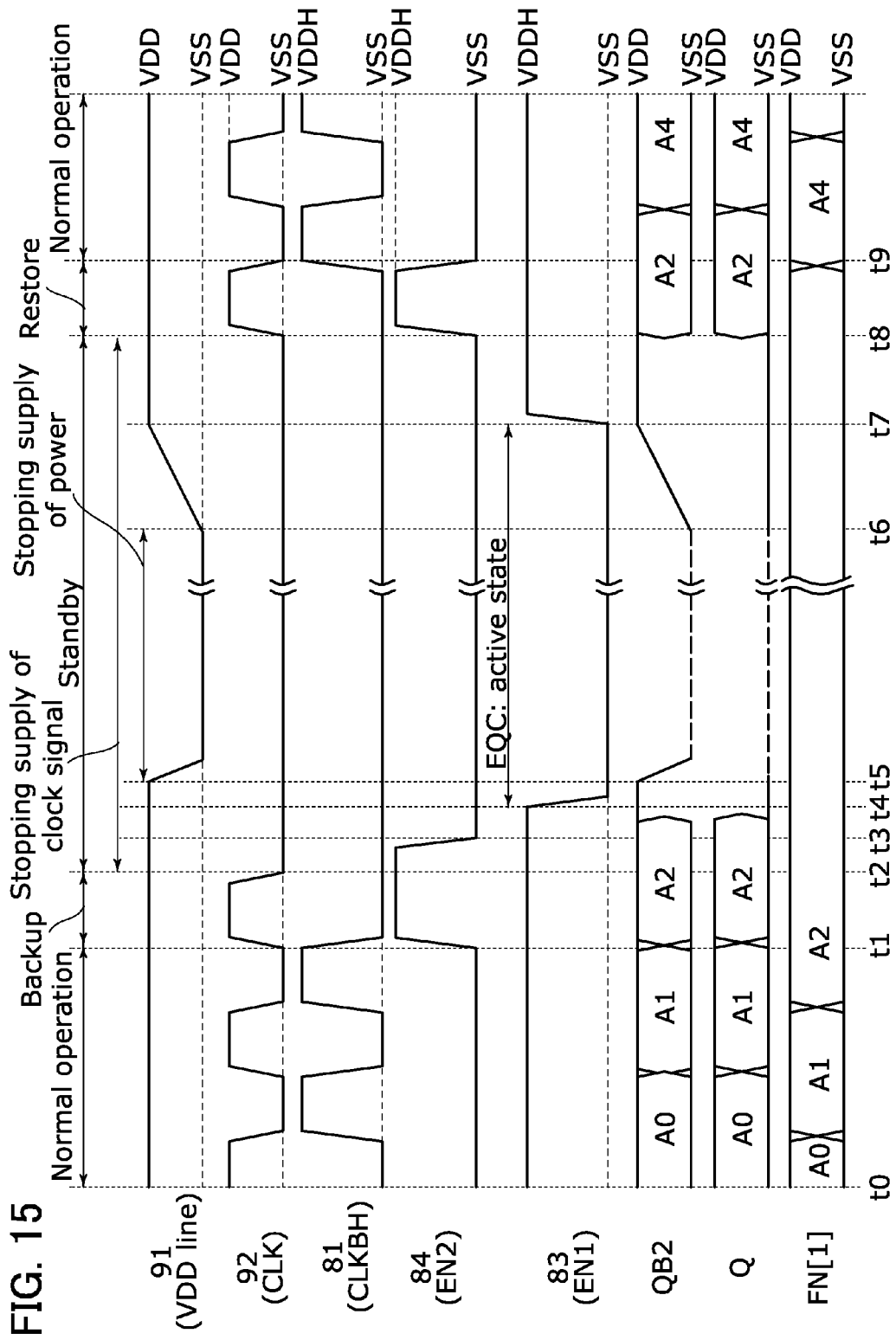
FIG. 15 is a timing chart illustrating an operation example of the logic circuit in FIG. 14.

FIG. 15 is a timing chart illustrating an operation example of the logic circuit 115. FIG. 15 shows waveforms of the potentials of the VDD line, the wiring 81, the wiring 83, the wiring 84, the wiring 92, the node FN[1], the node QB2, and the node Q. The logic circuit 115 can operate in a manner similar to that of the logic circuit 114. The biggest difference from the logic circuit 114 is that data of the node QB2 and data of the node Q2 are backed up to the RC 26[1] and the RC 26[2], respectively, when the logic circuit 115 is set in a standby state, and that the data of the node QB2 and the data of the node Q2 are restored to the RC 26[1] and the RC 26[2], respectively, when the logic circuit 115 is transferred to a normal operating state.

<Normal Operating State: t0 to t1, Backup: t1 to t2>

In normal operation, VDD and VSS are supplied to the logic circuit 115, and CLK, CLKBH, and the signal EN1 are input to the logic circuit 115. In addition, the signal EN2 is "L." Here, in a CLK active period (t1 to t2) immediately before power-off, the signal EN2 is set to "H" to perform backup operation.

The signal EN2 is raised at the time of raising CLK (at t1). Transistors M3[1] and M3 [2] are turned on when the signal EN2 is set to "H," so that the data of the node QB2 and the data of the node Q2 are written to the RC 26[1] and the RC 26[2], respectively. When CLK is set to a non-active state at t2, the data of the nodes QB2 and Q2 is defined. At t2, the logic circuit 115 is set in a standby state.

<Standby State: t2 to t8, Restore: t8 to t9>

At t3, the signal EN2 is set to "L." The transistors M3[1] and M3[2] are turned off, so that the RCs 26[1] and 26[2] are set in a data retention state. After the signal EN2 is set to "L," the EQC 25 is set in an active state at t4. At t5, the power supply is stopped.

At t6, the power supply is restarted. At t7, the EQC 25 is set in a non-active state. At t8, the input of a clock signal is restarted. Here, first, CLK is set in an active state. In a CLK active period (t8 to t9) immediately after power-on, restore operation is performed. From t8 to t9, the signal EN2 is set to "H" to turn on the transistor M3. When the data of the RCs 26[1] and 26[2] is written to the nodes QB2 and Q2, the states of the nodes QB2 and Q2 are returned to the states at t2, and the states of the nodes Q and QB are also returned to the states at t2. At t9, CLK and the signal EN2 are set to "L" to terminate the backup operation.

<Normal Operating State: at and After t9>

At t9, when CLKBH is set in an active state, normal operation is restarted.

The data retention performance of the RCs 21[1] and 21[2] is decreased when the capacitance of the capacitor C1 is made small; thus, data of FN[1] or FN[2] during a standby period might be lost. In the logic circuit 115, the states of the nodes QB2 and Q2 are returned by data of the RCs 26[1] and 26[2]; thus, the states of the nodes FN[1] and FN[2] at the restart of clock signal input (at t8) do not influence the operation of the logic circuit 115.

In other words, the data retention performance of the logic circuit 115 is set by the pair of RCs 26, and the write speed and read speed of the logic circuit 115 is set by the RC 21. In this manner, the logic circuit 115 can determine data retention performance and write/read performance separately.

The logic circuit 115 can obtain a nonvolatile logic circuit having a long state retention function. Note that in the logic circuit 115, the pair of RCs 26 operates for power gating; however, as illustrated in FIG. 15, overhead time for transfer to power-off can be made zero without any influence on normal operation. In addition, energy consumed by write and read operations of the pair of RCs 26 is energy for charging and discharging the capacitor C3 and thus is low like a DRAM. Thus, power consumption is hardly increased due to the pair of RCs 26. Furthermore, the pair of RCs 26 can be stacked in a region where a Si transistor is formed, so that the area of the circuit 35 can be reduced.

The number of transistors controlled by clock signals in the logic circuit in this embodiment is reduced, so that power consumption during operation can be reduced. In addition, since a retention circuit that retains data hardly consumes power in a standby state, power consumption in the standby state is low. Furthermore, overhead time due to power gating can be zero. Thus, the logic circuit in this embodiment is very suitable for normally-off computing. Even when the logic circuit in this embodiment is included, dynamic power is hardly increased. Power consumption can be reduced effectively by power gating.

The logic circuits 110 to 115 in this embodiment can be implemented as FFs in a variety of semiconductor devices. For example, the FFs account for a half of logic circuits in a processor core; thus, when the logic circuits in this embodiment are included, power consumption can be reduced effectively.

(Embodiment 2)

A semiconductor device including the logic circuit in Embodiment 1 is described.

<<Structure Example of Processing Unit>>

A processing unit (PU) includes a plurality of functional circuits integrated over one chip. A PU 200 in FIG. 16 includes a processor core 201, a power management unit (PMU) 202, a clock control circuit 203, a power supply line 210, power switches (PSW) 211 and 212, and a level shift circuit (LS) 215. VDD is input to the power supply line 210.

<Processor Core>

The processor core 201 has a function of executing an instruction and can also be referred to as an arithmetic processing circuit or a processor (processing unit). The processor core 201 includes an FF 220, a logic circuit 221, and the like, and a variety of functional circuits are formed using these circuits. The FF 220 retains output data of the logic circuit 221. For example, the FF 220 is included in a register. For example, the logic circuit 221 can be a combinational circuit.

The logic circuit in Embodiment 1 can be used as the FF 220. The FF 220 may be a scan FF. The FF 220 enables clock gating and power gating of the processor core 201; thus, the power consumption of the PU 200 can be reduced.

Figure 17:
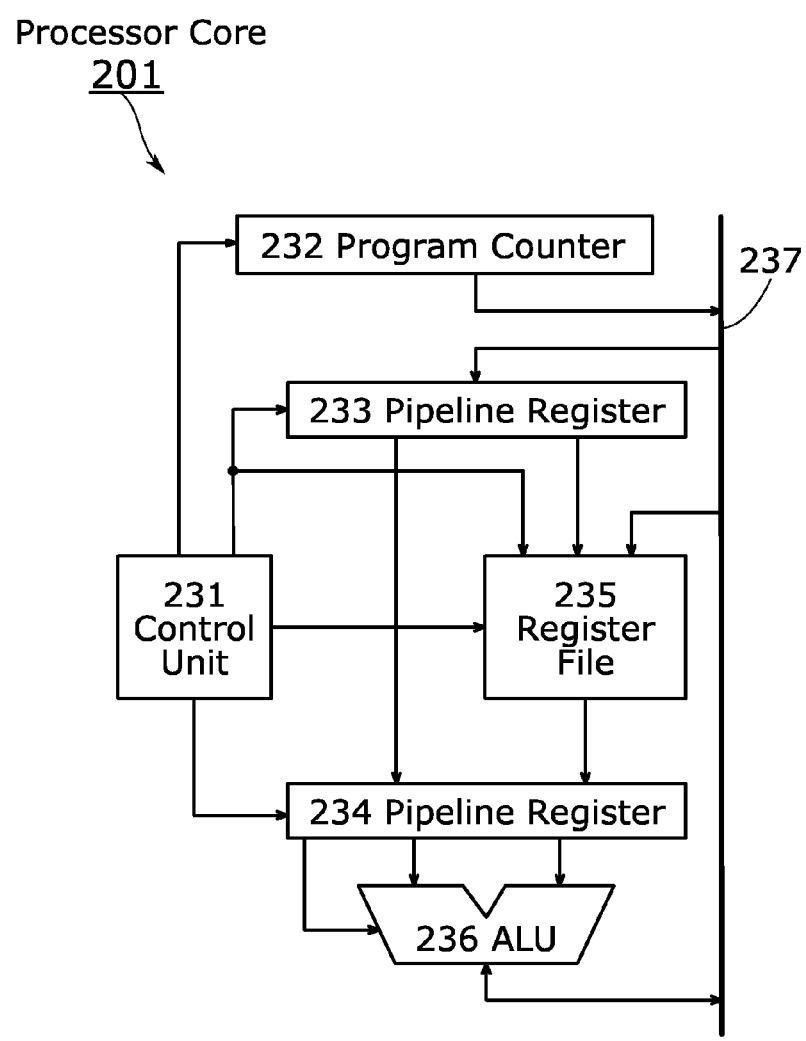
FIG. 17 is a block diagram illustrating a structure example of a processor core.

FIG. 17 illustrates a structure example of the processor core 201. The processor core 201 in FIG. 17 includes a control unit 231, a program counter 232, a pipeline register 233, a pipeline register 234, a register file 235, an arithmetic logic unit (ALU) 236, and a data bus 237. Data is transmitted between the processor core 201 and a peripheral circuit such as the PMU 202 or a cache through the data bus 237.

The control unit 231 has a function of decoding and executing instructions contained in a program such as input applications by controlling the overall operations of the program counter 232, the pipeline register 233, the pipeline register 234, the register file 235, the ALU 236, and the data bus 237. The ALU 236 has a function of performing a variety of arithmetic operations such as four arithmetic operations and logic operations. The program counter 232 is a register having a function of storing the address of an instruction to be executed next.

The pipeline register 233 has a function of temporarily storing instruction data. The register file 235 includes a plurality of registers including a general-purpose register and can store data read from a main memory, data obtained as a result of arithmetic operations in the ALU 236, or the like. The pipeline register 234 has a function of temporarily storing data used for arithmetic operations performed in the ALU 236, data obtained as a result of arithmetic operations in the ALU 236, or the like.

<Power Management>

The PMU 202 has a function of controlling power gating, clock gating, and the like. Specifically, the PMU 202 has a function of controlling the processor core 201, the PSWs 211 and 212, and the clock control circuit 203. For example, the PMU 202 controls the PSWs 211 and 212 and the clock control circuit 203 in response to an interrupt request signal INT.

The PMU 202 may include a timer circuit capable of measuring time. The PMU 202 may perform power management on the basis of data on time obtained by the timer circuit.

The LS 215 is provided to raise VDD to VDDH. The PSW 211 has a function of controlling the supply of VDD to the PU 200 in response to a control signal of the PMU 202. The PSW 212 has a function of controlling the supply of VDD to the LS 215 in response to a control signal of the PMU 202. When the supply of VDD to the LS 215 is stopped, the supply of VDDH to the processor core 201 is stopped.

The clock control circuit 203 has a function of generating and outputting a gated clock signal from a clock signal MCLK. The clock control circuit 203 has a function of stopping the supply of a clock signal to the processor core 201 in response to a control signal of the PMU 202. VDD is supplied from the power supply line 210 to the clock control circuit 203, and VDDH is supplied through an unillustrated level shift circuit.

For example, when the signal SLP is output from the processor core 201 to the PMU 202, the PU 200 is set in a standby state. The signal SLP is a trigger signal for transferring the processor core 201 to the standby state. The PMU 202 controls the clock control circuit 204 by the signal SLP and stops the output of a clock signal. Next, the PMU 202 controls the PSWs 211 and 212 and stops the supply of power.

Processing for restoring the processor core 201 from the sleep mode to the active mode is executed by input of the signal INT, for example. The PMU 202 controls the PSWs 211 and 212 by the signal INT and restarts the supply of power to the processor core 201. Next, the PMU 202 controls the clock control circuit 203 and restarts the supply of a clock signal.

(Embodiment 3)

In this embodiment, an oxide semiconductor, an OS transistor, and the like are described.

<Example of Method for Manufacturing Electronic Component>

Figure 18A:
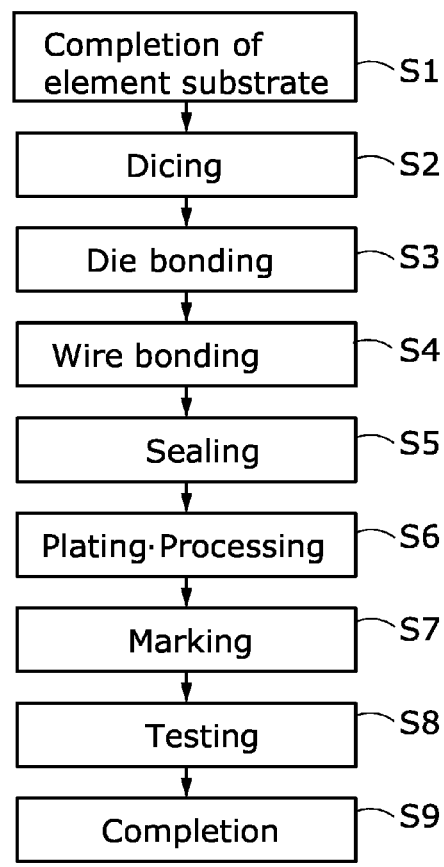
FIG. 18A is a flow chart showing an example of a method for manufacturing an electronic component.

FIG. 18A is a flow chart showing an example of a method for manufacturing an electronic component. The electronic component is also referred to as a semiconductor package, an IC package, or a package. This electronic component has a plurality of standards and names depending on a terminal extraction direction and a terminal shape. Examples of the electronic component are described in this embodiment.

A semiconductor device including a transistor is completed by integrating detachable components on a printed wiring board through an assembly process (post-process). The post-process can be finished through steps in FIG. 18A. Specifically, after an element substrate obtained in a wafer process is completed (Step S1), the substrate is divided into a plurality of chips in a dicing process (Step S2). Before the substrate is divided into the plurality of chips, the substrate is thinned to reduce warpage or the like of the substrate in the wafer process and to reduce the size of the electronic component.

The divided chips are picked up to be mounted on and bonded to a lead frame in a die bonding step (Step S3). In the die bonding step, the chip is bonded to the lead frame by an appropriate method depending on a product, for example, bonding with a resin or a tape. In the die bonding step, the chip may be mounted on an interposer to be bonded. In a wire bonding step, lead of the lead frame is electrically connected to an electrode on the chip with a metal fine line (wire) (Step S4). A silver line or a gold line can be used as the metal fine line. Either ball bonding or wedge bonding may be used as wire bonding.

A molding step is performed to seal the wire bonded chip with an epoxy resin or the like (Step S5). The lead of the lead frame is plated. After that, the lead is cut and processed (Step S6). This plating process prevents rust of the lead and facilitates soldering at the time of mounting the chip on a printed wiring board in a later step. Printing (marking) is performed on a surface of the package (Step S7). Through an inspection step (Step S8), the electronic component is completed (Step S9). When the electronic component includes the semiconductor device described in the above embodiment, a low-power small electronic component can be provided.

Figure 18B:
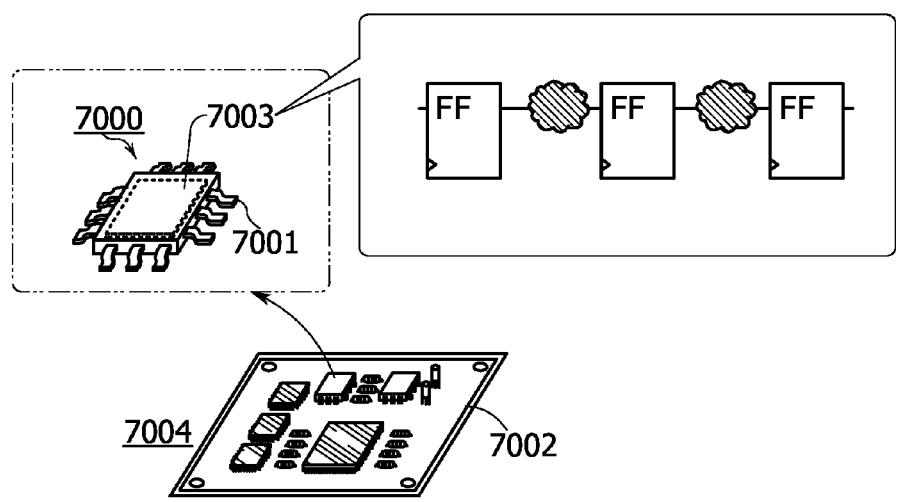
FIG. 18B is a schematic perspective view illustrating a structure example of the electronic component.

FIG. 18B is a schematic perspective view of the completed electronic component. FIG. 18B illustrates a quad flat package (QFP). An electronic component 7000 in FIG. 18B includes a lead 7001 and a circuit portion 7003. In the circuit portion 7003, for example, the logic circuits described in Embodiment 1 and other logic circuits are formed. The electronic component 7000 is mounted on a printed wiring board 7002, for example. When a plurality of electronic components 7000 are used in combination and electrically connected to each other over the printed wiring board 7002, the electronic components 7000 can be mounted on an electronic device. A completed circuit board 7004 is provided in the electronic device or the like. The electronic component 7000 can be used as, for example, a random access memory that stores data or a processing unit that executes a variety of processings, such as a CPU, a microcontroller unit (MCU), an FPGA, or a wireless IC. When an electronic device includes the electronic component 7000, the power consumption of the electronic device can be reduced. Alternatively, the electronic device can be have smaller size.

The electronic component 7000 can be used as an electronic component (IC chip) of electronic devices in a wide variety of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy. Examples of an electronic device including the electronic component 7000 include display devices, personal computers (PC), and image reproducing devices provided with recording media (devices which reproduce the content of recording media such as DVDs, Blu-ray discs, flash memories, and HDDs, and displays for displaying images). Other examples of an electronic device that can be equipped with the electronic component in one embodiment of the present invention include cellular phones, game machines including portable game machines, portable data appliances, e-book readers, cameras (e.g., video cameras and digital still cameras), wearable display devices (e.g., head mounted display devices, goggle-type display devices, glasses-type display devices, armband display devices, bracelet-type display devices, and necklace-type display devices), navigation systems, audio reproducing devices (e.g., car audio systems and digital audio players), copiers, facsimiles, printers, multi-function printers, automated teller machines (ATM), and vending machines. FIGS. 19A to 19F illustrate specific examples of such electronic devices.

Figure 19A:
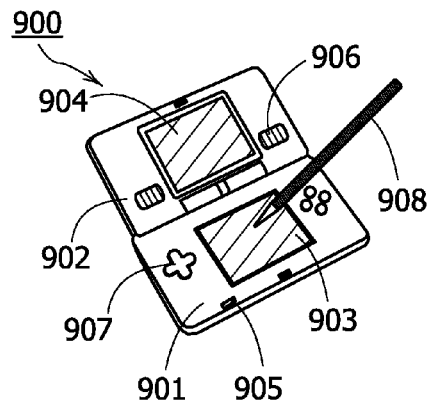
FIGS. 19A to 19F each illustrate an example of an electronic device.

A portable game machine 900 in FIG. 19A includes a housing 901, a housing 902, a display portion 903, a display portion 904, a microphone 905, a speaker 906, an operation key 907, a stylus 908, and the like.

Figure 19B:
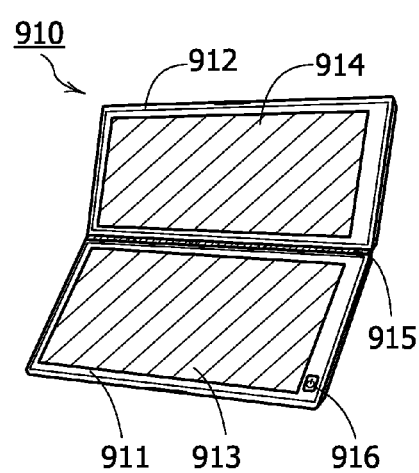

A portable information terminal 910 in FIG. 19B includes a housing 911, a housing 912, a display portion 913, a display portion 914, a joint 915, an operation key 916, and the like. The display portion 913 is provided in the housing 911, and the display portion 914 is provided in the housing 912. The housings 911 and 912 are connected to each other with the joint 915, and an angle between the housings 911 and 912 can be changed with the joint 915. An image displayed on the display portion 913 may be switched depending on the angle between the housings 911 and 912 at the joint 915. A display device with a touch panel may be used as the display portion 913 and/or the display portion 914.

Figure 19C:
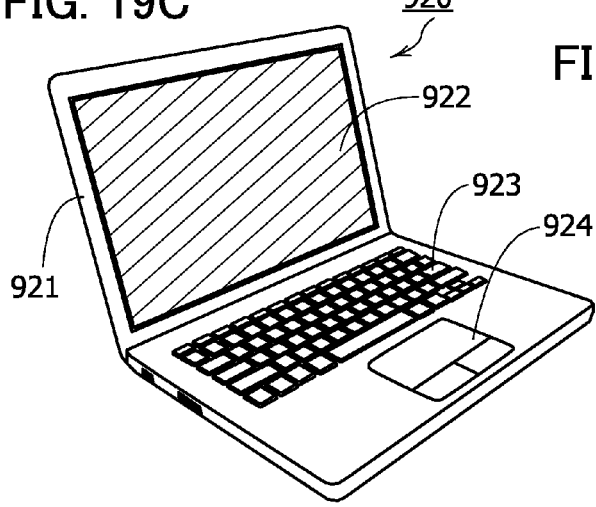

A laptop 920 in FIG. 19C includes a housing 921, a display portion 922, a keyboard 923, a pointing device 924, and the like.

Figure 19D:
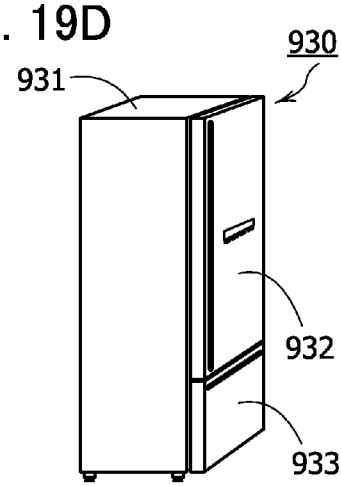

An electric refrigerator-freezer 930 in FIG. 19D includes a housing 931, a refrigerator door 932, a freezer door 933, and the like.

Figure 19E:
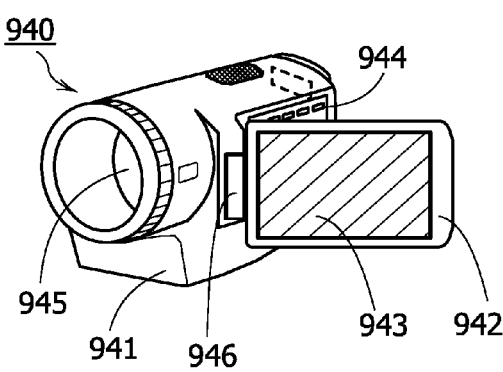

A video camera 940 in FIG. 19E includes a housing 941, a housing 942, a display portion 943, operation keys 944, a lens 945, a joint 946, and the like. The operation keys 944 and the lens 945 are provided in the housing 941, and the display portion 943 is provided in the housing 942. The housings 941 and 942 are connected to each other with the joint 946, and an angle between the housings 941 and 942 can be changed with the joint 946. The direction of an image displayed on the display portion 943 may be changed and display and non-display of an image may be switched depending on the angle between the housings 941 and 942, for example.

Figure 19F:
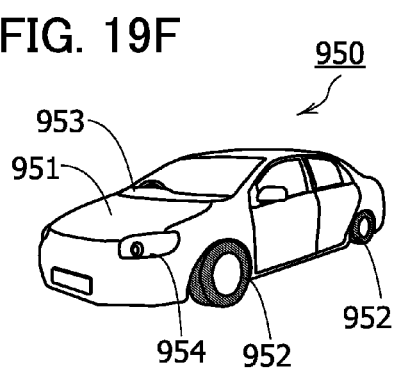

A motor vehicle 950 in FIG. 19F includes a car body 951, wheels 952, a dashboard 953, lights 954, and the like.

(Embodiment 4)

<<OS Transistor Structure Example 1>>

Figure 20A:
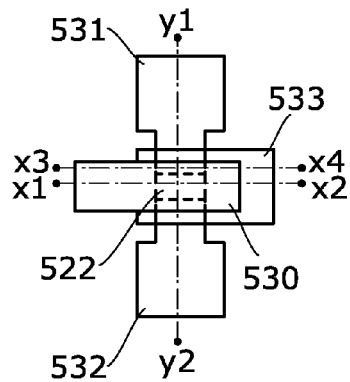
FIG. 20A is a top view illustrating a structure example of an OS transistor.
Figure 20B:
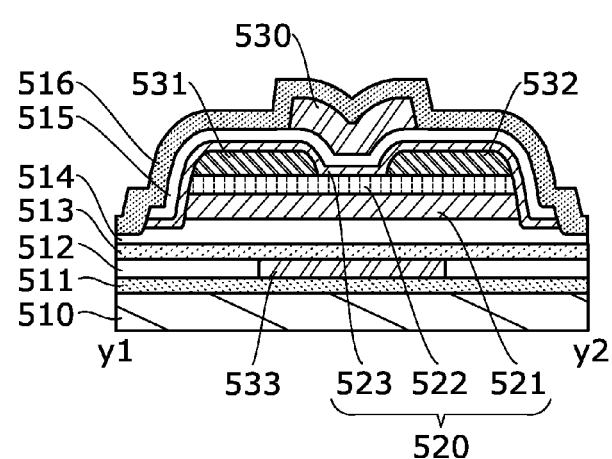
FIG. 20B is a cross-sectional view taken along line y1-y2 in FIG. 20A.
Figure 20C:
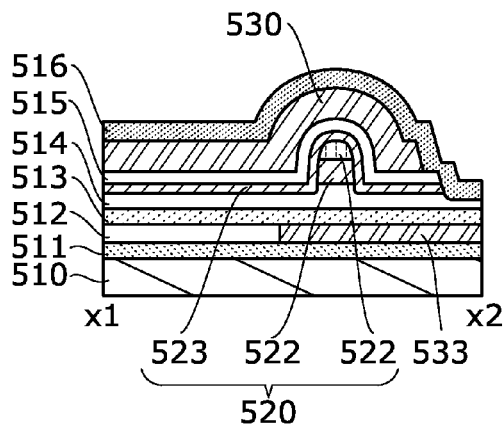
FIG. 20C is a cross-sectional view taken along line x1-x2 in FIG. 20A.
Figure 20D:
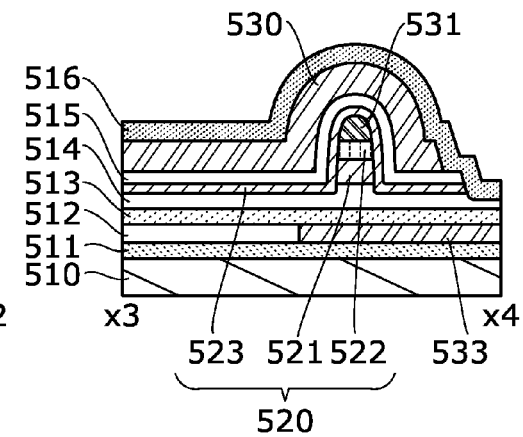
FIG. 20D is a cross-sectional view taken along line x3-x4 in FIG. 20A.

FIGS. 20A to 20D illustrate a structure example of an OS transistor. FIG. 20A is a top view illustrating a structure example of an OS transistor. FIG. 20B is a cross-sectional view taken along line y1-y2 in FIG. 20A. FIG. 20C is a cross-sectional view taken along line x1-x2 in FIG. 20A. FIG. 20D is a cross-sectional view taken along line x3-x4 in FIG. 20A. In some cases, the direction of line y1-y2 is referred to as a channel length direction, and the direction of line x1-x2 is referred to as a channel width direction. Accordingly, FIG. 20B illustrates a cross-sectional structure of the OS transistor in the channel length direction, and FIGS. 20C and 20D each illustrate a cross-sectional structure of the OS transistor in the channel width direction. Note that to clarify the device structure, FIG. 20A does not illustrate some components.

An OS transistor 501 is formed over an insulating surface, here, over an insulating layer 511. The insulating layer 511 is formed over a surface of a substrate 510. The OS transistor 501 is covered with an insulating layer 516. Note that the insulating layer 516 can be regarded as a component of the OS transistor 501. The OS transistor 501 includes an insulating layer 512, an insulating layer 513, an insulating layer 514, an insulating layer 515, semiconductor layers 521 to 523, a conductive layer 530, a conductive layer 531, a conductive layer 532, and a conductive layer 533. Here, the semiconductor layers 521 to 523 are collectively referred to as a semiconductor region 520.

The conductive layer 530 functions as a gate electrode, and the conductive layer 533 functions as a back gate electrode. The conductive layers 531 and 532 function as a source electrode and a drain electrode. The insulating layer 511 has a function of electrically isolating the substrate 510 from the conductive layer 533. The insulating layer 515 serves as a gate insulating layer, and the insulating layers 513 and 514 serve as gate insulating layers on a backchannel side.

The channel length refers to, for example, a distance between a source (a source region or a source electrode) and a drain (a drain region or a drain electrode) in a region where a semiconductor (or a portion where current flows in a semiconductor when a transistor is on) and a gate electrode overlap with each other or in a region where a channel is formed in a top view of the transistor. In one transistor, channel lengths in all regions are not necessarily the same. In other words, the channel length of one transistor is not fixed to one value in some cases. Therefore, in this specification and the like, the channel length is any one of values, the maximum value, the minimum value, or the average value in a region where a channel is formed.

The channel width refers to, for example, the length of a portion where a source and a drain face each other in a region where a semiconductor (or a portion where current flows in a semiconductor when a transistor is on) and a gate electrode overlap with each other or a region where a channel is formed. In one transistor, channel widths in all regions do not necessarily have the same value. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is sometimes different from a channel width shown in a top view of a transistor (hereinafter referred to as an apparent channel width). For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is increased in some cases. In that case, an effective channel width obtained when a channel is actually formed is greater than an apparent channel width shown in the top view.

In a transistor having a three-dimensional structure, measuring an effective channel width is difficult in some cases. For example, to estimate an effective channel width from a design value, it is necessary to assume that the shape of a semiconductor is known. Therefore, in the case where the shape of a semiconductor is not known accurately, measuring an effective channel width accurately is difficult.

Accordingly, in this specification, in a top view of a transistor, an apparent channel width that is the length of a portion where a source and a drain face each other in a region where a semiconductor and a gate electrode overlap with each other is referred to as a surrounded channel width (SCW) in some cases. Furthermore, in this specification, the term "channel width" may denote a surrounded channel width, an apparent channel width, or an effective channel width. Note that the values of a channel length, a channel width, an effective channel width, an apparent channel width, a surrounded channel width, and the like can be determined by obtaining and analyzing a cross-sectional TEM image and the like.

A surrounded channel width may be used to calculate field-effect mobility, a current value per channel width, and the like of a transistor. In this case, the obtained value is sometimes different from the value obtained by using an effective channel width for the simulation.

As illustrated in FIGS. 20B and 20C, the semiconductor region 520 includes a region where the semiconductor layer 521, the semiconductor layer 522, and the semiconductor layer 523 are stacked in that order. The insulating layer 515 covers this stack region. The conductive layer 530 overlaps with the stack region with the insulating layer 513 positioned therebetween. The conductive layers 531 and 532 are provided over the stack formed of the semiconductor layers 521 and 523 and are in contact with a top surface of this stack and a side surface positioned in the channel length direction of the stack. The stack of the semiconductor layers 521 and 522 and the conductive layers 531 and 532 are formed by etching using the same mask.

The semiconductor layer 523 is formed to cover the semiconductor layers 521 and 522 and the conductive layers 531 and 532. The insulating layer 515 covers the semiconductor layer 523. Here, the semiconductor layer 523 and the insulating layer 515 are etched using the same mask.

The conductive layer 530 is formed to surround, in the channel width direction, the region where the semiconductor layers 521 to 523 are stacked with the insulating layer 515 positioned therebetween (see FIG. 20C). Therefore, a gate electric field in a vertical direction and a gate electric field in a lateral direction are applied to this stack region. In the OS transistor 501, the gate electric field refers to an electric field generated by voltage applied to the conductive layer 530 (gate electrode layer). Accordingly, the whole stack region of the semiconductor layers 521 to 523 can be electrically surrounded by the gate electric fields, so that a channel is formed in the whole semiconductor layer 522 (bulk) in some cases. A device structure of a transistor in which, like the transistor 501, a semiconductor layer where a channel is formed is electrically surrounded by electric fields of a gate electrode can be called a surrounded channel (s-channel) structure. Thus, the OS transistor 501 can have high on-state current. The s-channel structure can improve frequency characteristics of the OS transistor 501. Specifically, the s-channel structure can improve cutoff frequency.

The s-channel structure, because of its high on-state current, is suitable for a semiconductor device such as large-scale integration (LSI) that needs a scaled down transistor. Since high on-state current can be obtained, the s-channel structure is suitable for a transistor that needs to operate at high frequency. A semiconductor device including the transistor can operate at high frequency.

Scaling down of the OS transistor can provide a small highly integrated semiconductor device. The OS transistor preferably has, for example, a region where channel length is greater than or equal to 10 nm and less than 1 μm, more preferably greater than or equal to 10 nm and less than 100 nm, still more preferably greater than or equal to 10 nm and less than 70 nm, yet still more preferably greater than or equal to 10 nm and less than 60 nm, even still more preferably greater than or equal to 10 nm and less than 30 nm. In addition, the OS transistor preferably has, for example, a region where channel width is greater than or equal to 10 nm and less than 1 μm, more preferably greater than or equal to 10 nm and less than 100 nm, still more preferably greater than or equal to 10 nm and less than 70 nm, yet still more preferably greater than or equal to 10 nm and less than 60 nm, even still more preferably greater than or equal to 10 nm and less than 30 nm.

<Insulating Layer>

The insulating layers 511 to 516 are each formed using an insulating film having a single-layer structure or a layered structure. Examples of the material of an insulating film include aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

In this specification, an oxynitride refers to a substance that includes more oxygen than nitrogen, and a nitride oxide refers to a substance that includes more nitrogen than oxygen. In this specification and the like, an oxide whose nitrogen concentration is lower than 1 atomic % is also used as an insulating material.

The insulating layers 514 and 515 each preferably contain an oxide because they are in contact with the semiconductor region 520. In particular, the insulating layers 514 and 515 each preferably contain an oxide material from which part of oxygen is released by heating. The insulating layers 514 and 515 each preferably contain an oxide containing oxygen more than that in the stoichiometric composition. Part of oxygen is released by heating from an oxide film containing oxygen more than that in the stoichiometric composition. Oxygen released from the insulating layers 514 and 515 is supplied to the semiconductor region 520 that is an oxide semiconductor, so that oxygen vacancies in the oxide semiconductor can be reduced. Consequently, changes in the electrical characteristics of the transistor can be reduced and the reliability of the transistor can be improved.

The oxide film containing oxygen more than that in the stoichiometric composition is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

The insulating layer 513 has a passivation function for preventing oxygen contained in the insulating layer 514 from being bonded to metal contained in the conductive layer 533 and being decreased. The insulating layer 516 has a passivation function for preventing oxygen contained in the insulating layer 514 from being decreased.

The insulating layers 511, 513, and 516 each preferably have a function of blocking oxygen, hydrogen, water, an alkali metal, an alkaline earth metal, and the like. The insulating layers 511, 513, and 516 can prevent outward diffusion of oxygen from the semiconductor region 520 and entry of hydrogen, water, or the like into the semiconductor region 520 from the outside. The insulating layers 511, 513, and 516 may each be formed using, for example, at least one insulating film of silicon nitride, silicon nitride oxide, aluminum nitride, aluminum nitride oxide, aluminum oxide, aluminum oxynitride, gallium oxide, gallium oxynitride, yttrium oxide, yttrium oxynitride, hafnium oxide, hafnium oxynitride, or the like so that they can have such a function.

<Conductive Layer>

Each of the conductive layers 530 to 533 preferably has a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr); an alloy of such a low-resistance material; or a compound containing such a material as its main component. It is particularly preferable to use a high-melting-point material that has heat resistance and conductivity, such as tungsten or molybdenum. Each of the conductive layers 530 to 533 is preferably formed using a low-resistance conductive material such as aluminum or copper. Each of the conductive layers 530 to 533 is particularly preferably formed using a Cu—Mn alloy because manganese oxide formed at the interface with an insulator containing oxygen has a function of preventing Cu diffusion.

The conductive layers 531 and 532 in the OS transistor 502 are formed using a hard mask used for forming the stack of the semiconductor layers 521 and 522. Therefore, the conductive layers 531 and 532 do not have regions in contact with the side surfaces of the semiconductor layers 521 and 522. For example, through the following steps, the semiconductor layers 521 and 522 and the conductive layers 531 and 532 can be formed. A two-layer oxide semiconductor film including the semiconductor layers 521 and 522 is formed. A single-layer or multi-layer conductive film is formed over the oxide semiconductor film. This conductive film is etched, so that a hard mask is formed. Using this hard mask, the two-layer oxide semiconductor film is etched to form the semiconductor layers 521 and 522. Then, the hard mask is etched to form the conductive layers 531 and 532.

<Semiconductor Layer>

The semiconductor layer 522 is an oxide semiconductor containing indium (In), for example. The semiconductor layer 522 can have high carrier mobility (electron mobility) by containing indium, for example. The semiconductor layer 522 preferably contains an element M. The element M is preferably aluminum (Al), gallium (Ga), yttrium (Y), tin (Sn), or the like. Other elements that can be used as the element M are boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), and the like. Note that two or more of these elements may be used in combination as the element M. The element M is an element having high bonding energy with oxygen, for example. The element M is an element whose bonding energy with oxygen is higher than that of indium, for example. The element M is an element that can increase the energy gap of the oxide semiconductor, for example. Furthermore, the semiconductor layer 522 preferably contains zinc (Zn). When the oxide semiconductor contains zinc, the oxide semiconductor is easily to be crystallized in some cases.

The semiconductor layer 522 is not limited to the oxide semiconductor containing indium. The semiconductor layer 522 may be an oxide semiconductor which does not contain indium and contains at least one of zinc, gallium, and tin (e.g., a zinc tin oxide or a gallium tin oxide). For the semiconductor layer 522, an oxide with a wide energy gap is used, for example. The energy gap of the semiconductor layer 522 is, for example, greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV. The semiconductor region 520 is preferably using a CAAC-OS described later. Alternatively, at least the semiconductor layer 522 is preferably using a CAAC-OS.

For example, the semiconductor layers 521 and 523 include one or more, or two or more elements other than oxygen included in the semiconductor layer 522. Since the semiconductor layers 521 and 523 include one or more, or two or more elements other than oxygen included in the semiconductor layer 522, an interface state is less likely to be formed at an interface between the semiconductor layers 521 and 522 and an interface between the semiconductor layers 522 and 523.

In the case of using an In-M-Zn oxide as the semiconductor layer 521, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. When the semiconductor layer 521 is formed by sputtering, a sputtering target with the above composition is preferably used. For example, In:M:Zn is preferably 1:3:2.

In the case of using an In-M-Zn oxide as the semiconductor layer 522, when the total proportion of In and M is assumed to be 100 atomic %, the proportions of In and M are preferably set to be higher than 25 atomic % and lower than 75 atomic %, respectively, more preferably higher than 34 atomic % and lower than 66 atomic %, respectively. When the semiconductor layer 522 is formed by sputtering, a sputtering target with the above composition is preferably used. For example, In:M:Zn is preferably 1:1:1, 1:1:1.2, 2:1:3, 3:1:2, or 4:2:4.1. In particular, when a sputtering target with an atomic ratio of In to Ga and Zn of 4:2:4.1 is used, the atomic ratio of In to Ga and Zn in the semiconductor layer 522 may be 4:2:3 or in the neighborhood of 4:2:3.

In the case of using an In-M-Zn oxide as the semiconductor layer 523, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. The semiconductor layer 523 may be an oxide that is the same type as that of the semiconductor layer 521. Note that the semiconductor layer 521 and/or the semiconductor layer 523 does not necessarily contain indium in some cases. For example, the semiconductor layer 521 and/or the semiconductor layer 523 may be gallium oxide.

<Energy Band Structure>

Figure 21A:
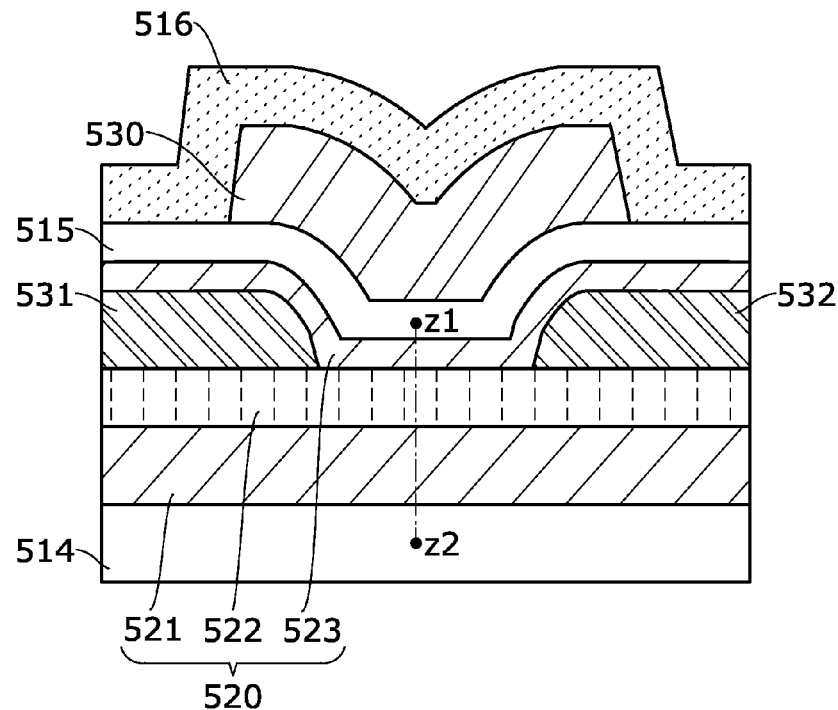
FIG. 21A is a partial enlarged view of the OS transistor in FIG. 20B.
Figure 21B:
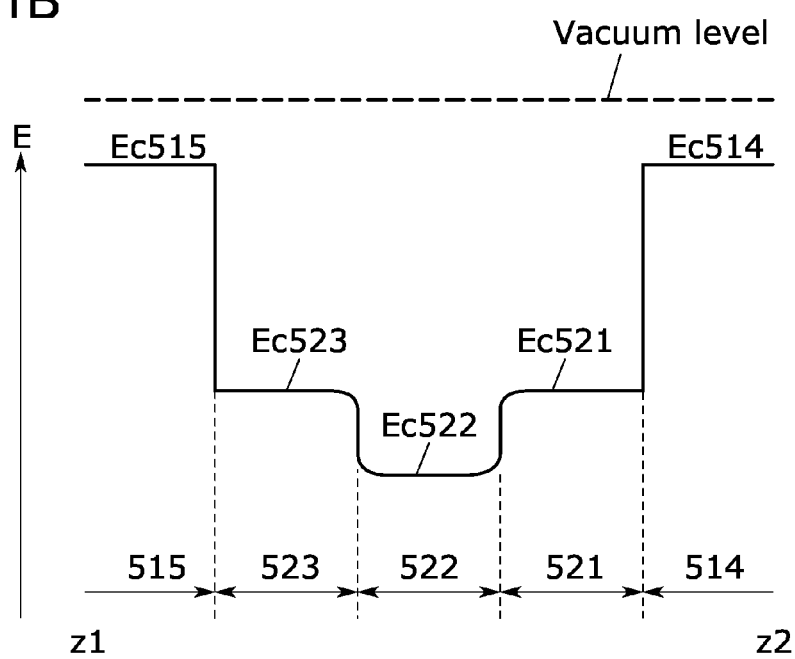
FIG. 21B is an energy band diagram of the OS transistor.

The function and effect of the semiconductor region 520 in which the semiconductor layers 521, 522, and 523 are stacked are described with reference to FIGS. 21A and 21B. FIG. 21A is a partial enlarged view of an active layer (channel region) of the OS transistor 501 in FIG. 20B. FIG. 21B shows an energy band structure of a portion taken along dotted line z1-z2 (the active layer of the OS transistor 501) in FIG. 21A.

In FIG. 21B, Ec514, Ec521, Ec522, Ec523, and Ec515 indicate the energy at the bottom of the conduction band of the insulating layer 514, the semiconductor layer 521, the semiconductor layer 522, the semiconductor layer 523, and the insulating layer 515, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). The energy gap can be measured using a spectroscopic ellipsometer. The energy difference between the vacuum level and the top of the valence band can be measured using an ultraviolet photoelectron spectroscopy (UPS) device.

Since the insulating layer 514 and the insulating layer 515 are insulators, Ec514 and Ec515 are closer to the vacuum level than Ec521, Ec522, and Ec523 (i.e., the insulating layer 515 and the insulating layer 516 have a lower electron affinity than the semiconductor layers 521, 522, and 523).

The semiconductor layer 522 is an oxide layer having higher electron affinity than those of the semiconductor layers 521 and 523. For example, as the semiconductor layer 522, an oxide having an electron affinity higher than those of the semiconductor layers 521 and 523 by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that electron affinity is an energy gap between the vacuum level and the bottom of the conduction band.

An indium gallium oxide has low electron affinity and a high oxygen-blocking property. Therefore, the semiconductor layer 523 preferably includes an indium gallium oxide. The gallium atomic ratio [Ga/(In+Ga)] is, for example, higher than or equal to 70%, preferably higher than or equal to 80%, more preferably higher than or equal to 90%. At this time, when gate voltage is applied, a channel is formed in the semiconductor layer 522 having the highest electron affinity among the semiconductor layers 521 to 523.

In some cases, there is a mixed region of the semiconductor layers 521 and 522 between the semiconductor layers 521 and 522. Furthermore, in some cases, there is a mixed region of the semiconductor layers 522 and 523 between the semiconductor layers 522 and 523. Because the mixed region has low interface state density, a stack of the semiconductor layers 521 to 523 has a band structure where energy at each interface and in the vicinity of the interface is changed continuously (continuous junction).

At this time, electrons move mainly in the semiconductor layer 522, not in the semiconductor layers 521 and 523. As described above, when the interface state density at the interface between the semiconductor layers 521 and 522 and the interface state density at the interface between the semiconductor layers 522 and 523 are decreased, electron movement in the semiconductor layer 522 is less likely to be inhibited and the on-sate current of the transistor can be increased.

As factors of inhibiting electron movement are decreased, the on-state current of the transistor can be increased. For example, in the case where there is no factor of inhibiting electron movement, electrons are assumed to be moved efficiently. Electron movement is inhibited, for example, in the case where physical unevenness in a channel formation region is large. The electron movement is also inhibited, for example, in the case where the density of defect states is high in the channel formation region.

To increase the on-state current of the OS transistor 501, for example, root mean square (RMS) roughness with a measurement area of 1 μm×1 μm of a top surface or a bottom surface of the semiconductor layer 522 (a formation surface; here, the OS layer 521) is less than 1 nm, preferably less than 0.6 nm, more preferably less than 0.5 nm, still more preferably less than 0.4 nm. The average surface roughness (Ra) with the measurement area of 1 μm×1 μm is less than 1 nm, preferably less than 0.6 nm, more preferably less than 0.5 nm, still more preferably less than 0.4 nm. The maximum difference (P–V) with the measurement area of 1 μm×1 μm is less than 10 nm, preferably less than 9 nm, more preferably less than 8 nm, still more preferably less than 7 nm. RMS roughness, Ra, and P-V can be measured using a scanning probe microscope.

For example, in the case where the semiconductor layer 522 contains oxygen vacancies ($V_O$), donor levels are formed by entry of hydrogen into sites of oxygen vacancies in some cases. A state in which hydrogen enters sites of oxygen vacancies is denoted by $V_OH$ in the following description in some cases. $V_OH$ is a factor of decreasing the on-state current of the transistor because $V_OH$ scatters electrons. Note that sites of oxygen vacancies become more stable by entry of oxygen than by entry of hydrogen. Thus, by decreasing oxygen vacancies in the semiconductor layer 522, the on-state current of the transistor can be increased in some cases.

For example, at a certain depth in the semiconductor layer 522 or in a certain region of the semiconductor layer 522, the concentration of hydrogen measured by secondary ion mass spectrometry (SIMS) is set to be higher than or equal to $1 \times 10^{16}$ atoms/cm$^3$ and lower than or equal to $2 \times 10^{20}$ atoms/cm$^3$, preferably higher than or equal to $1 \times 10^{16}$ atoms/cm$^3$ and lower than or equal to $5 \times 10^{19}$ atoms/cm$^3$, more preferably higher than or equal to $1 \times 10^{16}$ atoms/cm$^3$ and lower than or equal to $1 \times 10^{19}$ atoms/cm$^3$, still more preferably higher than or equal to $1 \times 10^{16}$ atoms/cm$^3$ and lower than or equal to $5 \times 10^{18}$ atoms/cm$^3$.

To decrease oxygen vacancies in the semiconductor layer 522, for example, there is a method in which excess oxygen in the insulating layer 514 is moved to the semiconductor layer 522 through the semiconductor layer 521. In that case, the semiconductor layer 521 is preferably a layer having an oxygen-transmitting property (a layer through which oxygen is transmitted).

In the case where the OS transistor 501 has an s-channel structure, a channel is formed in the entire semiconductor layer 522. Therefore, as the semiconductor layer 522 has larger thickness, a channel region becomes larger. In other words, the thicker the semiconductor layer 522 is, the larger the on-state current of the OS transistor 501 is.

Moreover, the thickness of the semiconductor layer 523 is preferably as small as possible to increase the on-state current of the OS transistor 501. For example, the semiconductor layer 523 has a region with a thickness of less than 10 nm, preferably less than or equal to 5 nm, more preferably less than or equal to 3 nm. Meanwhile, the semiconductor layer 523 has a function of blocking entry of elements other than oxygen (such as hydrogen and silicon) included in the adjacent insulator into the semiconductor layer 522 where a channel is formed. Thus, the semiconductor layer 523 preferably has a certain thickness. For example, the semiconductor layer 523 may have a region with a thickness of greater than or equal to 0.3 nm, preferably greater than or equal to 1 nm, more preferably greater than or equal to 2 nm. The semiconductor layer 523 preferably has an oxygen blocking property to inhibit outward diffusion of oxygen released from the insulating layer 513 and the like.

To improve reliability of the OS transistor 501, preferably, the thickness of the semiconductor layer 521 is large and the thickness of the semiconductor layer 523 is small. For example, the semiconductor layer 521 has a region with a thickness of greater than or equal to 10 nm, preferably greater than or equal to 20 nm, more preferably greater than or equal to 40 nm, still more preferably greater than or equal to 60 nm. When the thickness of the semiconductor layer 521 is made large, a distance from an interface between the adjacent insulator and the semiconductor layer 521 to the semiconductor layer 522 in which a channel is formed can be large. Note that the semiconductor layer 521 has a region with a thickness of, for example, less than or equal to 200 nm, preferably less than or equal to 120 nm, more preferably less than or equal to 80 nm because the productivity of the semiconductor device might be decreased.

In order that the OS transistor 501 have stable electrical characteristics, it is effective to make the semiconductor layer 522 intrinsic or substantially intrinsic by reducing the concentration of impurities in the semiconductor region 520. Note that in this specification and the like, the carrier density of a substantially intrinsic oxide semiconductor film is higher than or equal to $1 \times 10^{-9}$/cm$^3$ and lower than $8 \times 10^{11}$/cm$^3$, preferably lower than $1 \times 10^{11}$/cm$^3$, more preferably lower than $1 \times 10^{10}$/cm$^3$.

In the oxide semiconductor, hydrogen, nitrogen, carbon, silicon, and a metal element other than a main component are impurities. For example, hydrogen and nitrogen form donor levels to increase the carrier density, and silicon forms impurity levels in the oxide semiconductor. The impurity levels serve as traps and might cause the electric characteristics of the transistor to deteriorate. Therefore, it is preferable to reduce the concentration of the impurities in the semiconductor layers 521, 522, and 523 and at interfaces between the semiconductor layers.

For example, a region in which the concentration of silicon is higher than or equal to $1 \times 10^{16}$ atoms/cm$^3$ and lower than $1 \times 10^{19}$ atoms/cm$^3$ is provided between the semiconductor layers 521 and 522. The concentration of silicon is preferably higher than or equal to $1 \times 10^{16}$ atoms/cm$^3$ and lower than $5 \times 10^{18}$ atoms/cm$^3$, more preferably higher than or equal to $1 \times 10^{16}$ atoms/cm$^3$ and lower than $2 \times 10^{18}$ atoms/cm$^3$. A region in which the concentration of silicon is higher than or equal to $1 \times 10^{16}$ atoms/cm$^3$ and lower than $1 \times 10^{19}$ atoms/cm$^3$ is provided between the semiconductor layers 522 and 523. The concentration of silicon is preferably higher than or equal to $1 \times 10^{16}$ atoms/cm$^3$ and lower than $5 \times 10^{18}$ atoms/cm$^3$, more preferably higher than or equal to $1 \times 10^{16}$ atoms/cm$^3$ and lower than $2 \times 10^{18}$ atoms/cm$^3$. The concentration of silicon can be measured by SIMS.

It is preferable to reduce the concentration of hydrogen in the semiconductor layers 521 and 523 in order to reduce the concentration of hydrogen in the semiconductor layer 522. The semiconductor layers 521 and 523 each have a region in which the concentration of hydrogen is higher than or equal to $1 \times 10^{16}$ atoms/cm$^3$ and lower than or equal to $2 \times 10^{20}$ atoms/cm$^3$. The concentration of hydrogen is preferably higher than or equal to $1 \times 10^{16}$ atoms/cm$^3$ and lower than or equal to $5 \times 10^{19}$ atoms/cm$^3$, more preferably higher than or equal to $1 \times 10^{16}$ atoms/cm$^3$ and lower than or equal to $1 \times 10^{19}$ atoms/cm$^3$, still more preferably higher than or equal to $1 \times 10^{16}$ atoms/cm$^3$ and lower than or equal to $5 \times 10^{18}$ atoms/cm$^3$. The concentration of hydrogen can be measured by SIMS.

It is preferable to reduce the concentration of nitrogen in the semiconductor layers 521 and 523 in order to reduce the concentration of nitrogen in the semiconductor layer 522. The semiconductor layers 521 and 523 each have a region in which the concentration of nitrogen is higher than or equal to $1 \times 10^{16}$ atoms/cm$^3$ and lower than $5 \times 10^{19}$ atoms/cm$^3$. The concentration of nitrogen is preferably higher than or equal to $1 \times 10^{16}$ atoms/cm$^3$ and lower than or equal to $5 \times 10^{18}$ atoms/cm$^3$, more preferably higher than or equal to $1 \times 10^{16}$ atoms/cm$^3$ and lower than or equal to $1 \times 10^{18}$ atoms/cm$^3$, still more preferably higher than or equal to $1 \times 10^{16}$ atoms/cm$^3$ and lower than or equal to $5 \times 10^{17}$ atoms/cm$^3$. The concentration of nitrogen can be measured by SIMS.

A transistor in which the above highly purified oxide semiconductor is used for a channel formation region exhibits extremely low off-state current. When voltage between a source and a drain is set at about 0.1 V, 5 V, or 10 V, for example, the off-state current standardized on the channel width of the transistor can be as low as several yoctoamperes per micrometer to several zeptoamperes per micrometer.

FIGS. 20A to 20D illustrate examples in which the semiconductor region 520 has a three-layer structure; however, one embodiment of the present invention is not limited thereto. For example, the semiconductor region 520 may have a two-layer structure without the semiconductor layer 521 or 523. Alternatively, the semiconductor region 520 can have a four-layer structure in which a semiconductor layer similar to the semiconductor layers 521 to 523 is provided over or below the semiconductor layer 521 or over or below the semiconductor layer 523. Alternatively, the semiconductor region 520 can have an n-layer structure (n is an integer of 5 or more) in which semiconductor layers similar to the semiconductor layers 521 to 523 are provided at two or more of the following positions: over the semiconductor layer 521, below the semiconductor layer 521, over the semiconductor layer 523, and below the semiconductor layer 523.

In the case where the OS transistor 501 has no back gate electrode, the conductive layer 533 is not necessarily provided. In that case, the insulating layers 512 and 513 are not provided, and the insulating layer 513 is formed over the insulating layer 511.

<Substrate>

As the substrate 510, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate can be used, for example. As the semiconductor substrate, a semiconductor substrate of silicon, germanium, or the like, or a compound semiconductor substrate of silicon carbide, silicon germanium, gallium arsenide, indium phosphide, zinc oxide, or gallium oxide can be used, for example. The semiconductor substrate may be a bulk semiconductor substrate or may be a silicon on insulator (SOI) substrate in which a semiconductor layer is provided for a semiconductor substrate with an insulating region positioned therebetween. As the conductor substrate, a graphite substrate, a metal substrate, an alloy substrate, a conductive resin substrate, or the like can be used. A substrate including a metal nitride, a substrate including a metal oxide, or the like can be used. An insulator substrate provided with a conductor or a semiconductor, a semiconductor substrate provided with a conductor or an insulator, a conductor substrate provided with a semiconductor or an insulator, or the like can be used. Alternatively, any of these substrates over which an element is provided may be used. As the element provided over the substrate, a capacitor, a resistor, a switching element, a light-emitting element, a memory element, or the like can be used.

A flexible substrate may be used as the substrate 510. As a method for providing a transistor over a flexible substrate, there is a method in which a transistor is formed over a non-flexible substrate (e.g., a semiconductor substrate), and then the transistor is separated and transferred to the substrate 510 that is a flexible substrate. In that case, a separation layer is preferably provided between the non-flexible substrate and the transistor. As the substrate 510, a sheet, a film, or foil containing a fiber may be used. The substrate 510 may have elasticity. The substrate 510 may have a property of returning to its original shape when bending or pulling is stopped. Alternatively, the substrate 510 may have a property of not returning to its original shape. The thickness of the substrate 510 is, for example, greater than or equal to 5 µm and less than or equal to 700 µm, preferably greater than or equal to 10 µm and less than or equal to 500 µm, more preferably greater than or equal to 15 µm and less than or equal to 300 µm. When the substrate 510 has small thickness, the weight of the semiconductor device can be reduced. When the substrate 510 has small thickness, even in the case of using glass or the like, the substrate 510 may have elasticity or a property of returning to its original shape when bending or pulling is stopped. Therefore, an impact applied to the semiconductor device over the substrate 510, which is caused by dropping or the like, can be reduced. That is, a durable semiconductor device can be provided.

For the flexible substrate 510, metal, an alloy, resin, glass, or fiber thereof can be used, for example. The flexible substrate preferably has a lower coefficient of linear expansion because deformation due to an environment is suppressed. The flexible substrate is preferably formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used as the material of the flexible substrate because of its low coefficient of linear expansion.

<<OS Transistor Structure Example 2>>

Figure 22A:
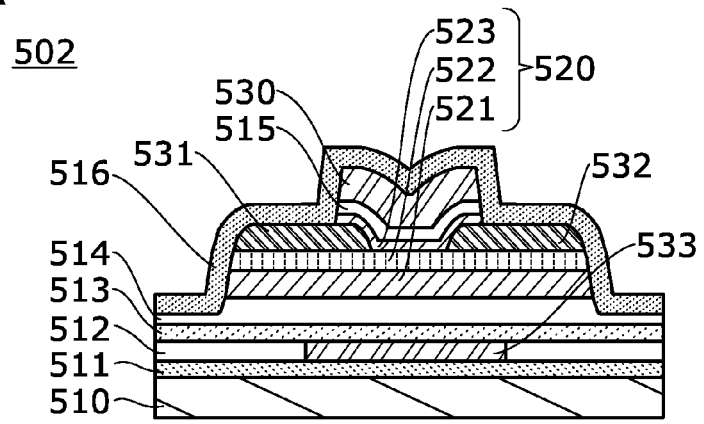
FIGS. 22A to 22C are cross-sectional views each illustrating a structure example of an OS transistor.

In steps of manufacturing the OS transistor 501 in FIGS. 20A to 20D, the semiconductor layer 523 and the insulating layer 515 can be etched using the conductive layer 530 as a mask. FIG. 22A illustrates a structure example of an OS transistor manufactured through such steps. In the OS transistor 502 in FIG. 22A, end portions of the semiconductor layer 523 and the insulating layer 515 are substantially aligned with an end portion of the conductive layer 530. The semiconductor layer 523 and the insulating layer 515 are provided only below the conductive layer 530.

<<OS Transistor Structure Example 3>>

Figure 22B:
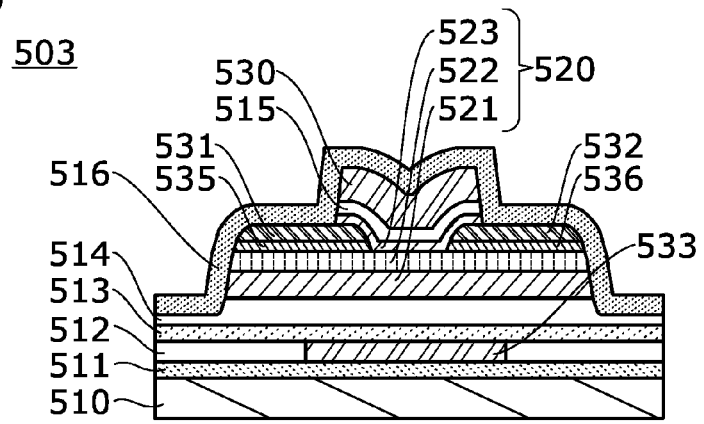

An OS transistor 503 in FIG. 22B has a device structure in which conductive layers 535 and 536 are added to the OS transistor 502. A pair of electrodes functioning as a source electrode and a drain electrode of the OS transistor 503 is formed using a stack of the conductive layers 531 and 535 and a stack of the conductive layers 532 and 536.

The conductive layers 535 and 536 are formed using a single-layer or multilayer conductor. The conductive layers 535 and 536 may have a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy film or a compound may be used, for example, and a conductor containing aluminum, a conductor containing copper and titanium, a conductor containing copper and manganese, a conductor containing indium, tin, and oxygen, a conductor containing titanium and nitrogen, or the like may be used as the conductor.

The conductive layers 535 and 536 may have a property of transmitting visible light. Alternatively, the conductive layers 535 and 536 may have a property of not transmitting visible light, ultraviolet light, infrared light, or an X-ray by reflecting or absorbing it. In some cases, such a property can suppress a change in electrical characteristics of the OS transistor 503 due to stray light.

The conductive layers 535 and 536 may preferably be formed using a layer that does not form a Schottky barrier with the semiconductor layer 522 or the like. Accordingly, on-state characteristics of the OS transistor 503 can be improved.

The conductive layers 535 and 536 preferably have higher resistance than the conductive layers 531 and 532 according to circumstances. The conductive layers 535 and 536 preferably have lower resistance than the channel (the semiconductor layer 522) of the OS transistor 503 according to circumstances. For example, the conductive layers 535 and 536 may have a resistivity of higher than or equal to 0.1 Ωcm and lower than or equal to 100 Ωcm, higher than or equal to 0.5 Ωcm and lower than or equal to 50 Ωcm, or higher than or equal to 1 Ωcm and lower than or equal to 10 Ωcm. The conductive layers 535 and 536 having resistivity within the above range can reduce electric field concentration in a boundary portion between the channel and the drain. Therefore, a change in electrical characteristics of the OS transistor 503 can be suppressed. In addition, punch-through current generated by an electric field from the drain can be reduced. Thus, a transistor with small channel length can have favorable saturation characteristics. Note that in a circuit configuration where the source and the drain do not interchange, only one of the conductive layers 535 and 536 (e.g., the layer on the drain side) is preferably provided according to circumstances.

<<OS Transistor Structure Example 4>>

Figure 22C:
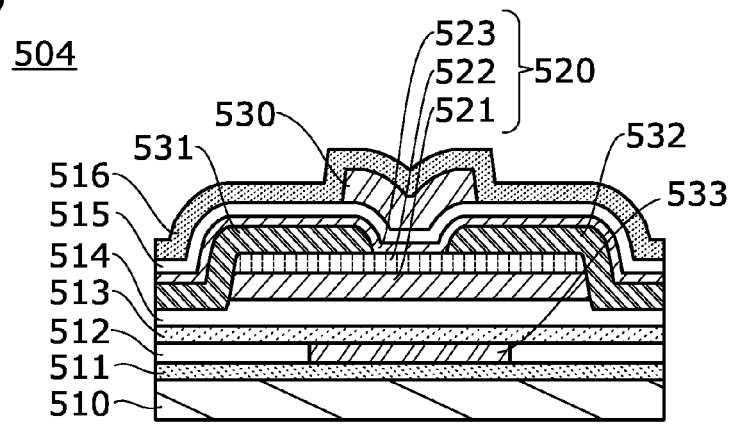

In the OS transistor 501 in FIGS. 20A to 20D, the conductive layers 531 and 532 may be in contact with side surfaces of the semiconductor layers 521 and 522. Such a structure example is illustrated in FIG. 22C. In an OS transistor 504 in FIG. 22C, the conductive layers 531 and 532 may be in contact with side surfaces of the semiconductor layers 521 and 522.

<<Chip Device Structure Example>>

Figure 16:
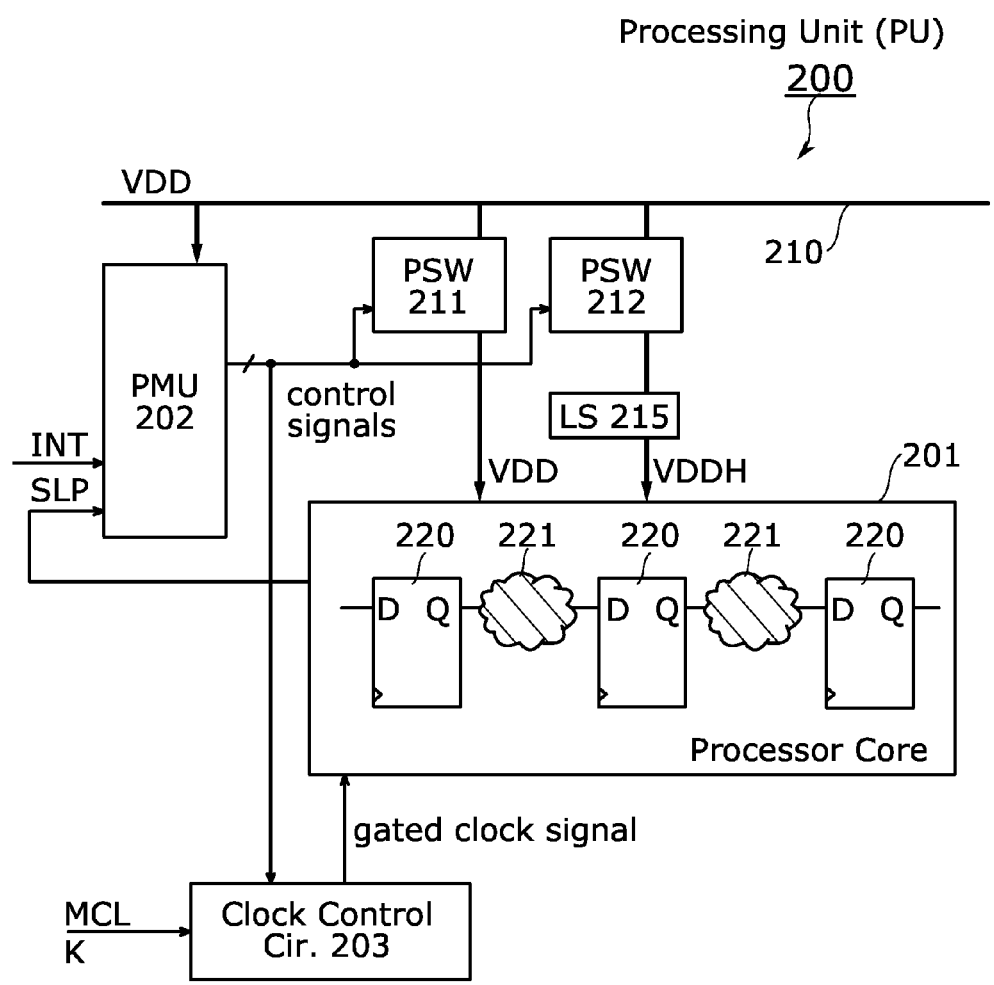
FIG. 16 is a block diagram illustrating a structure example of a processing unit.
Figure 23:
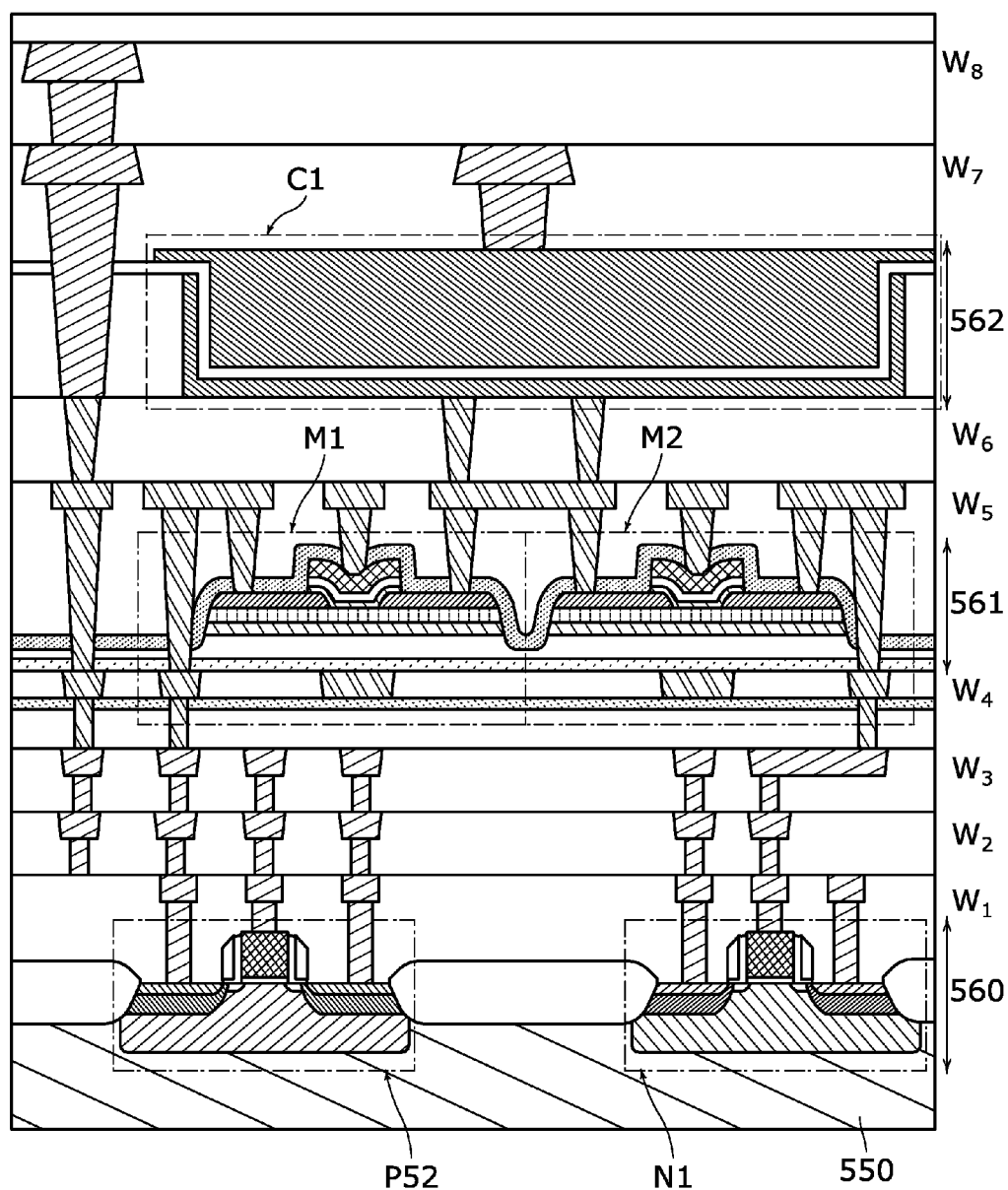
FIG. 23 is a cross-sectional view illustrating a structure example of a semiconductor device.

FIG. 23 illustrates a device structure example of a chip formed using OS transistors and Si transistors. FIG. 23 illustrates the layered structure of the PU 200 (FIG. 16). Here, the FF 220 in the PU 200 includes the logic circuit 110, and some components of the logic circuit 110 are illustrated in FIG. 23.

The chip is formed using a single crystal silicon wafer 550. In FIG. 23, 560 to 562 denote element layers, and $W_1$ to $W_8$ denote wiring layers. Si transistors are formed in the element layer 560. Here, a transistor P51 of the INV 51 and the transistor N1 of the circuit 30 are typically illustrated. The transistor P51 is a p-channel transistor. OS transistors are formed in the element layer 561. In the element layer 561, the transistors M1 and M2 are formed. The transistors M1 and M2 have device structures similar to that of the OS transistor 502 (FIG. 22A). Here, the back gates of the transistors M1 and M2 are formed in the wiring layer $W_4$. The capacitor C1 is formed in the element layer 562. Although the capacitor C1 has a trench structure, one embodiment of the present invention is not limited thereto. For example, the capacitor C1 may be a plate capacitor. When the capacitor C1 has a trench structure, capacitance can be increased without the increase in the area of the capacitor C1.

A transistor P52 is electrically connected to the transistor M1 through the wiring layers $W_1$ to $W_5$. A transistor N51 is electrically connected to the transistor M2 through the wiring layers $W_1$ to $W_5$. The transistors M1 and M2 are electrically connected to the capacitor C1 through conductive layers formed in the wiring layers $W_5$ and $W_6$. The logic circuit 110 is electrically connected to the VDD and VSS lines through the wiring layers $W_7$ and $W_8$.

In FIG. 23, in the FF 220 (the logic circuit 110), the circuit 20 is stacked over the circuits 10, 30, and 40. Therefore, the area of the FF 220 can be reduced. More than half the logic circuits in the PU 200 might be the FFs 220; thus, when the area of the FF 220 is reduced, the area of the PU 200 can be reduced effectively. Similar effects can be obtained when the FFs 220 are formed using logic circuits 111 to 115. When the logic circuit 115 is provided, area overhead can be reduced by forming the transistor M3 in the element layer 561 and forming the capacitor C3 in the element layer 562.

Figure 24:
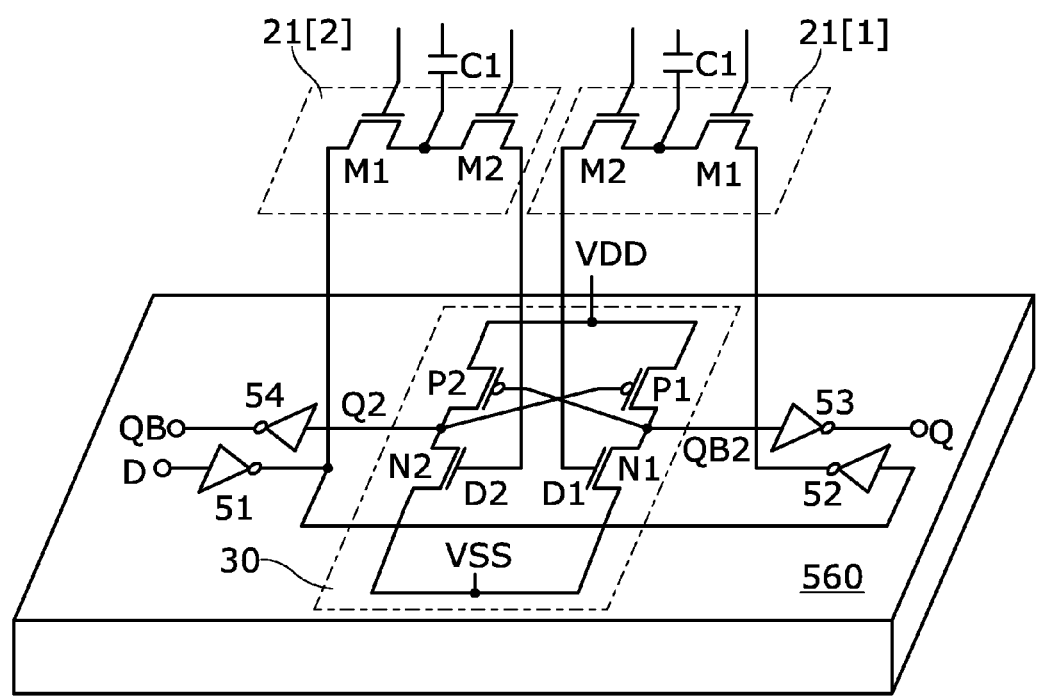
FIG. 24 is a cross-sectional view illustrating a layout example of a semiconductor device.

By devising the layout of the FF 220 (the logic circuit 110), the performance of the FF 220 can be improved. For example, as illustrated in FIG. 24, the INVs 51 and 52 and the pair of RCs 21 are symmetrically arranged with respect to the nodes D2 and DB2 for inputting complementary data of the circuit 30, and INVs 53 and 54 are symmetrically arranged with respect to the nodes Q2 and QB2. With layout as illustrated in FIG. 24, input conditions of the nodes D2 and DB2 can be substantially the same, and loads on the nodes Q2 and QB2 can be substantially the same. Thus, complementary data regeneration performance of the circuit 30 can be improved.

(Embodiment 5)

The structure of an oxide semiconductor is described below. An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and thus has an unstable structure. For this reason, an a-like OS has physical properties similar to those of an amorphous oxide semiconductor.

In this specification, the term "parallel" indicates that the angle formed between two straight lines is greater than or equal to −10° and less than or equal to 10°, and accordingly includes the case where the angle is greater than or equal to −5° and less than or equal to 5°. The term "substantially parallel" indicates that an angle formed between two straight lines is greater than or equal to −30° and less than or equal to 30°. The term "perpendicular" indicates that an angle formed between two straight lines is greater than or equal to 80° and less than or equal to 100°, and accordingly includes the case where the angle is greater than or equal to 85° and less than or equal to 95°. The term "substantially perpen-

<CAAC-OS>

A CAAC-OS can be referred to as an oxide semiconductor including c-axis aligned nanocrystals (CANC). The CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

In structural analysis of the CAAC-OS by an out-of-plane method, another peak might appear when 2θ is around 36°, in addition to the peak at 2θ of around 31°. The peak of 2θ at around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

On the other hand, in structural analysis of the CAAC-OS by an in-plane method in which an X-ray is incident on a sample in a direction substantially perpendicular to the c-axis, a peak appears when 2θ is around 56°. This peak is derived from the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), a peak is not clearly observed. In contrast, in the case of a single crystal oxide semiconductor of InGaZnO$_4$, when φ scan is performed with 2θ fixed at around 56°, six peaks which are derived from crystal planes equivalent to the (110) plane are observed. Accordingly, the structural analysis using XRD shows that the directions of a-axes and b-axes are irregularly oriented in the CAAC-OS.

When an electron beam with a probe diameter of 300 nm is incident on a CAAC-OS including an InGaZnO$_4$ crystal in the direction parallel to the sample surface, a diffraction pattern (also referred to as a selected-area transmission electron diffraction pattern) can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, a ring-like diffraction pattern is observed when an electron beam with a probe diameter of 300 nm is incident on the sample in a direction perpendicular to the sample surface. Thus, the electron diffraction also indicates that the a-axes and b-axes of the pellets included in the CAAC-OS do not have regular alignment.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of atomic arrangement and lower crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density (specifically, lower than $8\times10^{11}/cm^3$, preferably lower than $1\times10^{11}/cm^3$, more preferably lower than $1\times10^{10}/cm^3$, and is higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. That is, the CAAC-OS can be referred to as an oxide semiconductor having stable characteristics.

<Microcrystalline Oxide Semiconductor>

A microcrystalline oxide semiconductor has a region in which a crystal part is observed and a region in which a crystal part is not observed clearly in a high-resolution TEM image. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal. An oxide semiconductor including nanocrystal is referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (e.g., a region with a size greater than or equal to 1 nm and less than or equal to 10 nm, in particular, a region with a size greater than or equal to 1 nm and less than or equal to 3 nm) has periodic atomic arrangement. There is no regularity of crystal orientation between different pellets in the nc-OS. Thus, the orientation of the whole film is not observed. Accordingly, in some cases, the nc-OS cannot be distinguished from an amorphous oxide semiconductor depending on an analysis method. For example, when the nc-OS is subjected to structural analysis by an out-of-plane method with an XRD apparatus using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nano-beam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. A plurality of spots are shown in a ring-like region in some cases.

Since there is no regularity of crystal orientation between the pellets (nanocrystals) as described above, the nc-OS can also be referred to as an oxide semiconductor including random aligned nanocrystals (RANC) or an oxide semiconductor including non-aligned nanocrystals (NANC).

The nc-OS is an oxide semiconductor that has higher regularity than an amorphous oxide semiconductor. Therefore, the nc-OS is likely to have lower density of defect states than an amorphous oxide semiconductor. Note that there is no regularity of crystal orientation between different pellets in the nc-OS. Therefore, the nc-OS has higher density of defect states than the CAAC-OS.

<Amorphous Oxide Semiconductor>

The amorphous oxide semiconductor is an oxide semiconductor having disordered atomic arrangement and no crystal part. For example, the amorphous oxide semiconductor does not have a specific state as in quartz. In a high-resolution TEM image of the amorphous oxide semiconductor, crystal parts cannot be found. When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and only a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which does not have long-range ordering but might have ordering in a range from an atom to the nearest neighbor atoms or to the second-nearest neighbor atoms is also called an amorphous structure in some cases. Therefore, the strictest definition does not permit an oxide semiconductor to be called an amorphous oxide semiconductor as long as even a negligible degree of ordering is present in atomic arrangement. At least an oxide semiconductor having long-term ordering cannot be called an amorphous oxide semiconductor. Accordingly, because of the presence of a crystal part, for example, a CAAC-OS and an nc-OS cannot be called an amorphous oxide semiconductor or a completely amorphous oxide semiconductor.

<Amorphous-like Oxide Semiconductor>

Note that an oxide semiconductor may have a structure intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void is observed in some cases. Furthermore, in the high-resolution TEM image, there are a region where a crystal part is clearly observed and a region where a crystal part is not observed. The a-like OS has an unstable structure because it contains a void. The a-like OS has lower density than the nc-OS and the CAAC-OS because it contains a void. Specifically, the density of the a-like OS is higher than or equal to 78.6% and lower than 92.3% of the density of a single crystal oxide semiconductor having the same composition. The density of each of the nc-OS and the CAAC-OS is higher than or equal to 92.3% and lower than 100% of the density of a single crystal oxide semiconductor having the same composition. It is difficult to deposit an oxide semiconductor having a density of lower than 78% of the density of a single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Single crystals with the same composition do not exist in some cases. In that case, by combining single crystals with different compositions at a given proportion, it is possible to calculate density that corresponds to the density of a single crystal with a desired composition. The density of the single crystal with a desired composition may be calculated using weighted average with respect to the combination ratio of the single crystals with different compositions. It is preferable to combine as few kinds of single crystals as possible for density calculation.

<Nc-OS>

An nc-OS has a region in which a crystal part is observed and a region in which a crystal part is not observed clearly in a high-resolution TEM image. In most cases, a crystal part in the nc-OS is greater than or equal to 1 nm and less than or equal to 100 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, a grain boundary cannot be found clearly in some cases. There is a possibility that the origin of the nanocrystal is the same as that of a crystal part (pellet) in a CAAC-OS. Therefore, a crystal part of the nc-OS is sometimes referred to as a pellet in the following description.

In the nc-OS, a microscopic region (e.g., a region with a size greater than or equal to 1 nm and less than or equal to 10 nm, in particular, a region with a size greater than or equal to 1 nm and less than or equal to 3 nm) has periodic atomic arrangement. There is no regularity of crystal orientation between different pellets in the nc-OS. Thus, the orientation of the whole film is not observed. Accordingly, in some cases, the nc-OS cannot be distinguished from an a-like OS or an amorphous oxide semiconductor depending on an analysis method. For example, when the nc-OS is analyzed by an out-of-plane method using an X-ray having a diameter larger than that of a pellet, a peak that shows a crystal plane does not appear. Furthermore, a halo pattern is shown in an electron diffraction pattern of the nc-OS obtained by using an electron beam having a probe diameter larger than the diameter of a pellet (e.g., larger than or equal to 50 nm). Meanwhile, spots are shown in a nanobeam electron diffraction pattern of the nc-OS obtained by using an electron beam having a probe diameter close to or smaller than the diameter of a pellet. Furthermore, in a nanobeam electron diffraction pattern of the nc-OS, regions with high luminance in a circular (ring) pattern are observed in some cases. Moreover, a plurality of spots are shown in a ring-like region in some cases.

Since there is no regularity of crystal orientation between the nanocrystals (pellets) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity than an amorphous oxide semiconductor. Thus, the nc-OS has a lower density of defect states than the a-like OS and the amorphous oxide semiconductor. Note that there is no regularity of crystal orientation between different pellets in the nc-OS; thus, the nc-OS has a higher density of defect states than the CAAC-OS.

<a-like OS>

An a-like OS is an oxide semiconductor having a structure between the nc-OS and the amorphous oxide semiconductor.

In a high-resolution TEM image of the a-like OS, a void may be seen. Furthermore, in the high-resolution TEM image, there are a region where a crystal part is clearly observed and a region where a crystal part is not observed. The a-like OS has an unstable structure because it contains a void. Thus, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor whose density is lower than 78% of the density of the single crystal oxide semiconductor.

For example, in the case of an oxide semiconductor with an atomic ratio of In:Ga:Zn=1:1:1, the density of single-crystal $InGaZnO_4$ with a rhombohedral crystal structure is 6.357 $g/cm^3$. Thus, for example, in the case of the oxide semiconductor with an atomic ratio of In:Ga:Zn=1:1:1, the density of an a-like OS is higher than or equal to 5.0 $g/cm^3$ and lower than 5.9 $g/cm^3$. In addition, for example, in the case of the oxide semiconductor with an atomic ratio of In:Ga:Zn=1:1:1, the density of an nc-OS or a CAAC-OS is higher than or equal to 5.9 $g/cm^3$ and lower than 6.3 $g/cm^3$.

Note that single crystals with the same composition do not exist in some cases. In such a case, by combining single crystals with different compositions at a given proportion, it is possible to estimate density that corresponds to the density of a single crystal with a desired composition. The density of the single crystal with a desired composition may be estimated using weighted average with respect to the combination ratio of the single crystals with different compositions. Note that it is preferable to combine as few kinds of single crystals as possible for density estimation.

Oxide semiconductors have various structures and various properties. A semiconductor region of an OS transistor may be a stacked film including two or more of an amorphous oxide semiconductor, an a-like OS, a microcrystalline oxide semiconductor, and a CAAC-OS, for example.

This application is based on Japanese Patent Application serial No. 2014-236763 filed with Japan Patent Office on Nov. 21, 2014, the entire contents of which are hereby incorporated by reference.

What is claimed is:

1. A logic circuit comprising:
a first circuit;
a first retention circuit;
a second retention circuit; and
a second circuit,
wherein each of the first retention circuit and the second retention circuit comprises a first switch and a second switch electrically connected to each other in series and a capacitor electrically connected to a connection portion of the first switch and the second switch,
wherein each of the first switch and the second switch of each of the first retention circuit and the second retention circuit is a transistor comprising a channel formation region comprising an oxide semiconductor,
wherein the first circuit is configured to generate complementary data from a piece of input data,
wherein the first retention circuit and the second retention circuit are configured to retain the complementary data, and
wherein the second circuit is configured to amplify the complementary data retained in the first retention circuit and the second retention circuit.

2. The logic circuit according to claim 1,
wherein the second circuit comprises a third input node, a fourth input node, a fourth output node, a fifth output node, a first n-channel transistor, a second n-channel transistor, a first p-channel transistor, and a second p-channel transistor,
wherein a drain of the first n-channel transistor and a drain of the first p-channel transistor are electrically connected to each other,
wherein a drain of the second n-channel transistor and a drain of the second p-channel transistor are electrically connected to each other,
wherein a first potential is input to a source of the first n-channel transistor and a source of the second n-channel transistor,
wherein a second potential is input to a source of the first p-channel transistor and a source of the second p-channel transistor,
wherein the third input node is electrically connected to a gate of the first n-channel transistor,
wherein the fourth input node is electrically connected to a gate of the second n-channel transistor,
wherein the fourth output node is electrically connected to a gate of the first p-channel transistor and the drain of the second p-channel transistor, and
wherein the fifth output node is electrically connected to a gate of the second p-channel transistor and the drain of the first p-channel transistor.

3. The logic circuit according to claim 2,
wherein the second circuit further comprises a third n-channel transistor and a fourth n-channel transistor,
wherein a gate of the third n-channel transistor is electrically connected to the fourth output node,
wherein a drain of the third n-channel transistor is electrically connected to the fifth output node,
wherein a gate of the fourth n-channel transistor is electrically connected to the fifth output node,
wherein a drain of the fourth n-channel transistor is electrically connected to the fourth output node, and
wherein the first potential is input to a source of the third n-channel transistor and a source of the fourth n-channel transistor.

4. The logic circuit according to claim 2,
wherein a first clock signal is input to the first retention circuit and the second retention circuit,
wherein a second clock signal is input to the first retention circuit and the second retention circuit,
wherein the second circuit further comprises a third n-channel transistor, a fourth n-channel transistor, and a fifth n-channel transistor,
wherein a gate of the third n-channel transistor is electrically connected to the fourth output node,
wherein a drain of the third n-channel transistor is electrically connected to the fifth output node,
wherein a gate of the fourth n-channel transistor is electrically connected to the fifth output node,
wherein a drain of the fourth n-channel transistor is electrically connected to the fourth output node,
wherein the source of the first n-channel transistor and the source of the second n-channel transistor are electrically connected to each other,
wherein the fifth n-channel transistor is configured to control conduction between the source of the first n-channel transistor and the source of the second n-channel transistor, and a first wiring,
wherein the first potential is input to the first wiring, and
wherein the first clock signal is input to a gate of the fifth n-channel transistor.

5. The logic circuit according to claim 1,
wherein a first clock signal is input to the first retention circuit and the second retention circuit,
wherein a second clock signal is input to the first retention circuit and the second retention circuit,
wherein the second circuit comprises a third input node, a fourth input node, a fourth output node, a fifth output node, a first n-channel transistor, a second n-channel transistor, a third n-channel transistor, a fourth n-channel transistor, a fifth n-channel transistor, a sixth n-channel transistor, a first p-channel transistor, and a second p-channel transistor,
wherein the third input node is electrically connected to a gate of the first n-channel transistor,
wherein the fourth input node is electrically connected to a gate of the second n-channel transistor,
wherein a gate of the first p-channel transistor, a drain of the second p-channel transistor, a gate of the third n-channel transistor, and a drain of the fourth n-channel transistor are electrically connected to the fourth output node,
wherein a gate of the second p-channel transistor, a drain of the first p-channel transistor, a drain of the third n-channel transistor, and a gate of the fourth n-channel transistor are electrically connected to the fifth output node,
wherein a first potential is input to a source of each of the first to fourth n-channel transistors,
wherein a second potential is input to a source of each of the first p-channel transistor and the second p-channel transistor,
wherein the fifth n-channel transistor is configured to control conduction between the source of the first n-channel transistor and the source of the first p-channel transistor,
wherein the sixth n-channel transistor is configured to control conduction between the source of the second n-channel transistor and the source of the second p-channel transistor,
wherein a third clock signal is input to a gate of the fifth n-channel transistor and a gate of the sixth n-channel transistor, and
wherein the logic of the first clock signal is opposite to logic of the third clock signal.

6. The logic circuit according to claim 1,
wherein a first clock signal is input to the first retention circuit and the second retention circuit,
wherein a second clock signal is input to the first retention circuit and the second retention circuit,
wherein the second circuit comprises a third input node, a fourth input node, a fourth output node, a fifth output node, a first n-channel transistor, a second n-channel transistor, a third n-channel transistor, a fourth n-channel transistor, a fifth n-channel transistor, a sixth n-channel transistor, a seventh n-channel transistor, a first p-channel transistor, a second p-channel transistor, and a third p-channel transistor,
wherein the third input node is electrically connected to a gate of the first n-channel transistor,
wherein the fourth input node is electrically connected to a gate of the second n-channel transistor,
wherein a gate of the first p-channel transistor, a drain of the second p-channel transistor, a gate of the third n-channel transistor, and a drain of the fourth n-channel transistor are electrically connected to the fourth output node,
wherein a gate of the second p-channel transistor, a drain of the first p-channel transistor, a gate of the fourth n-channel transistor, and a drain of the third n-channel transistor are electrically connected to the fifth output node,
wherein the fifth n-channel transistor is configured to control conduction between the source of the first n-channel transistor and the source of the first p-channel transistor,
wherein the sixth n-channel transistor is configured to control conduction between the source of the second n-channel transistor and the source of the second p-channel transistor,
wherein a source of the first n-channel transistor and a source of the second n-channel transistor are electrically connected to a first wiring,
wherein a first potential is input to the first wiring,
wherein the seventh n-channel transistor is configured to control conduction between a source of the third n-channel transistor and a source of the fourth n-channel transistor, and the first wiring,
wherein a second potential is input to a source of the first p-channel transistor and a source of the second p-channel transistor,
wherein one of a source and a drain of the third p-channel transistor is electrically connected to a gate of the first p-channel transistor,
wherein the other of the source and the drain of the third p-channel transistor is electrically connected to a gate of the second p-channel transistor,
wherein the first clock signal is input to a gate of the seventh n-channel transistor,
wherein a third clock signal is input to a gate of the fifth n-channel transistor and a gate of the sixth n-channel transistor, and
wherein the logic of the first clock signal is opposite to logic of the third clock signal.

7. The logic circuit according to claim 6,
wherein the second circuit further comprises a third retention circuit and a fourth retention circuit, wherein each of the third retention circuit and the fourth retention circuit comprises a third transistor, a second capacitor, a second node, and an input/output node, wherein in the third retention circuit and the fourth retention circuit, an active layer of the third transistor comprises an oxide semiconductor, wherein in the third retention circuit and the fourth retention circuit, the second node is electrically connected to the second capacitor, wherein in the third retention circuit and the fourth retention circuit, the third transistor is configured to control conduction between the second node and the input/output node, wherein in the third retention circuit and the fourth retention circuit, a second signal is input to a gate of the third transistor, wherein the input/output node of the third retention circuit is electrically connected to the fourth output node, and wherein the input/output node of the fourth retention circuit is electrically connected to the fifth output node.

8. A semiconductor device comprising a combinational circuit and a flip-flop,
wherein the flip-flop retains output data of the combinational circuit, and
wherein the flip-flop is the logic circuit according to claim 1.

9. An electronic component comprising a chip and a lead,
wherein the chip comprises the logic circuit according to claim 1, and
wherein the lead is electrically connected to the chip.

10. An electronic device comprising:
the logic circuit according to claim 1, and
at least one of a display device, a touch panel, a microphone, a speaker, an operation key, and a housing.

11. A logic circuit comprising:
a first circuit;
a first retention circuit;
a second retention circuit; and
a second circuit,
wherein the first circuit comprises a first input node, a first output node, and a second output node,
wherein each of the first retention circuit and the second retention circuit comprises a first transistor, a second transistor, a first capacitor, a first node, a second input node, and a third output node,
wherein the second circuit comprises a third input node, a fourth input node, a fourth output node, and a fifth output node,
wherein the first circuit is configured to generate first complementary data from input data of the first input node,
wherein a piece of the first complementary data whose logic is the same as logic of the first input node is output from the first output node,
wherein the other piece of the first complementary data is output from the second output node,
wherein in the first retention circuit and the second retention circuit, the first capacitor is electrically connected to the first node,
wherein in the first retention circuit and the second retention circuit, each of the first transistor and the second transistor comprises a channel formation region comprising an oxide semiconductor,
wherein in the first retention circuit and the second retention circuit, the first transistor is configured to control conduction between the first node and the second input node, wherein in the first retention circuit and the second retention circuit, the second transistor is configured to control conduction between the first node and the third output node, wherein in the first retention circuit and the second retention circuit, a first clock signal is input to a gate of the first transistor, wherein in the first retention circuit and the second retention circuit, a second clock signal is input to a gate of the second transistor, wherein logic of the first clock signal is opposite to logic of the second clock signal, wherein the second input node of the first retention circuit is electrically connected to the first output node, wherein the third output node of the first retention circuit is electrically connected to the third input node, wherein the second input node of the second retention circuit is electrically connected to the second output node, wherein the third output node of the second retention circuit is electrically connected to the fourth input node, wherein the second circuit is configured to amplify voltage between the third input node and the fourth input node and generate second complementary data, wherein a piece of the second complementary data is output from the fourth output node, and wherein the other piece of the second complementary data is output from the fifth output node.

12. The logic circuit according to claim 11,
wherein the second circuit further comprises a first n-channel transistor, a second n-channel transistor, a first p-channel transistor, and a second p-channel transistor,
wherein a drain of the first n-channel transistor and a drain of the first p-channel transistor are electrically connected to each other,
wherein a drain of the second n-channel transistor and a drain of the second p-channel transistor are electrically connected to each other,
wherein a first potential is input to a source of the first n-channel transistor and a source of the second n-channel transistor,
wherein a second potential is input to a source of the first p-channel transistor and a source of the second p-channel transistor,
wherein the third input node is electrically connected to a gate of the first n-channel transistor,
wherein the fourth input node is electrically connected to a gate of the second n-channel transistor,
wherein the fourth output node is electrically connected to a gate of the first p-channel transistor and the drain of the second p-channel transistor, and
wherein the fifth output node is electrically connected to a gate of the second p-channel transistor and the drain of the first p-channel transistor.

13. The logic circuit according to claim 12,
wherein the second circuit further comprises a third n-channel transistor and a fourth n-channel transistor,
wherein a gate of the third n-channel transistor is electrically connected to the fourth output node,
wherein a drain of the third n-channel transistor is electrically connected to the fifth output node,
wherein a gate of the fourth n-channel transistor is electrically connected to the fifth output node,
wherein a drain of the fourth n-channel transistor is electrically connected to the fourth output node, and wherein the first potential is input to a source of the third n-channel transistor and a source of the fourth n-channel transistor.

14. The logic circuit according to claim 12,
wherein the second circuit further comprises a third n-channel transistor, a fourth n-channel transistor, and a fifth n-channel transistor,
wherein a gate of the third n-channel transistor is electrically connected to the fourth output node,
wherein a drain of the third n-channel transistor is electrically connected to the fifth output node,
wherein a gate of the fourth n-channel transistor is electrically connected to the fifth output node,
wherein a drain of the fourth n-channel transistor is electrically connected to the fourth output node,
wherein the source of the first n-channel transistor and the source of the second n-channel transistor are electrically connected to each other,
wherein the fifth n-channel transistor is configured to control conduction between the source of the first n-channel transistor and the source of the second n-channel transistor, and a first wiring,
wherein the first potential is input to the first wiring,
wherein the first clock signal is input to the gate of the first transistor in the first retention circuit and the second retention circuit and a gate of the fifth n-channel transistor,
wherein a first signal is input to the gate of the second transistor in the first retention circuit and the second retention circuit, and
wherein the first signal is for turning on the second transistor.

15. The logic circuit according to claim 11,
wherein the second circuit further comprises a first n-channel transistor, a second n-channel transistor, a third n-channel transistor, a fourth n-channel transistor, a fifth n-channel transistor, a sixth n-channel transistor, a first p-channel transistor, and a second p-channel transistor,
wherein the third input node is electrically connected to a gate of the first n-channel transistor,
wherein the fourth input node is electrically connected to a gate of the second n-channel transistor,
wherein a gate of the first p-channel transistor, a drain of the second p-channel transistor, a gate of the third n-channel transistor, and a drain of the fourth n-channel transistor are electrically connected to the fourth output node,
wherein a gate of the second p-channel transistor, a drain of the first p-channel transistor, a drain of the third n-channel transistor, and a gate of the fourth n-channel transistor are electrically connected to the fifth output node,
wherein a first potential is input to a source of each of the first to fourth n-channel transistors,
wherein a second potential is input to a source of each of the first p-channel transistor and the second p-channel transistor,
wherein the fifth n-channel transistor is configured to control conduction between the source of the first n-channel transistor and the source of the first p-channel transistor,
wherein the sixth n-channel transistor is configured to control conduction between the source of the second n-channel transistor and the source of the second p-channel transistor, wherein a first signal is input to the gate of the second transistor,
wherein the first signal is a signal for turning on the second transistor in a normal operating period,
wherein a third clock signal is input to a gate of the fifth n-channel transistor and a gate of the sixth n-channel transistor, and
wherein the logic of the first clock signal is opposite to logic of the third clock signal.

16. The logic circuit according to claim 11,
wherein the second circuit further comprises a first n-channel transistor, a second n-channel transistor, a third n-channel transistor, a fourth n-channel transistor, a fifth n-channel transistor, a sixth n-channel transistor, a seventh n-channel transistor, a first p-channel transistor, a second p-channel transistor, and a third p-channel transistor,
wherein the third input node is electrically connected to a gate of the first n-channel transistor,
wherein the fourth input node is electrically connected to a gate of the second n-channel transistor,
wherein a gate of the first p-channel transistor, a drain of the second p-channel transistor, a gate of the third n-channel transistor, and a drain of the fourth n-channel transistor are electrically connected to the fourth output node,
wherein a gate of the second p-channel transistor, a drain of the first p-channel transistor, a gate of the fourth n-channel transistor, and a drain of the third n-channel transistor are electrically connected to the fifth output node,
wherein the fifth n-channel transistor is configured to control conduction between the source of the first n-channel transistor and the source of the first p-channel transistor,
wherein the sixth n-channel transistor is configured to control conduction between the source of the second n-channel transistor and the source of the second p-channel transistor,
wherein a source of the first n-channel transistor and a source of the second n-channel transistor are electrically connected to a first wiring,
wherein a first potential is input to the first wiring,
wherein the seventh n-channel transistor is configured to control conduction between a source of the third n-channel transistor and a source of the fourth n-channel transistor, and the first wiring,
wherein a second potential is input to a source of the first p-channel transistor and a source of the second p-channel transistor,
wherein one of a source and a drain of the third p-channel transistor is electrically connected to a gate of the first p-channel transistor,
wherein the other of the source and the drain of the third p-channel transistor is electrically connected to a gate of the second p-channel transistor,
wherein the first clock signal is input to the gate of the first transistor and a gate of the seventh n-channel transistor,
wherein a third clock signal is input to a gate of the fifth n-channel transistor and a gate of the sixth n-channel transistor,
wherein the logic of the first clock signal is opposite to logic of the third clock signal,
wherein a first signal is input to the gate of the second transistor and a gate of the third p-channel transistor, and wherein the first signal is for turning on the second transistor and turning off the third p-channel transistor.

17. The logic circuit according to claim 16,
wherein the second circuit further comprises a third retention circuit and a fourth retention circuit,
wherein each of the third retention circuit and the fourth retention circuit comprises a third transistor, a second capacitor, a second node, and an input/output node,
wherein in the third retention circuit and the fourth retention circuit, an active layer of the third transistor comprises an oxide semiconductor,
wherein in the third retention circuit and the fourth retention circuit, the second node is electrically connected to the second capacitor,
wherein in the third retention circuit and the fourth retention circuit, the third transistor is configured to control conduction between the second node and the input/output node,
wherein in the third retention circuit and the fourth retention circuit, a second signal is input to a gate of the third transistor,
wherein the input/output node of the third retention circuit is electrically connected to the fourth output node, and
wherein the input/output node of the fourth retention circuit is electrically connected to the fifth output node.

18. A semiconductor device comprising a combinational circuit and a flip-flop,
wherein the flip-flop retains output data of the combinational circuit, and
wherein the flip-flop is the logic circuit according to claim 11.

19. An electronic component comprising a chip and a lead,
wherein the chip comprises the logic circuit according to claim 11, and
wherein the lead is electrically connected to the chip.

20. An electronic device comprising:
the logic circuit according to claim 11, and
at least one of a display device, a touch panel, a microphone, a speaker, an operation key, and a housing.

* * * * *